United States Patent
Lee et al.

(10) Patent No.: US 9,284,486 B2
(45) Date of Patent: *Mar. 15, 2016

(54) BLUE FLUORESCENT COMPOSITION AND ORGANIC ELECTROLUMINESCENT DEVICE USING THE SAME

(75) Inventors: Seung-Jae Lee, Paju-si (KR); Soon-Wook Cha, Goyang-si (KR); In-Bum Song, Uijeongbu-si (KR); Jung-Keun Kim, Seoul (KR); Do-Han Kim, Goyang-si (KR); Chun-Gun Park, Paju-si (KR); Jong-Kwan Bin, Paju-si (KR); Nam-Sung Cho, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 509 days.

This patent is subject to a terminal disclaimer.

(21) Appl. No.: 12/654,414

(22) Filed: Dec. 18, 2009

(65) Prior Publication Data

US 2011/0006669 A1   Jan. 13, 2011

(30) Foreign Application Priority Data

Jul. 10, 2009   (KR) ........................ 10-2009-0063117

(51) Int. Cl.
*H01L 51/54*   (2006.01)
*C09K 11/06*   (2006.01)
(Continued)

(52) U.S. Cl.
CPC .............. *C09K 11/06* (2013.01); *H01L 51/006* (2013.01); *H01L 51/0094* (2013.01);
(Continued)

(58) Field of Classification Search
CPC ........... C09K 11/06; C09K 2211/1007; C09K 2211/1011; C09K 2211/1014; H01L 2251/308; H01L 51/0054; H01L 51/006; H01L 51/0094; H01L 51/5012; H05B 33/18; H05B 33/14
See application file for complete search history.

(56) References Cited

U.S. PATENT DOCUMENTS 6,455,720 B1   9/2002   Suzuki et al.
(Continued)

FOREIGN PATENT DOCUMENTS

EP   1604974   * 12/2005
(Continued)

*Primary Examiner* — Dawn L. Garrett
(74) *Attorney, Agent, or Firm* — Dentons US LLP

(57) ABSTRACT

A blue fluorescent compound includes a host material being capable of transporting an electron or a hole; and a dopant material represented by following Formula 1: [Formula 1]

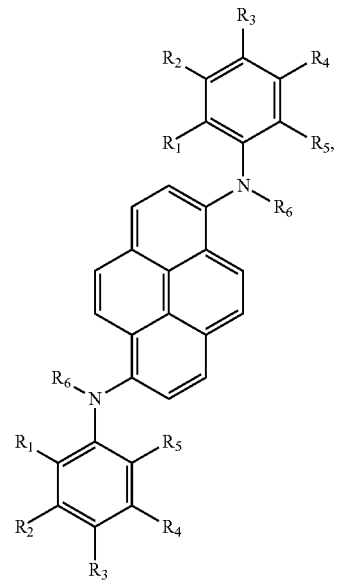

wherein each of the R1, the R2, the R3, the R4, and the R5 is selected from hydrogen, fluorine, C1-C6 substituted or non-substituted alkyl group, C6-C30 substituted or non-substituted aromatic group, and C6-C30 substituted or non-substituted heterocyclic group, and two of the R1, the R2, the R3, the R4 and the R5 are fluorine and wherein the R6 is selected from the C6-C30 substituted or non-substituted aromatic group, and the C6-C30 substituted or non-substituted heterocyclic group.

8 Claims, 2 Drawing Sheets

(51) Int. Cl.
  *H05B 33/18* (2006.01)
  *H01L 51/00* (2006.01)
  *H01L 51/50* (2006.01)

(52) U.S. Cl.
  CPC ....... *H05B 33/18* (2013.01); *C09K 2211/1007* (2013.01); *C09K 2211/1011* (2013.01); *C09K 2211/1014* (2013.01); *H01L 51/0054* (2013.01); *H01L 51/5012* (2013.01); *H01L 2251/308* (2013.01)

(56) References Cited

U.S. PATENT DOCUMENTS

| | | | |
|---|---|---|---|
| 2003/0118866 A1* | 6/2003 | Oh et al. | 428/690 |
| 2004/0137270 A1* | 7/2004 | Seo et al. | 428/690 |
| 2007/0009758 A1* | 1/2007 | Funahashi | 428/690 |
| 2007/0292714 A1 | 12/2007 | Funahashi | |
| 2008/0166595 A1* | 7/2008 | Rostovtsev | 428/704 |
| 2010/0052526 A1* | 3/2010 | Je et al. | 313/504 |
| 2010/0141124 A1* | 6/2010 | Lee et al. | 313/504 |
| 2011/0156011 A1* | 6/2011 | Bin et al. | 257/40 |
| 2011/0297923 A1* | 12/2011 | Mizuki et al. | 257/40 |

FOREIGN PATENT DOCUMENTS

| | | |
|---|---|---|
| KR | 10-2002-0070333 | 9/2002 |
| KR | 10-2004-0057862 A | 7/2004 |
| KR | 10-2007-0023335 | 2/2007 |

* cited by examiner

BLUE FLUORESCENT COMPOSITION AND ORGANIC ELECTROLUMINESCENT DEVICE USING THE SAME

The present application claims the benefit of Korean Patent Application No. 10-2009-0063117 filed in Korea on Jul. 10, 2009, which is hereby incorporated by reference for all purposes as if fully set forth herein.

BACKGROUND OF THE INVENTION

1. Field of the Invention

The present invention relates to a blue fluorescent compound and an organic electroluminescent device (OELD) and, more particularly, to a blue fluorescent compound having high color purity and high luminescent efficiency and an OELD using the blue phosphorescent compound.

2. Discussion of the Related Art

Recently, requirements for a flat panel display device having a relatively large display area and a relatively small occupancy have increased. Among the flat panel display devices, an OELD has various advantages as compared to an inorganic electroluminescent device, a liquid crystal display device, a plasma display panel, and so on. The OELD device has excellent characteristics of viewing angle, contrast ratio, and so on. Also, since the OELD device does not require a backlight assembly, the OELD device has low weight and low power consumption. Moreover, the OELD device has advantages of high response rate, low production cost, and so on.

In general, the OELD emits light by injecting electrons from a cathode and holes from an anode into an emission compound layer, combining the electrons with the holes, generating an exciton, and transforming the exciton from an excited state to a ground state. A flexible substrate, for example, a plastic substrate, can be used as a base substrate where elements are formed. The OELD has excellent characteristics of viewing angle, contrast ratio, and so on. Also, since the OELD does not require a backlight assembly, the OELD has low weight and low power consumption. Moreover, the OELD has advantages of high response rate, low production cost, high color purity, and so on. The OELD can be operated at a voltage (e.g., 10V or below) lower than a voltage required to operate other display devices. In addition, the OELD is adequate to produce full-color images.

A general method for fabricating OELDs will be briefly explained below. First, an anode is formed on a substrate by depositing a transparent conductive compound, for example, indium-tin-oxide (ITO). Next, a hole injection layer (HIL) is formed on the anode. For example, the HIL may be formed of copper phthalocyanine (CuPC), which is represented by following Formula 1-1, and have a thickness of about 10 nm to about 30 nm. Next, a hole transporting layer (HTL) is formed on the HIL. For example, the HTL may be formed of 4,4'-bis[N-(1-naphtyl)-N-phenylamino]-biphenyl (NPB) and have a thickness of about 30 nm to about 60 nm. Next, an emitting compound layer (EML) is formed on the HTL. A dopant may be doped onto the EML. For example, DPVBi, which is represented by following Formula 1-2, is used for the host, and BD-a, which is represented by following Formula 1-3, is used for the dopant. The EML includes the host and the dopant by about 1 to 10 weight % and has a thickness of about 20 nm to about 40 nm.

[Formula 1-1]

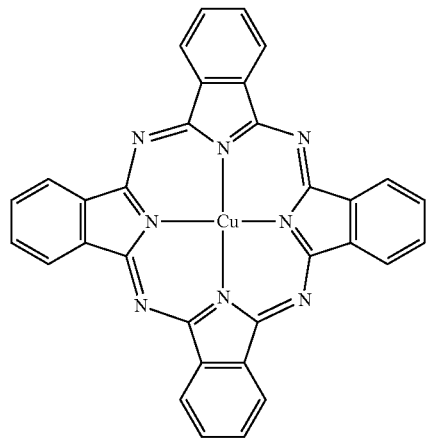

[Formula 1-2]

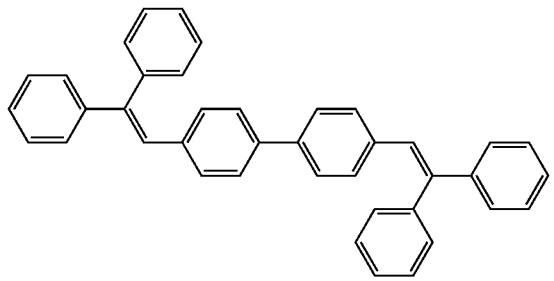

[Formula 1-3]

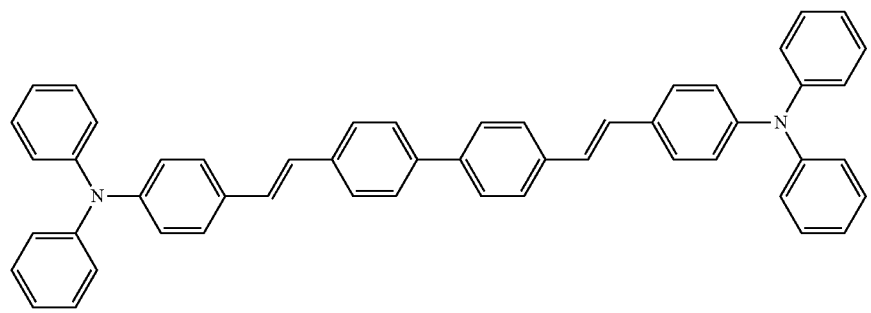

Next, an electron transporting layer (ETL) and an electron injection layer (EIL) are stacked on the EML. For example, the ETL may be formed of tris(8-hydroxy-quinolate)aluminum (Alq3). A cathode is formed on the EIL, and a passivation layer is formed on the cathode.

Various compounds for the EML have been introduced. However, there are limitations in the related art EML compound. As shown in FIG. 1, since the blue color has pure color purity, it is very difficult to produce a dark blue color. Accordingly, there is a problem to display a full color image. In addition, the blue color has lower luminescent efficiency.

SUMMARY OF THE INVENTION

Accordingly, the present invention is directed to a blue fluorescent compound and an organic electroluminescent device (OELD) using the same that substantially obviates one or more of the problems due to limitations and disadvantages of the related art.

An object of the present invention is to provide a blue fluorescent compound having high color purity, high luminescence efficiency, and long lifetime.

Another object of the present invention is to provide an OELD device using the blue fluorescent compound.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a blue fluorescent compound includes a host material being capable of transporting an electron or a hole; and a dopant material represented by following Formula 1: [Formula 1]

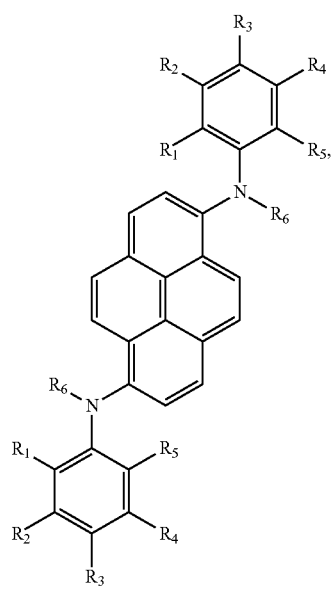

wherein each of the R1, the R2, the R3, the R4, and the R5 is selected from hydrogen, fluorine, C1-C6 substituted or non-substituted alkyl group, C6-C30 substituted or non-substituted aromatic group, or C6-C30 substituted or non-substituted heterocyclic group, and two of the R1, the R2, the R3, the R4 and the R5 are fluorine and wherein the R6 is selected from the C6-C30 substituted or non-substituted aromatic group, or the C6-C30 substituted or non-substituted heterocyclic group.

In another aspect, an organic electroluminescent device includes a first electrode; a second electrode facing the first electrode: and an organic electroluminescent diode positioned between the first and second electrodes and includes an emitting material layer, the emitting material layer includes: a host material being capable of transporting an electron or a hole; and a dopant material represented by following Formula 1: [Formula 1]

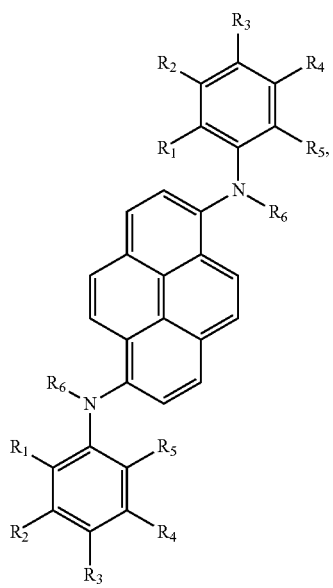

wherein each of the R1, the R2, the R3, the R4, and the R5 is selected from hydrogen, fluorine, C1-C6 substituted or non-substituted alkyl group, C6-C30 substituted or non-substituted aromatic group, or C6-C30 substituted or non-substituted heterocyclic group, and two of the R1, the R2, the R3, the R4 and the R5 are fluorine and wherein the R6 is selected from the C6-C30 substituted or non-substituted aromatic group, or the C6-C30 substituted or non-substituted heterocyclic group.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
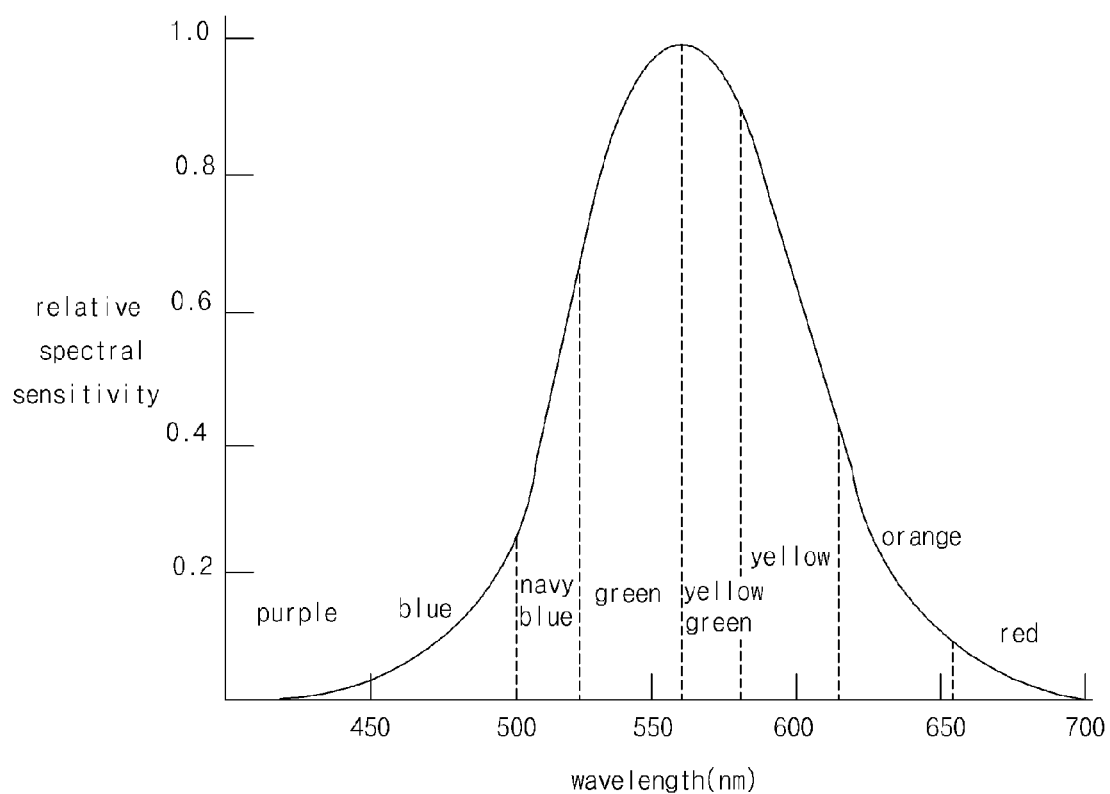
FIG. 1 is a graph showing a relation of a color purity and a visible degree.

Reference will now be made in detail to the preferred embodiments, examples of which are illustrated in the accompanying drawings.

A blue fluorescent compound according to the present invention includes 1,6-pyrene and diphenylamine derivative. Namely, each of 1 and 6 positions of pyrene are substituted by diphenylamine derivative. Phenyl part of the diphenylamine derivative includes hydrogen, fluorine, C1-C6 substituted or non-substituted alkyl group, C6-C30 substituted or non-substituted aromatic group, or C6-C30 substituted or non-substituted heterocyclic group. Particularly, fluorine is introduced into two positions of the phenyl part, and C6-C30 substituted or non-substituted aromatic group or C6-C30 substituted or non-substituted heterocyclic group is introduced into amine. As a result, the blue fluorescent compound according to the present invention has improved color purity and luminescent efficiency.

The blue fluorescent compound according to the present invention is represented by following Formula 2.

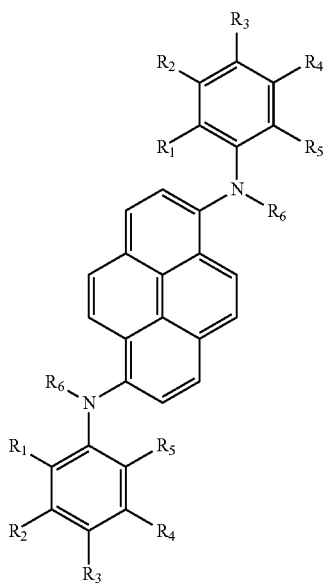

[Formula 2]

In the above Formula 2, each of R1, R2, R3, R4 and R5 of phenyl part is selected from hydrogen, fluorine, C1-C6 substituted or non-substituted alkyl group, C6-C30 substituted or non-substituted aromatic group, or C6-C30 substituted or non-substituted heterocyclic group, and two of R1, R2, R3, R4 and R5 are fluorine. In addition, R6 is selected from C6-C30 substituted or non-substituted aromatic group, or C6-C30 substituted or non-substituted heterocyclic group.

For example, the C1-C6 substituted or non-substituted alkyl group includes methyl, ethyl, n-propyl, i-propyl, n-butyl, i-butyl, and t-butyl. The C6-C30 substituted or non-substituted aromatic group includes phenyl, biphenyl, naphthyl, phenanthrene, terphenyl and fluorenyl and their substitution products. The C6-C30 substituted or non-substituted heterocyclic group includes furan, thiophene, pyrrole, pyridine and pyrimidine and their substitution products. A substituent for aromatic group or heterocyclic group is selected from C1 to C6 alkyl group including methyl, ethyl, n-propyl, i-propyl, n-butyl, i-butyl, and t-butyl. Alternatively, the substituent may be deuterium, cyanyl, trimethylsilyl, fluorine, or trifluoromethyl.

Namely, in the present invention, amine including difluorophenyl, which includes substituted or non-substituted aromatic group or substituted or non-substituted heterocyclic group, and substituted or non-substituted aromatic group or substituted or non-substituted heterocyclic group is introduced at 1 and 6 positions of pyrene such that the blue fluorescent compound has improved color purity and luminescent efficiency. Particularly, two positions of phenyl part are substituted by fluorine such that blue color purity and lifetime of the compound are optimized.

For example, the C6-C30 substituted or non-substituted aromatic group is selected from materials of following Formula 3.

[Formula 3]

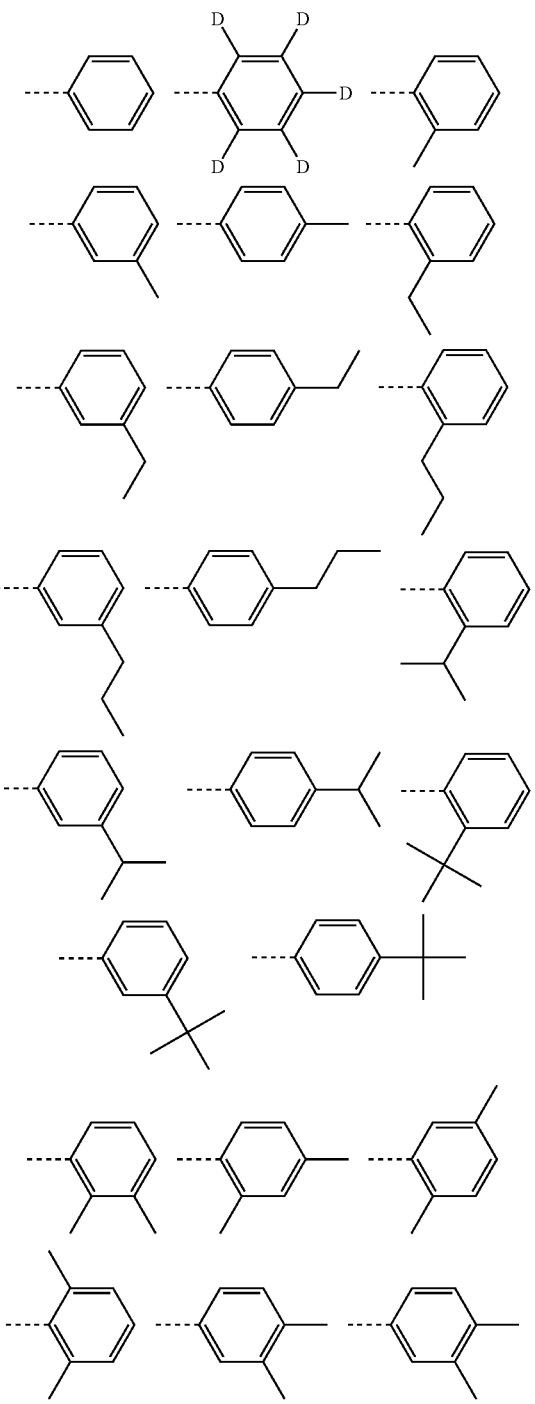

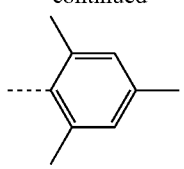
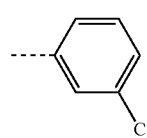
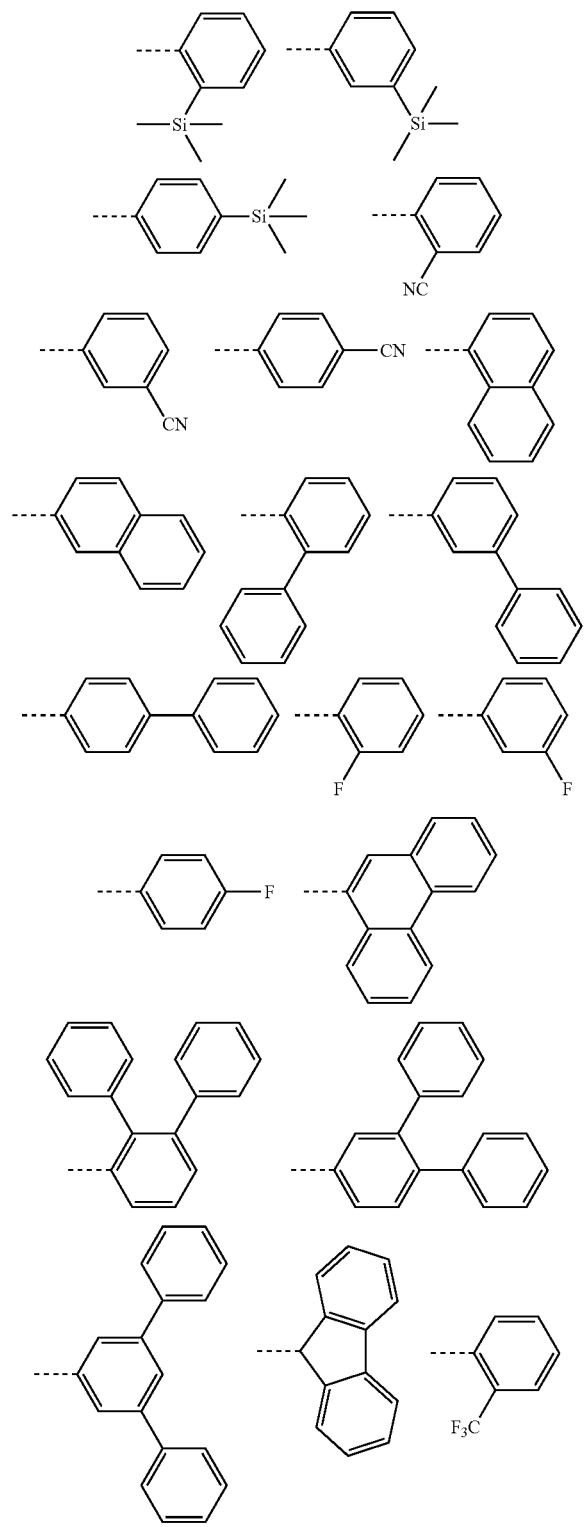
For example, the blue fluorescent compound represented by Formula 2 is one of compounds in following Formula 4. For convenience, A-1 to A-336 are respectively marked to compounds.
[Formula 4]
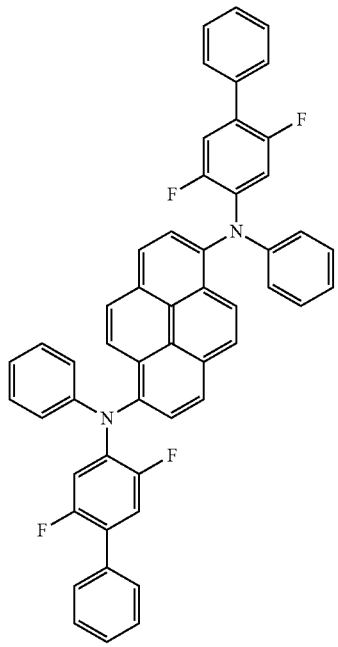
A-1
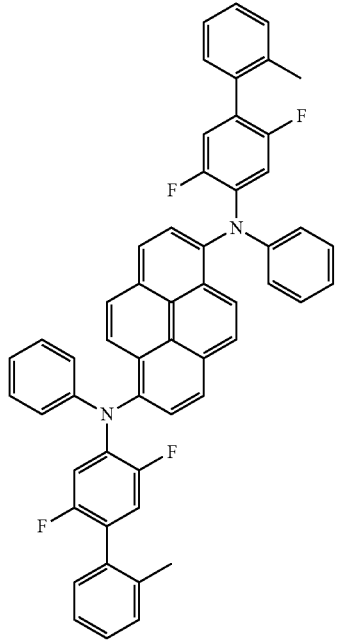
A-2

A-3
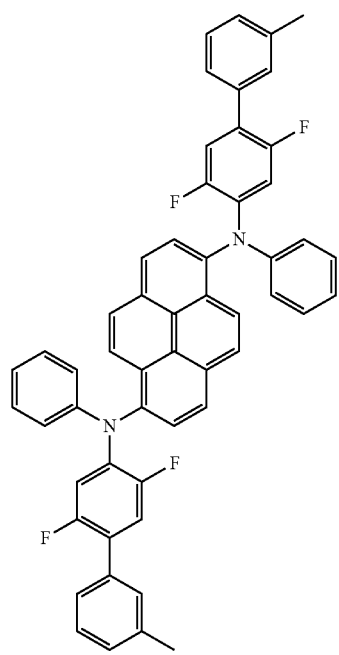
A-4
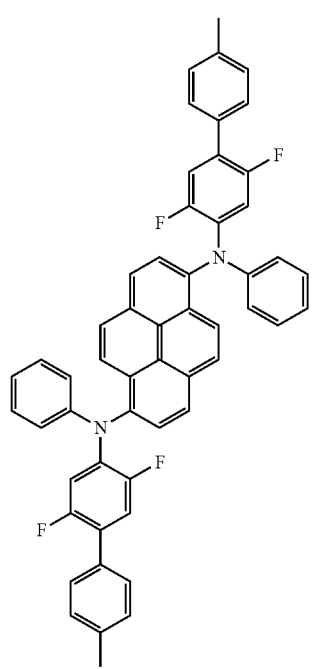
A-5
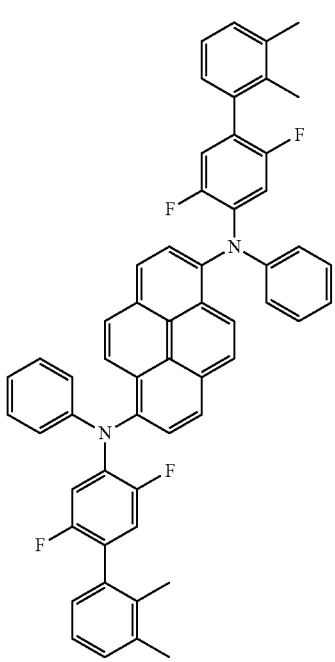
A-6
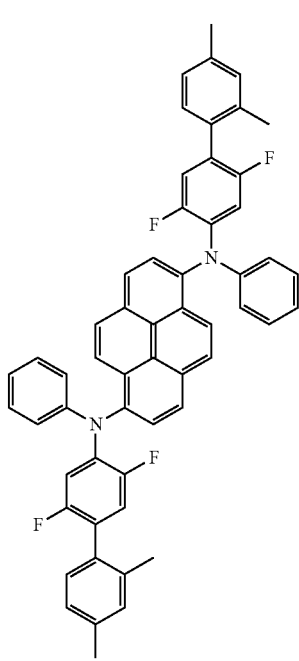

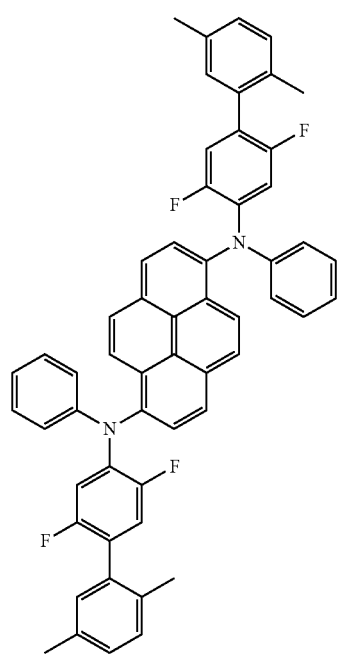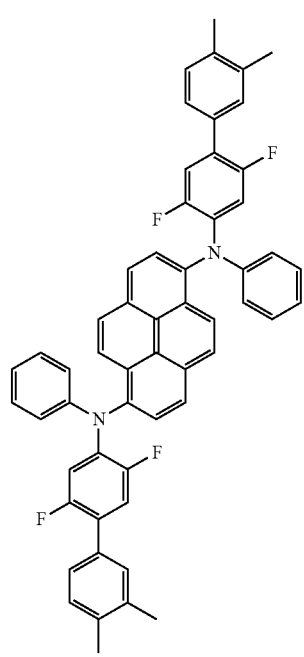

A-11
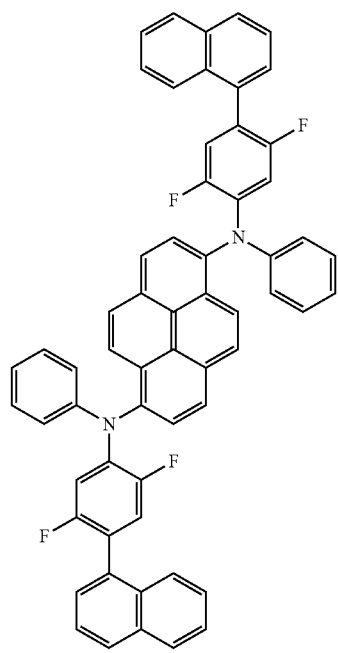
A-12
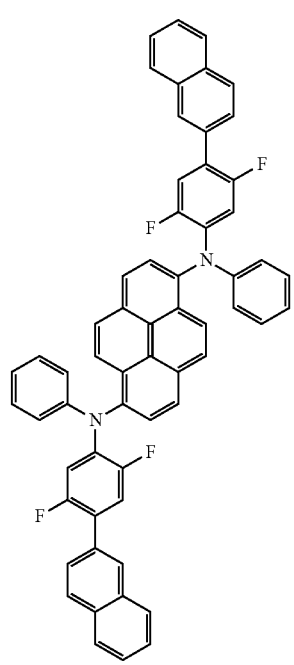
A-13
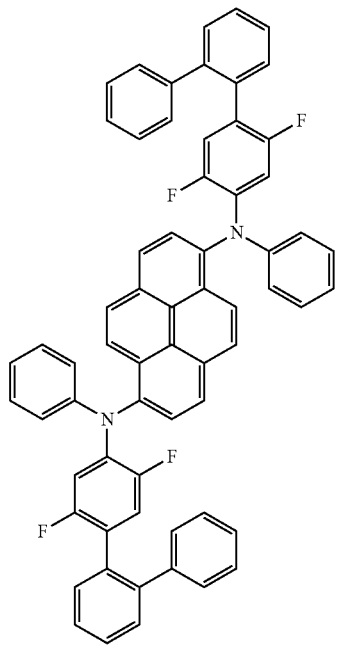
A-14
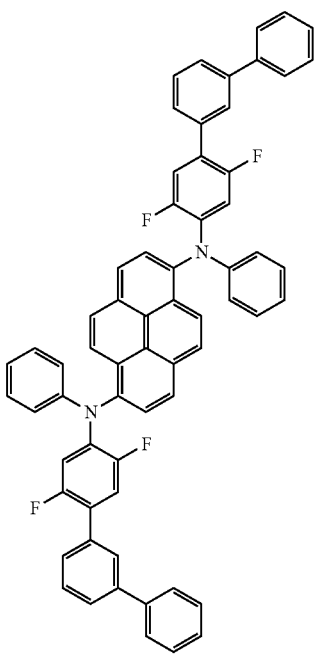
A-15

-continued
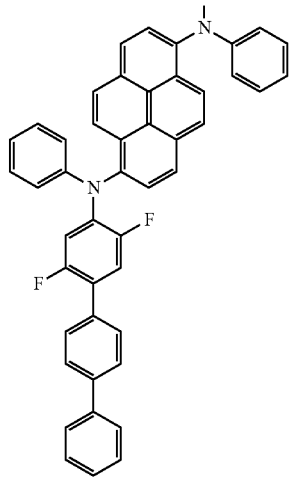
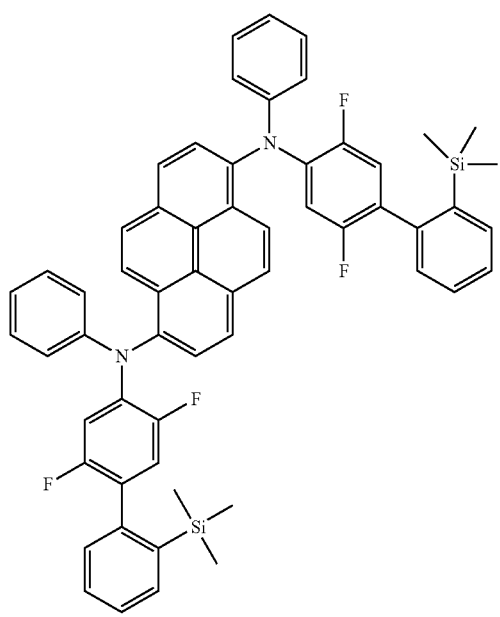
A-16
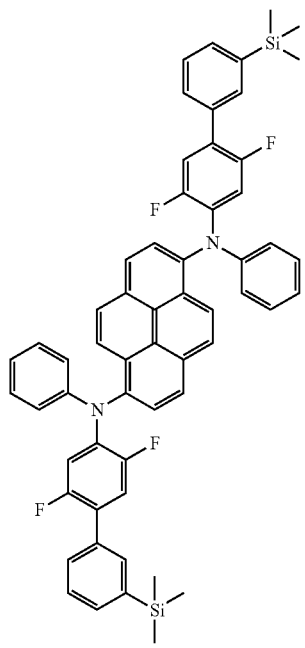
A-17
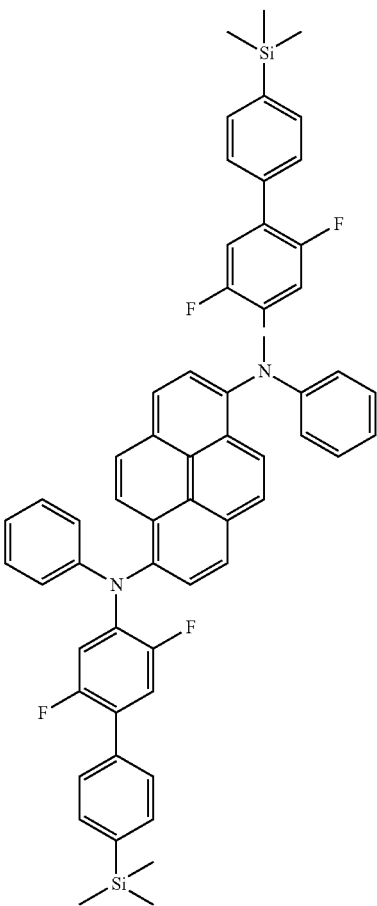
A-18

A-19
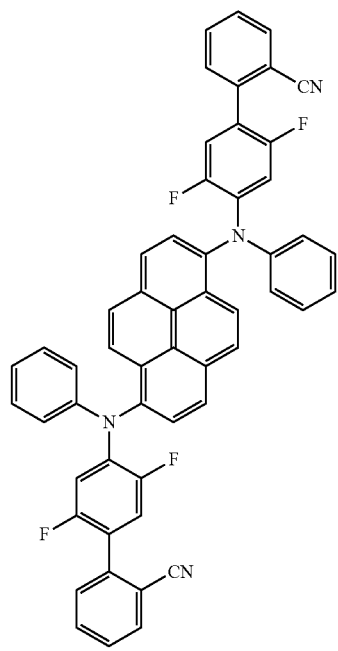
A-20
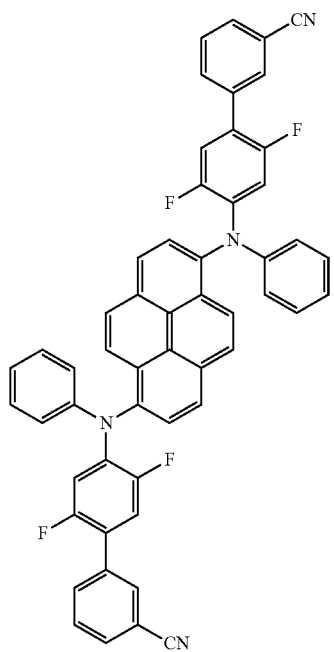
A-21
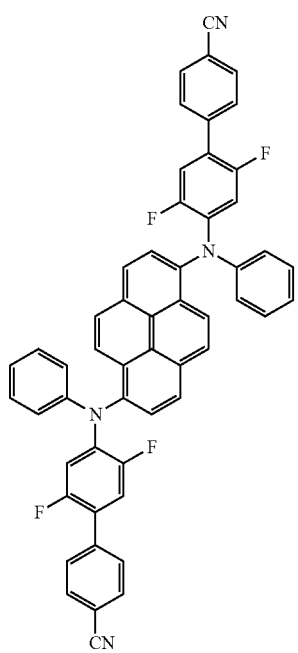
A-22
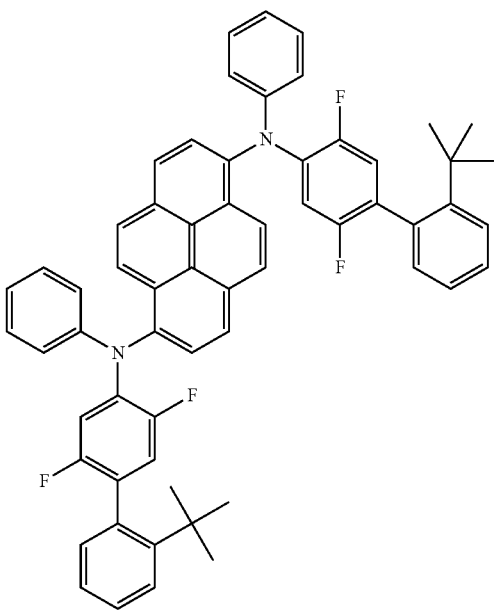

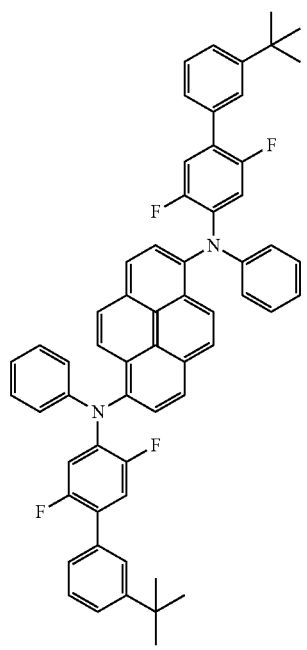
A-23
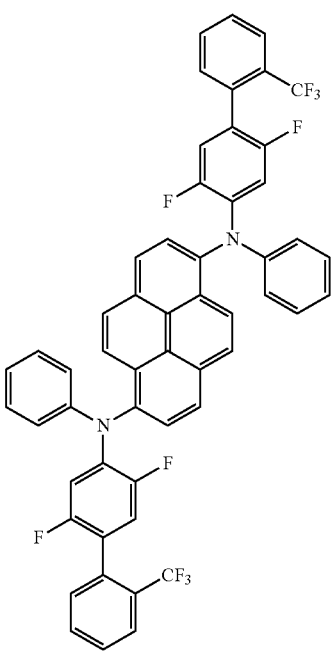
A-25
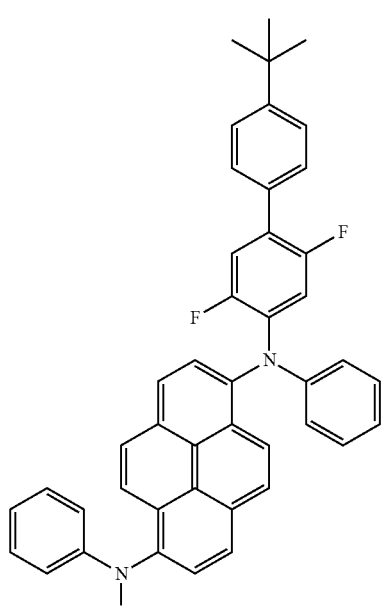
A-24
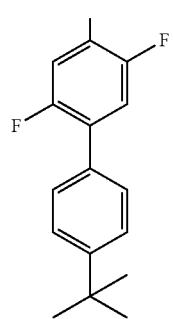
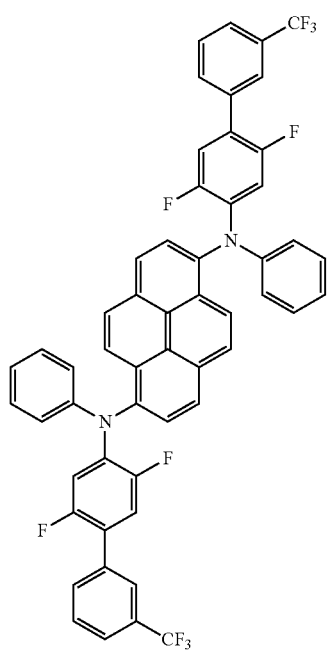
A-26

A-27
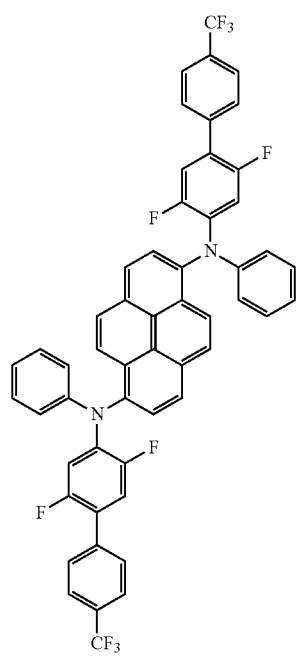
A-28
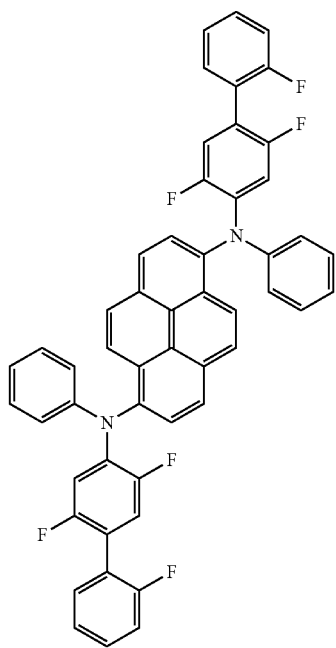
A-29
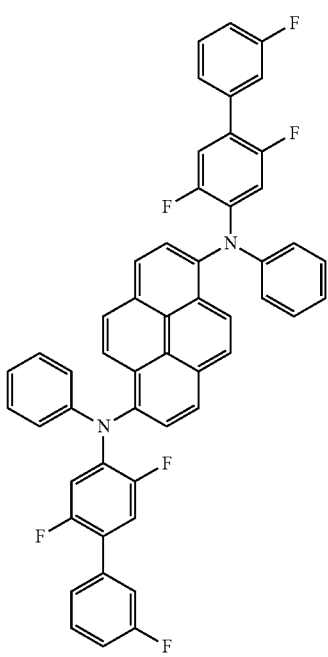
A-30
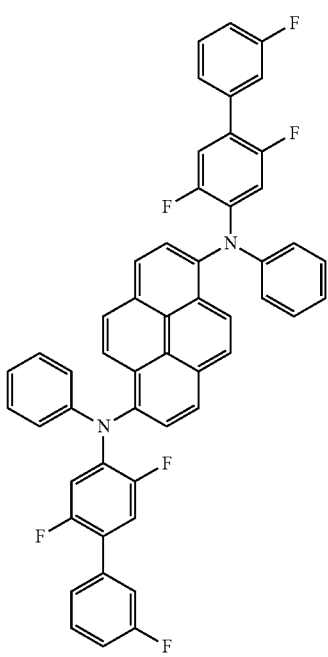

A-31
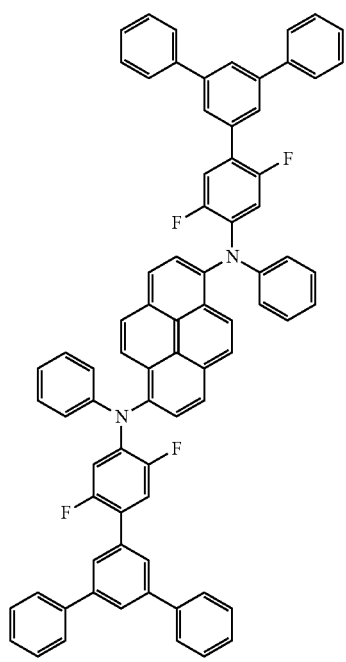
A-32
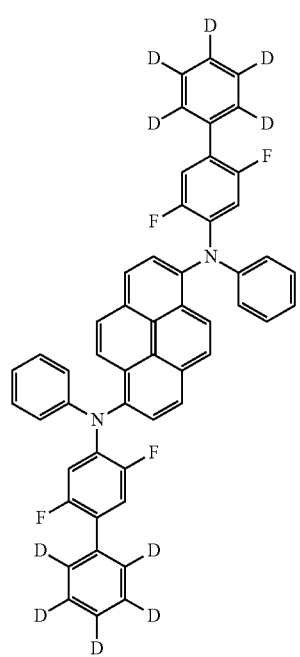
A-33
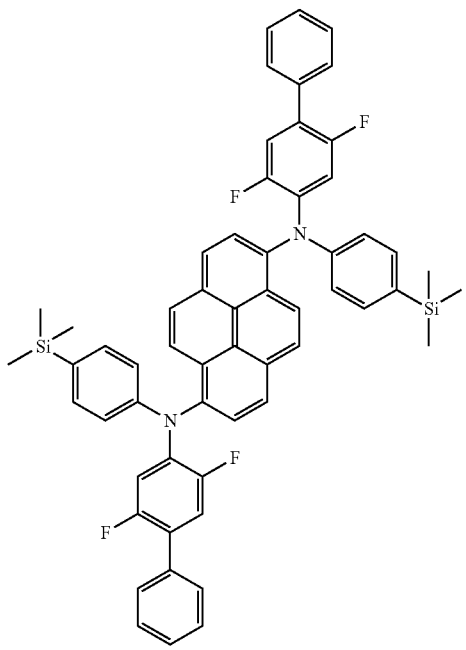
A-34

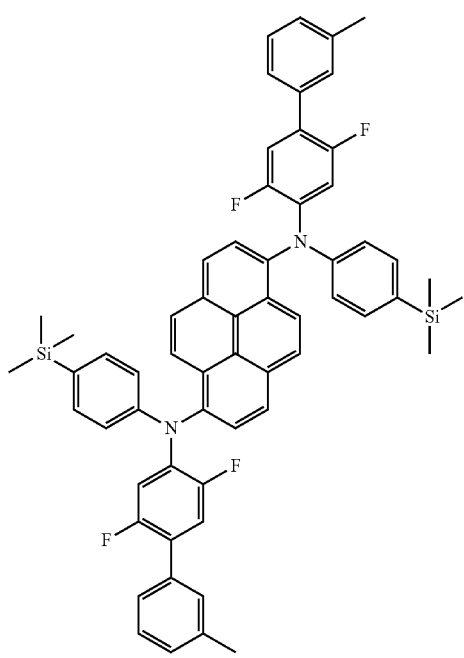
A-35
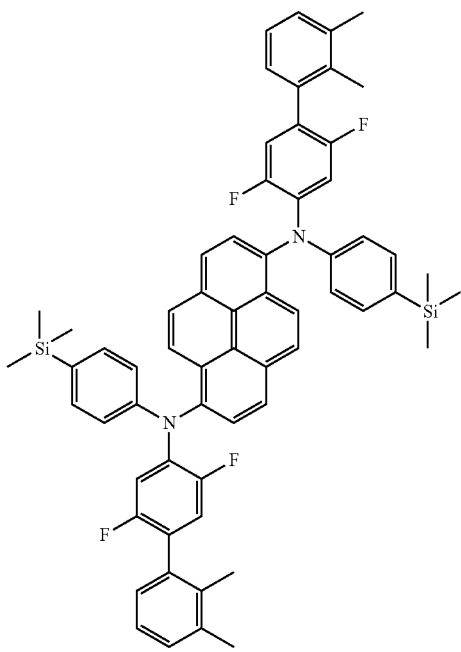
A-37
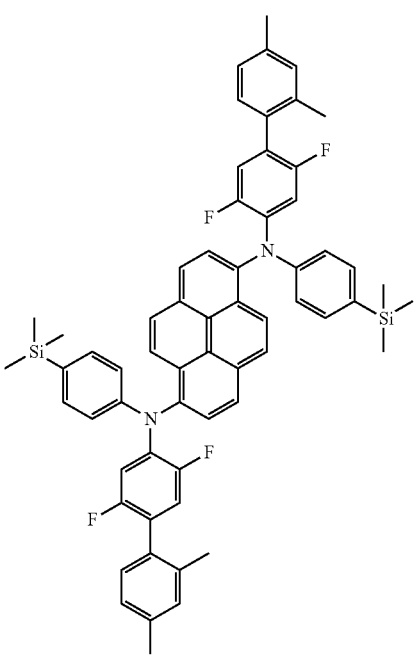
A-38

A-39
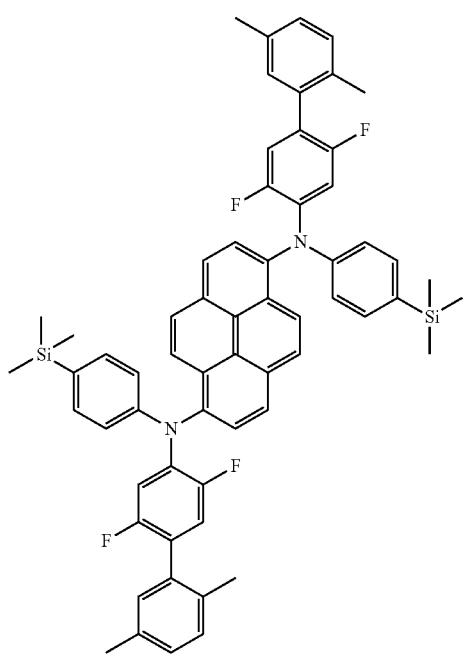
A-40
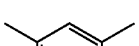
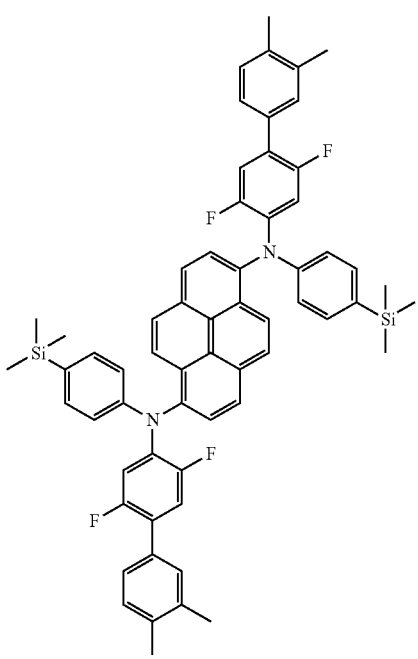
A-41
A-42

A-43
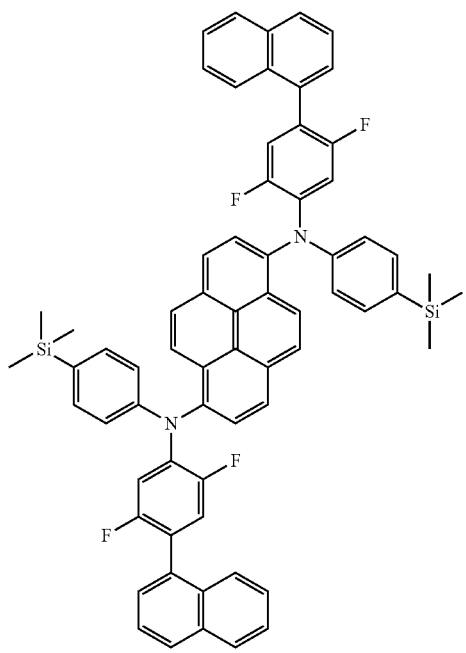
A-45
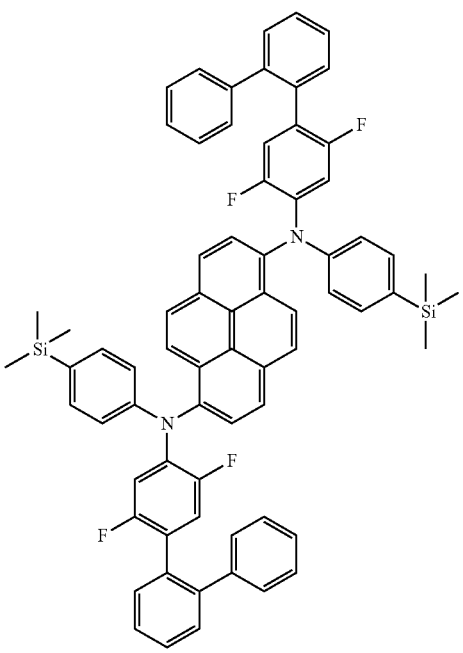
A-44
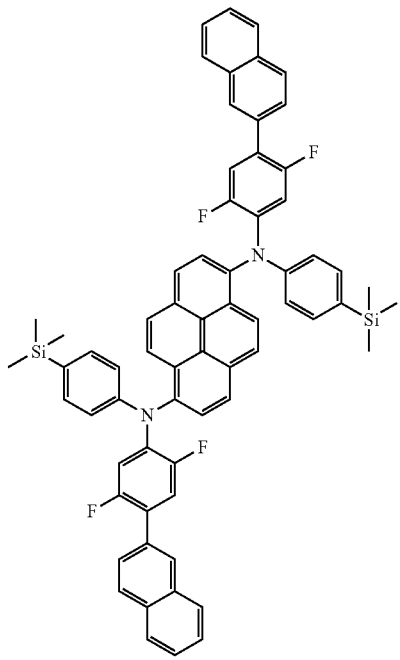
A-46
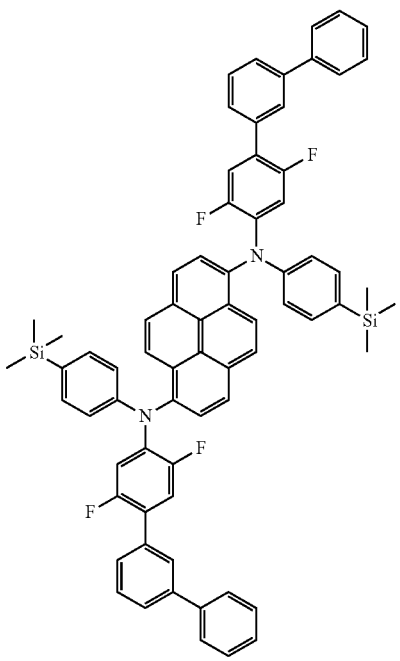

-continued
A-47
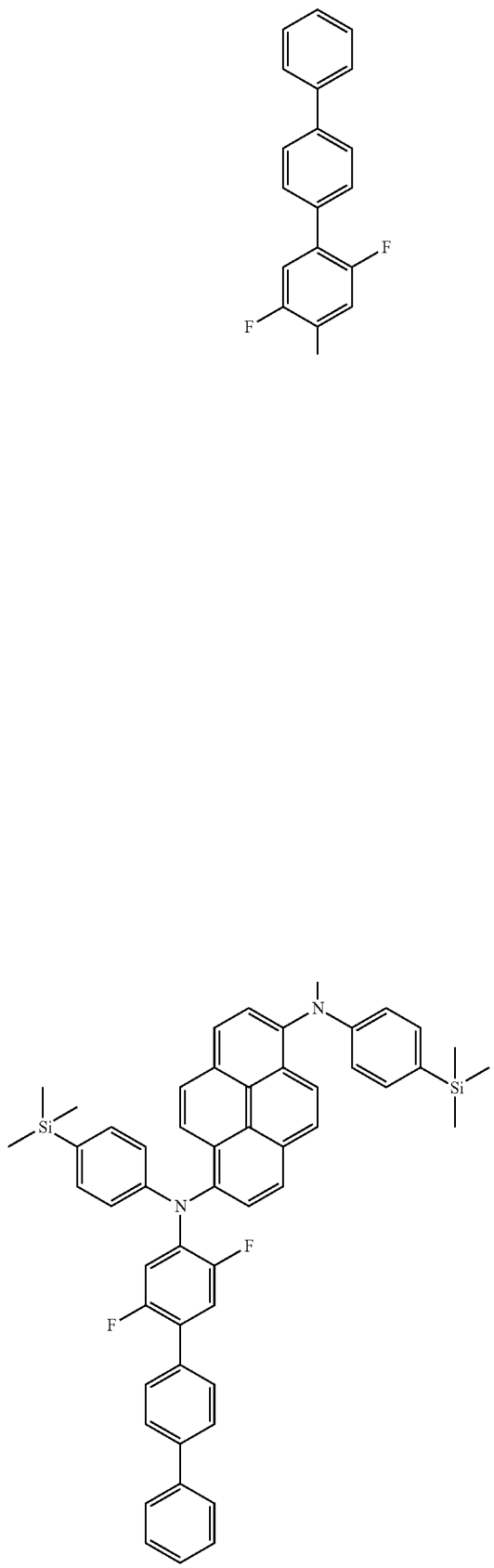
A-48
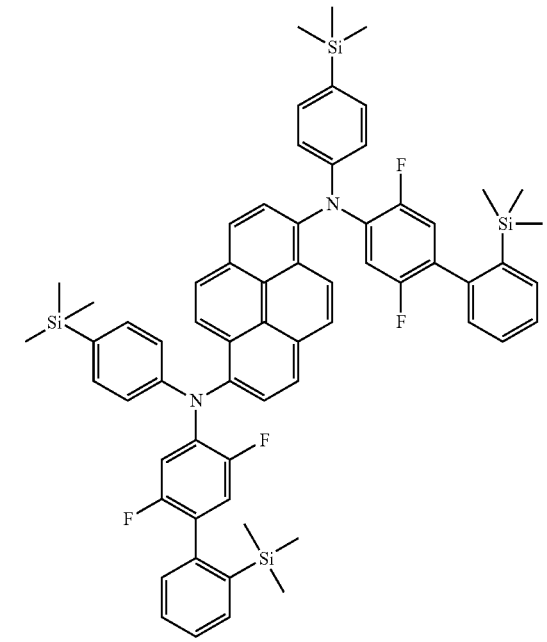
A-49
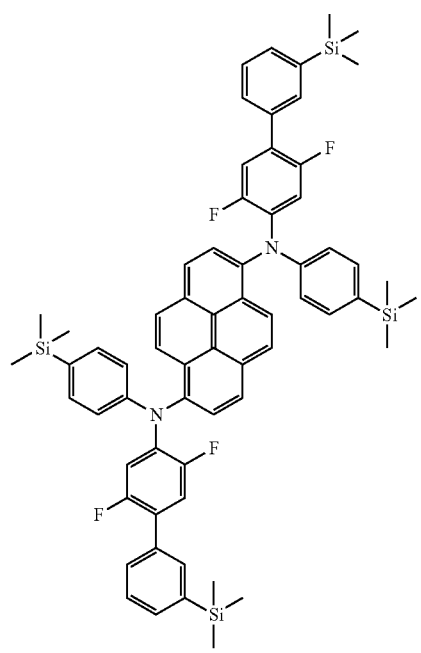
A-50
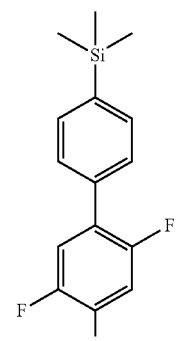

-continued
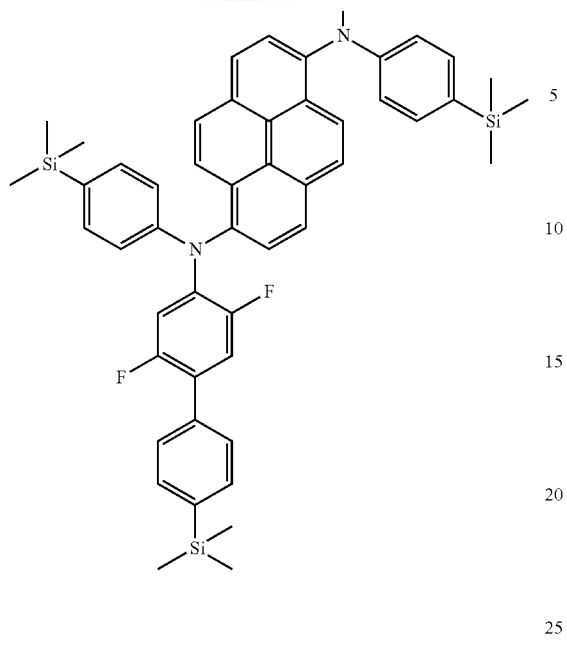
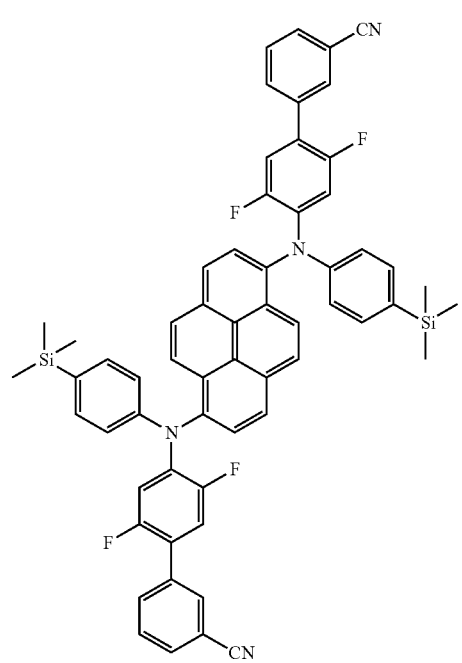
A-52
A-51
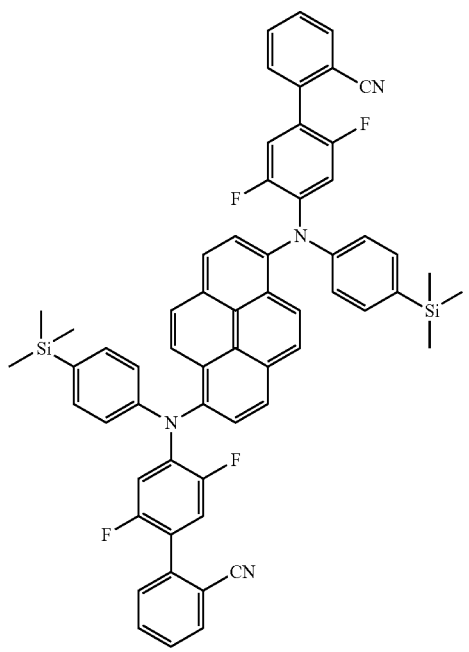
A-53
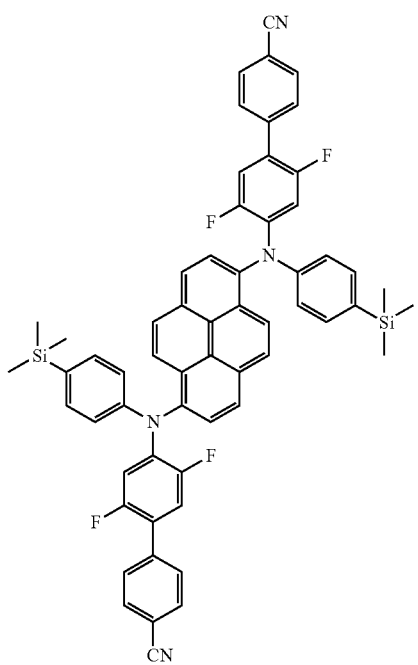

A-54
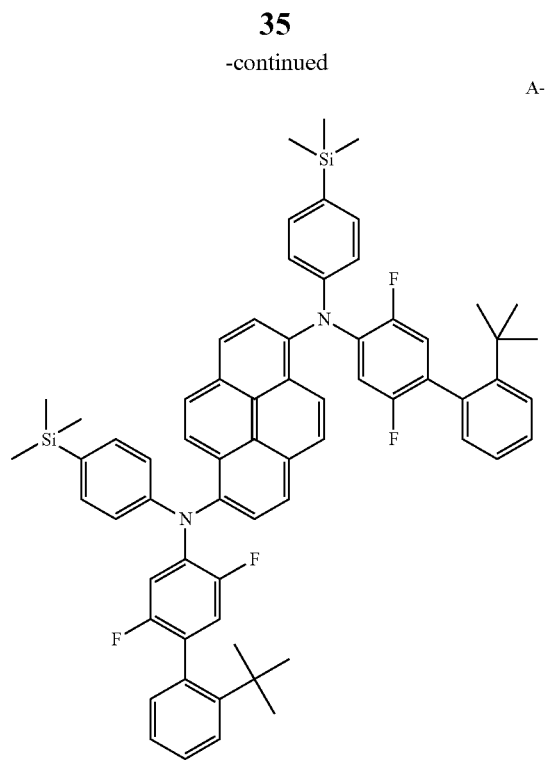
A-55
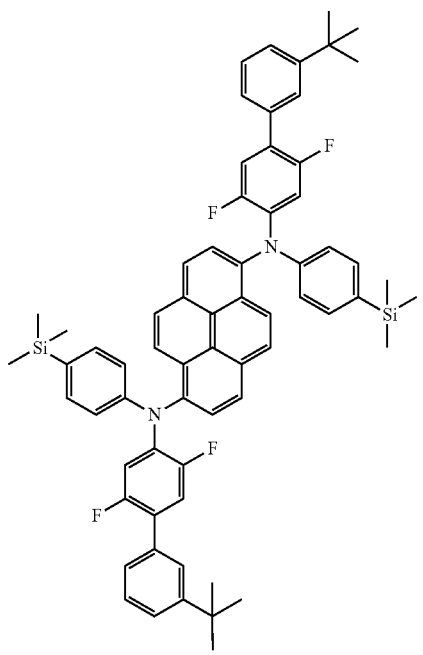
A-56
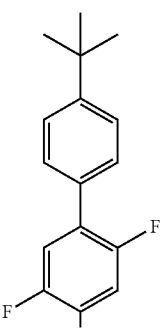
A-57
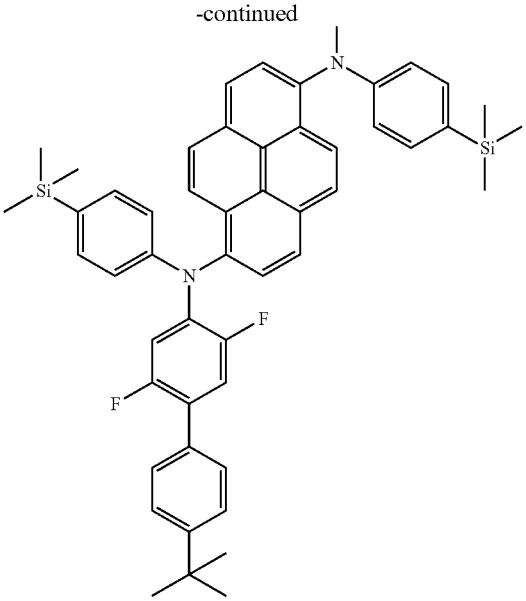
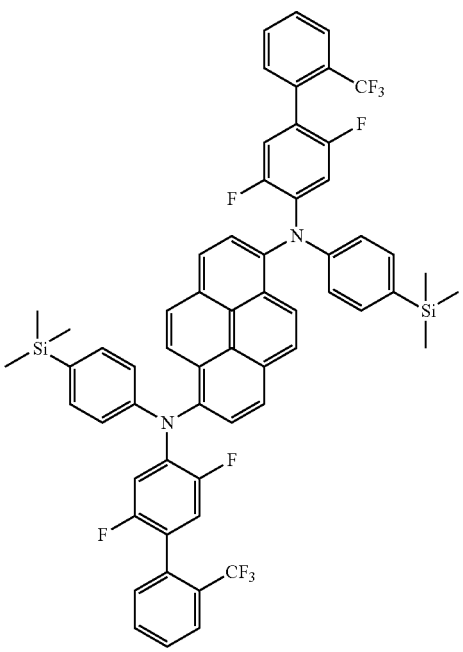

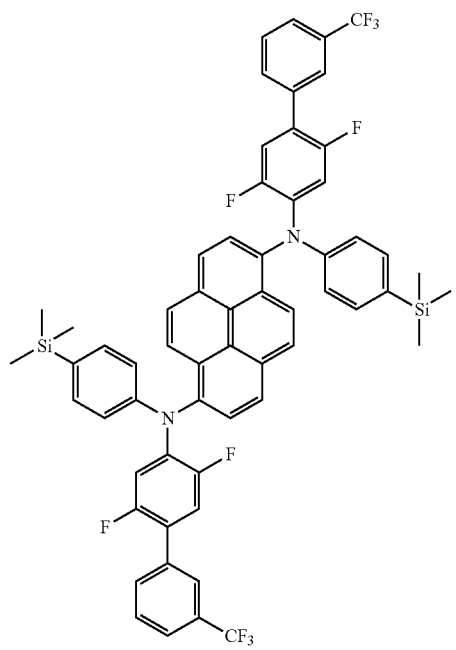
A-58
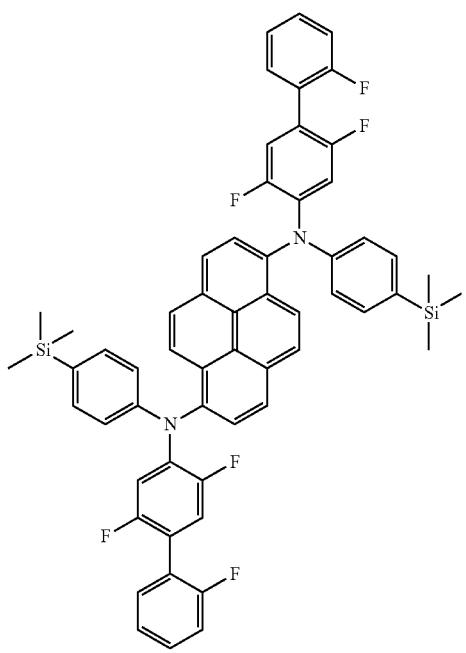
A-60
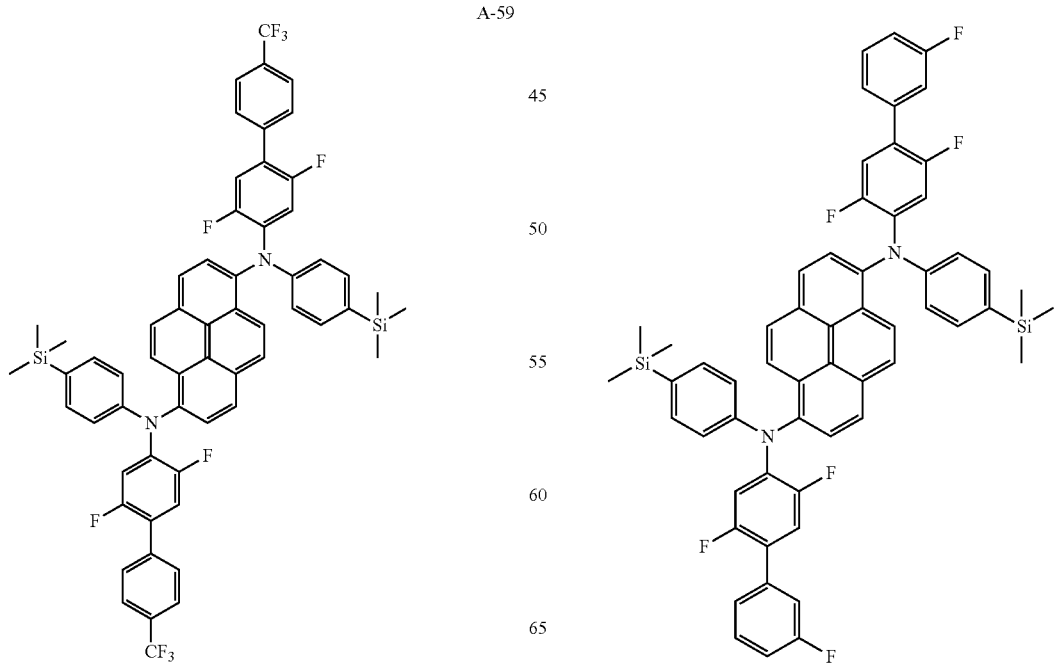
A-59
A-61

A-62
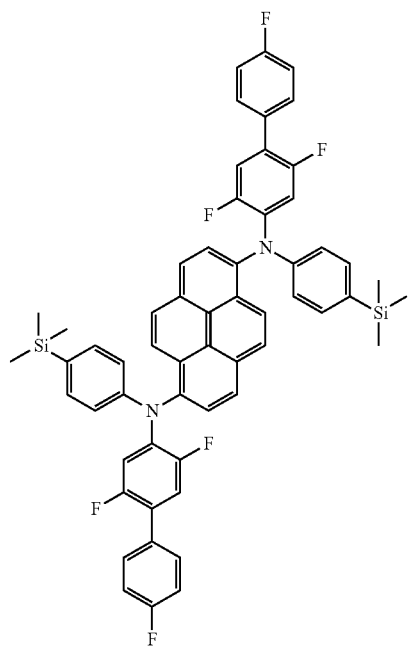
A-63
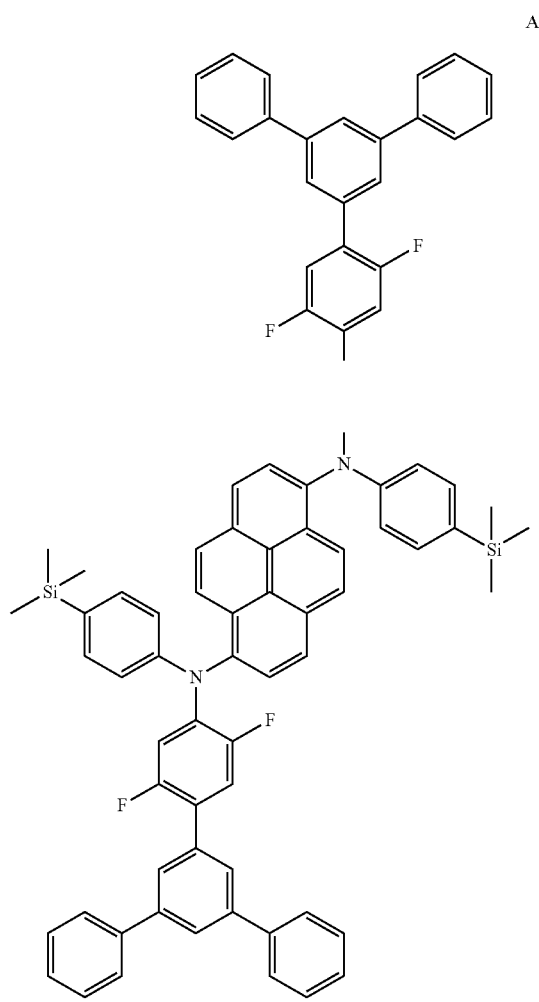
A-64
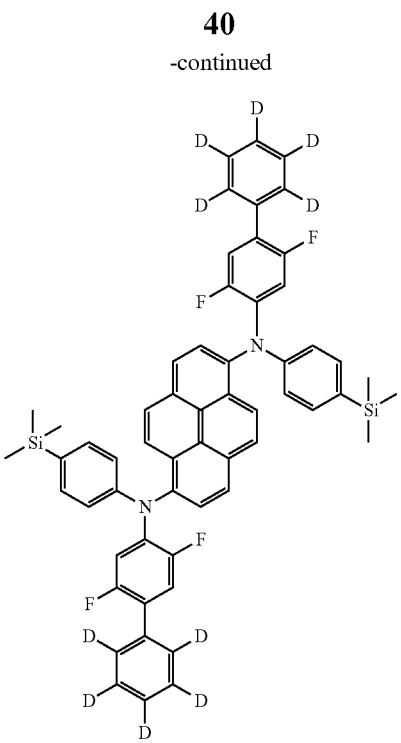
A-65
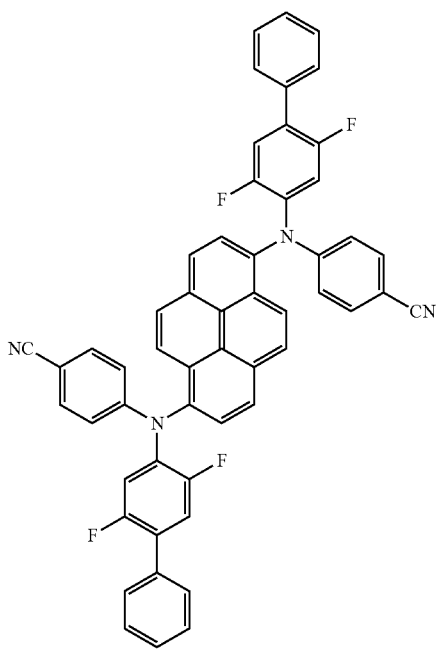

A-66
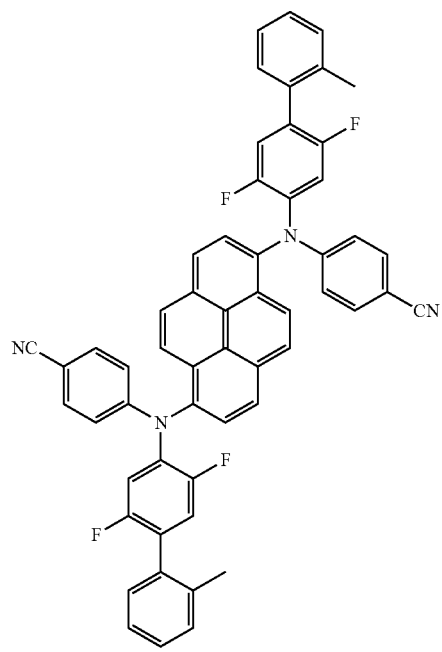
A-68
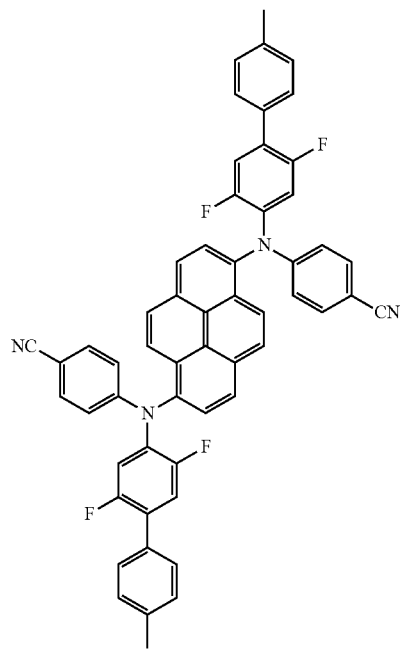
A-67
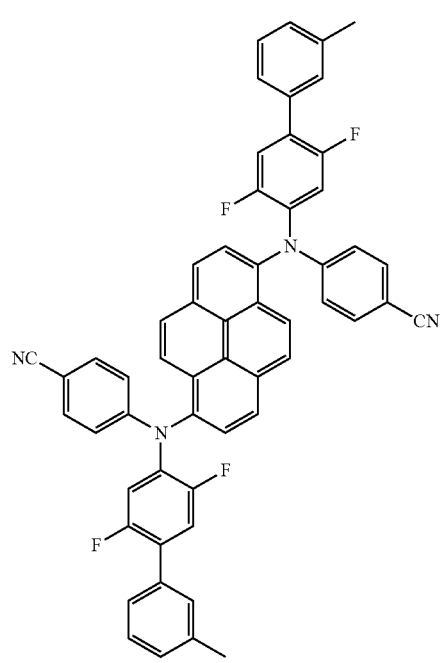
A-69
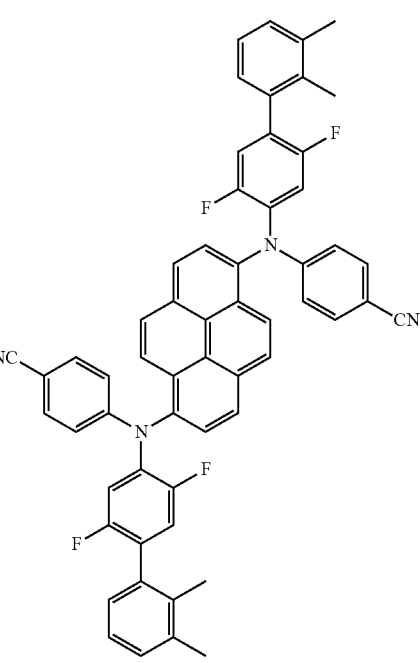

A-70
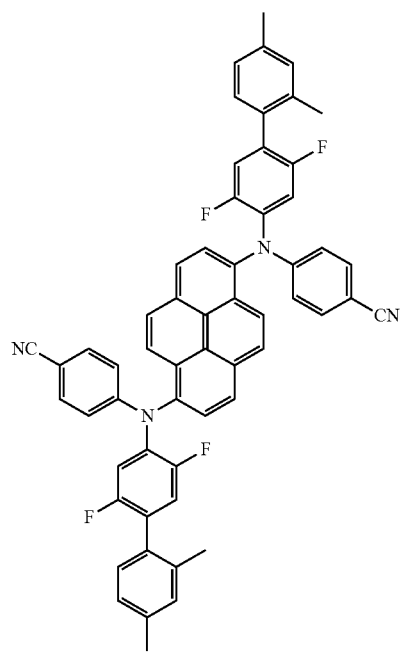
A-71
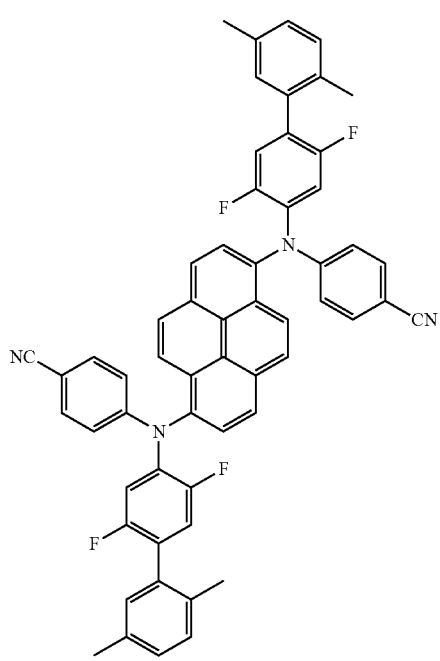
A-72
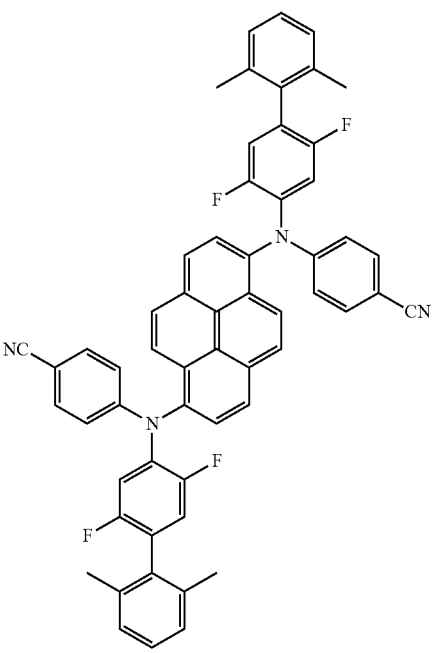
A-73
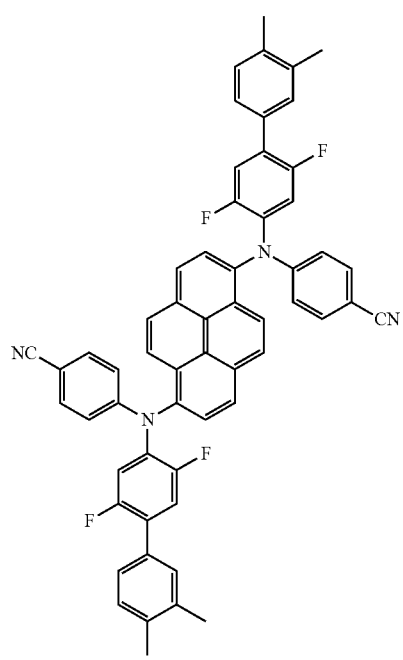

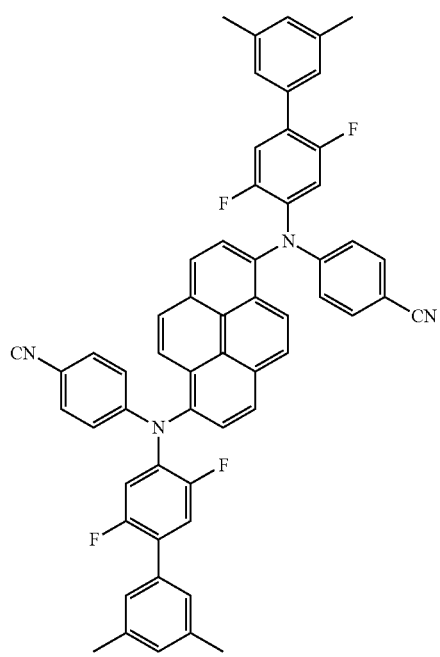
A-74
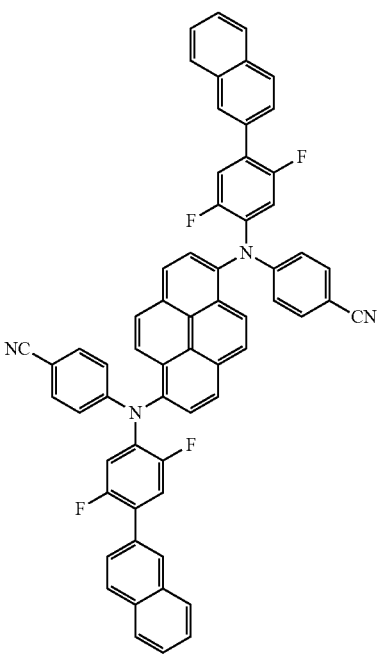
A-76
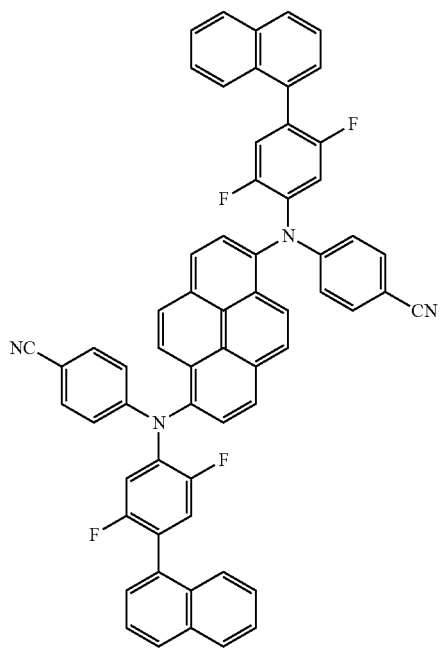
A-75
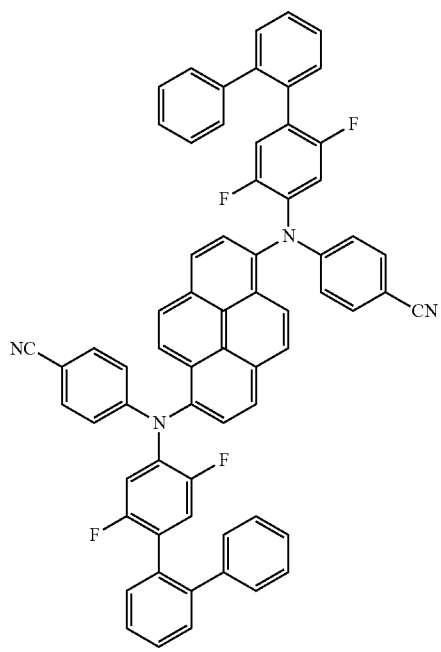
A-77

A-78
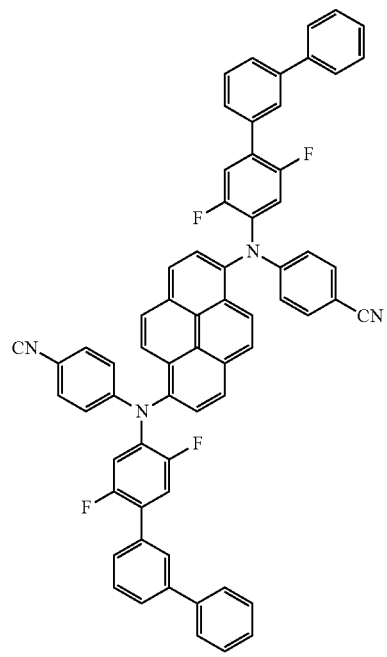
A-80
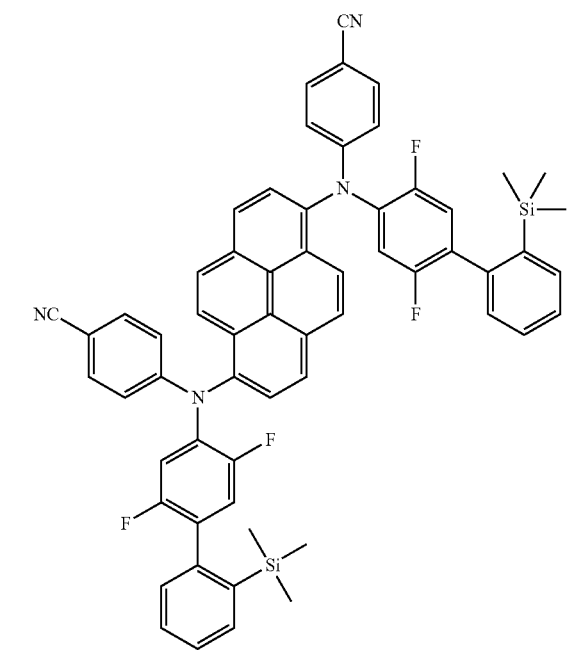
A-79
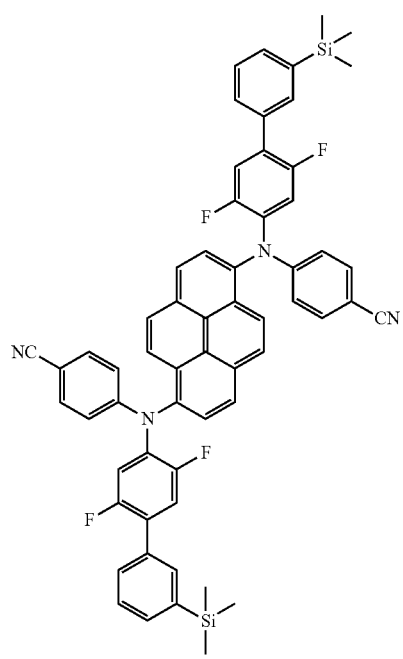
A-81
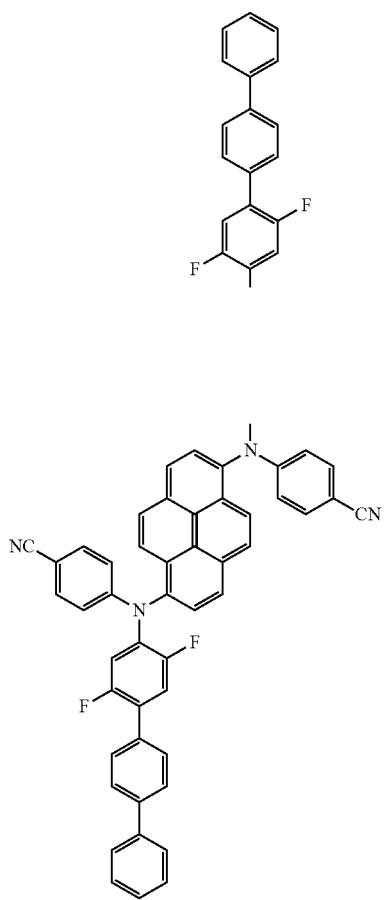
A-82
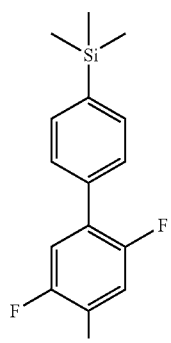

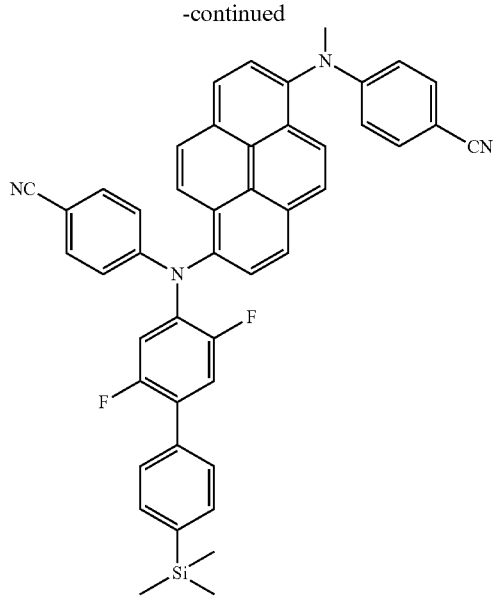
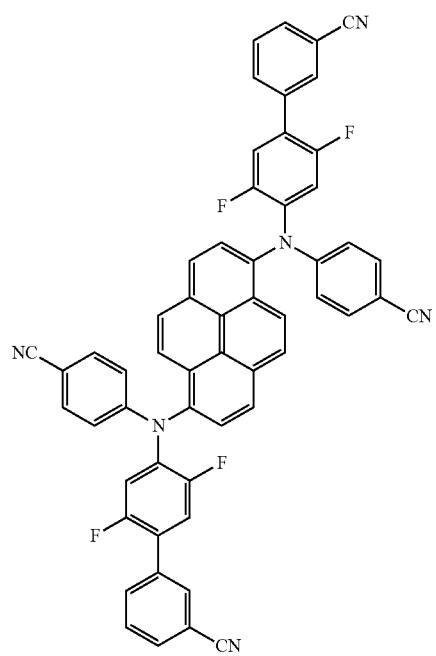
A-84
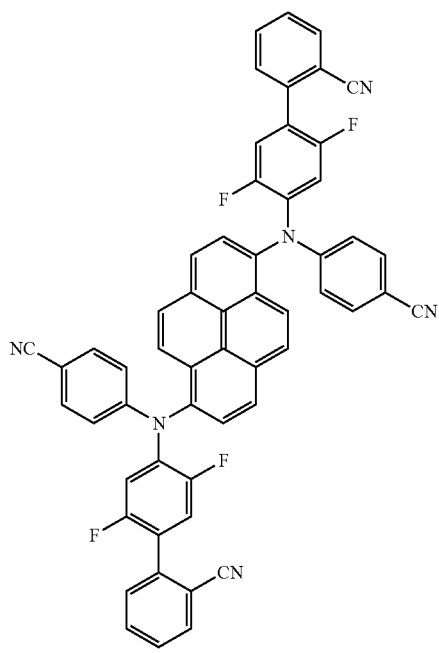
A-83
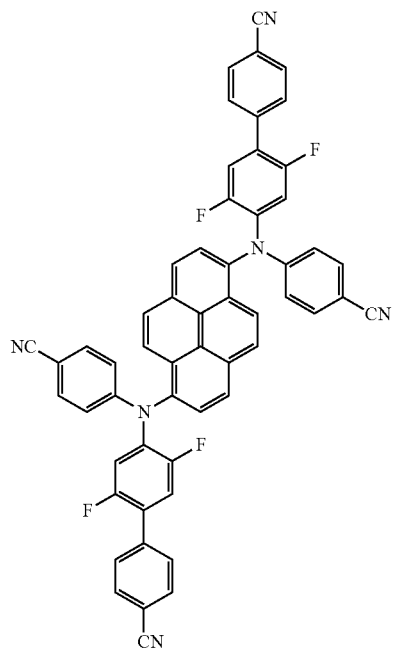
A-85

A-86
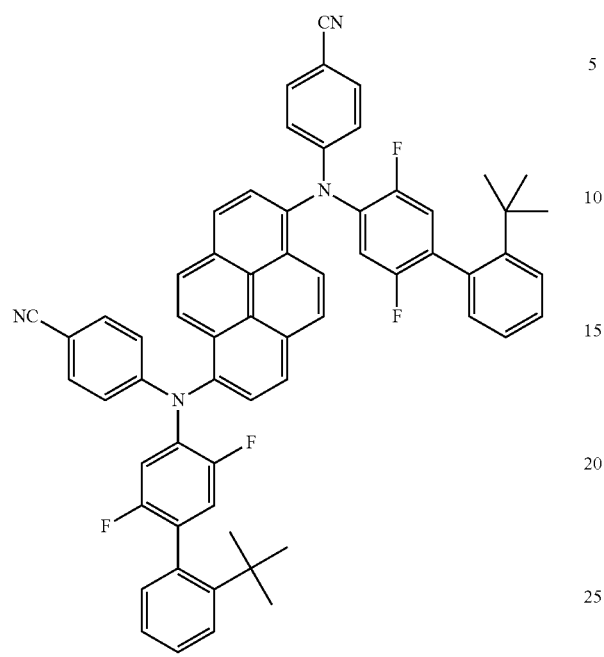
A-87
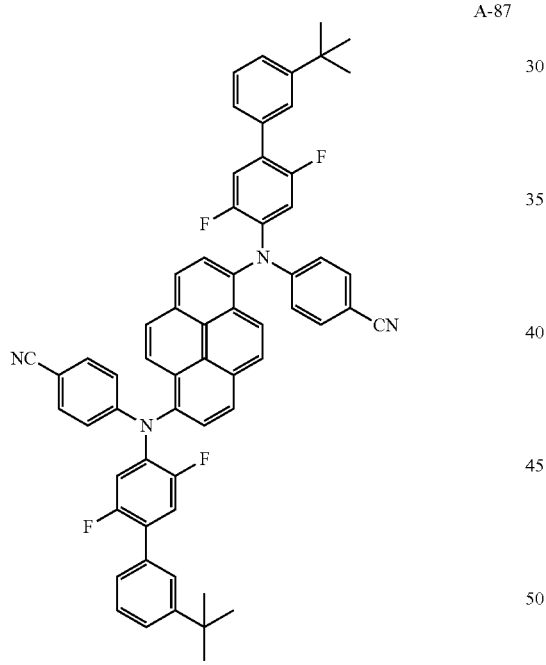
A-88
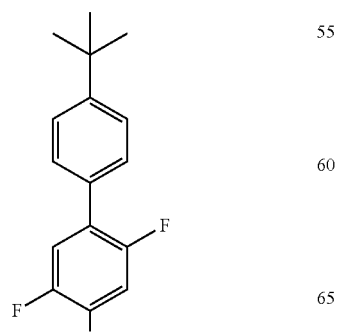
A-89
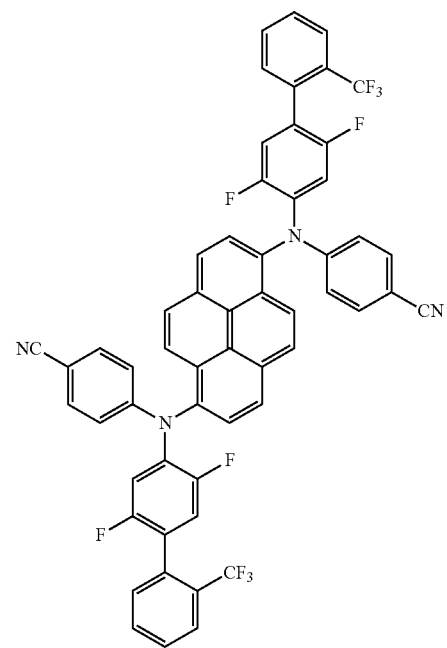
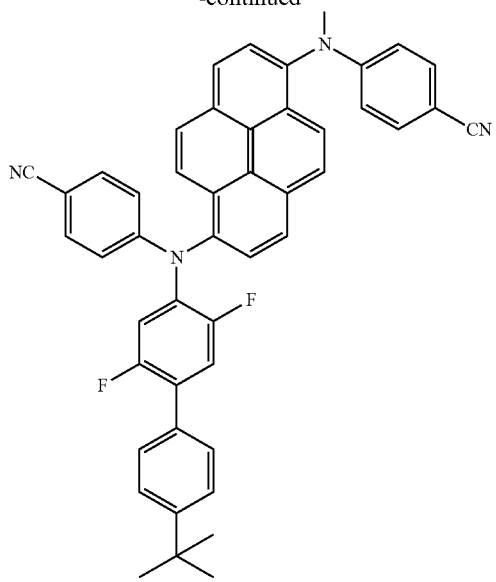

A-90
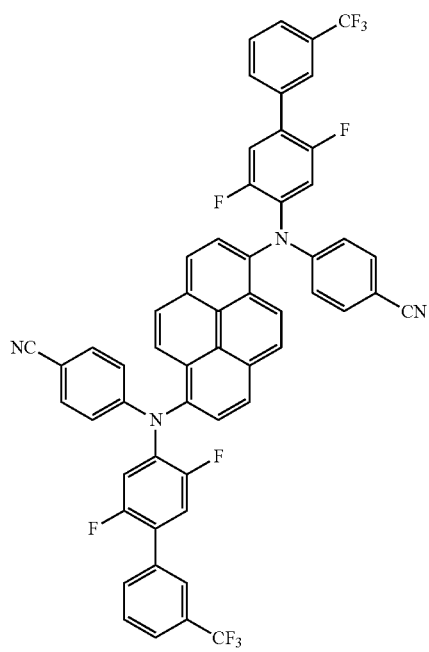
A-91
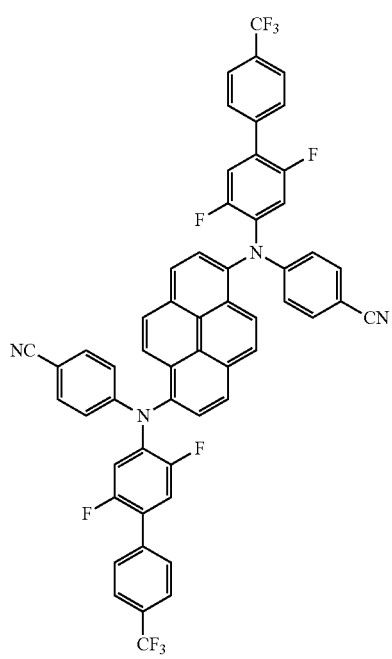
A-92
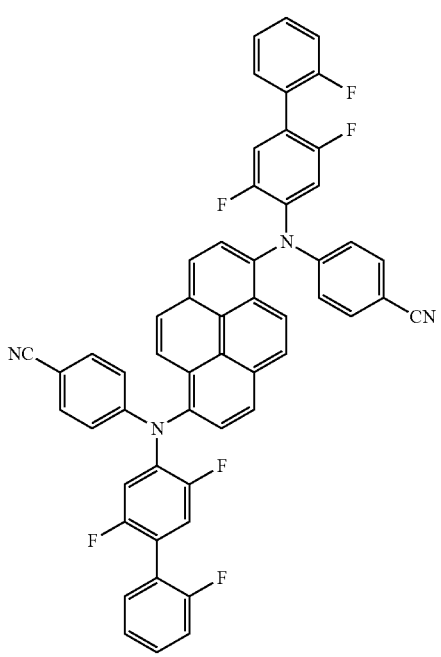
A-93
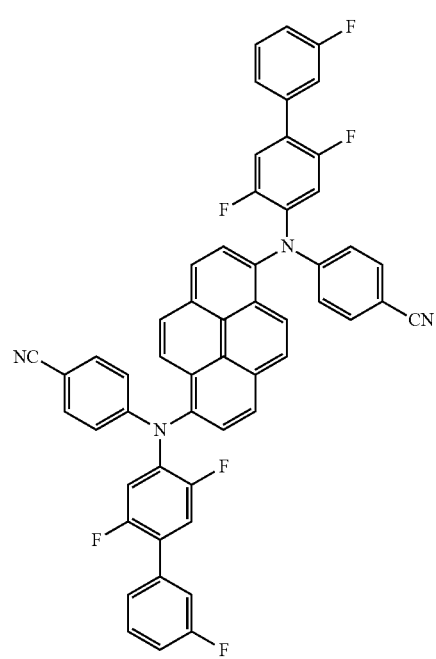

A-94
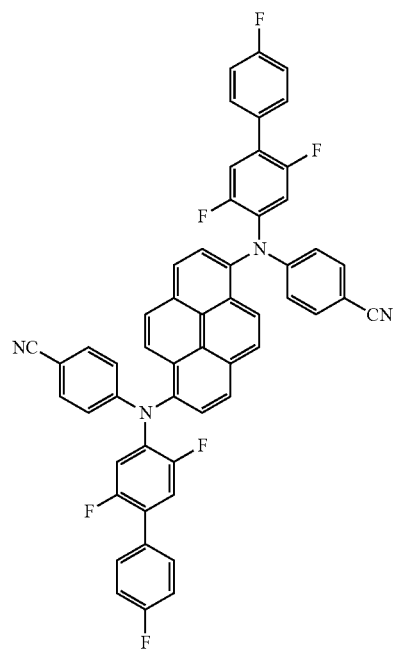
A-96
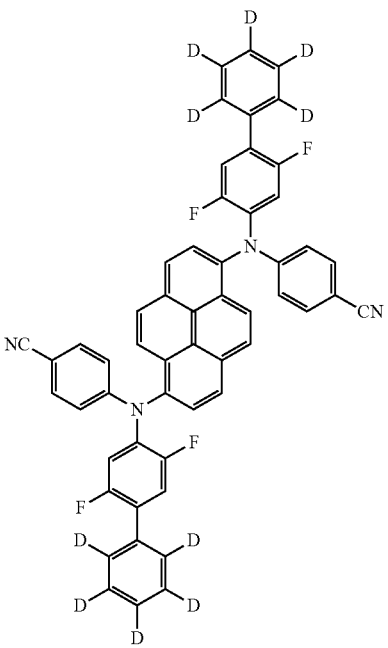
A-95
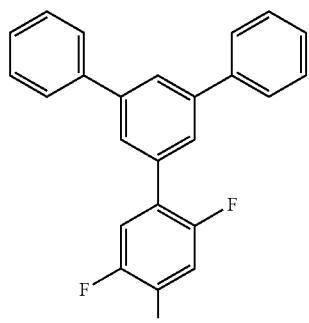
A-97
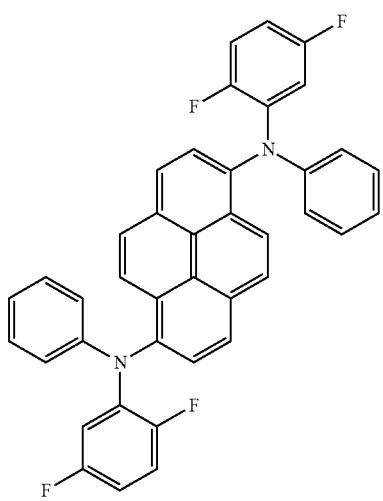
A-98
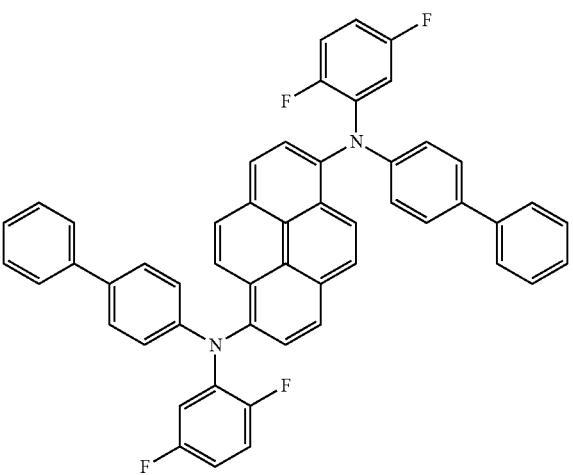

A-99 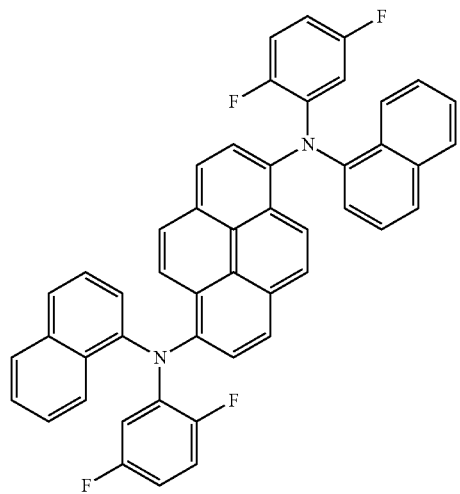
A-102 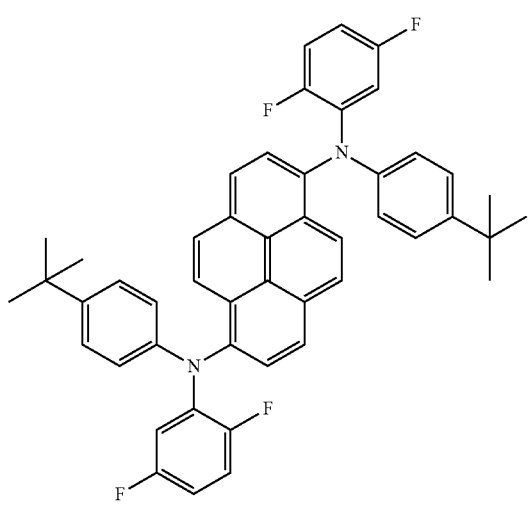
A-100 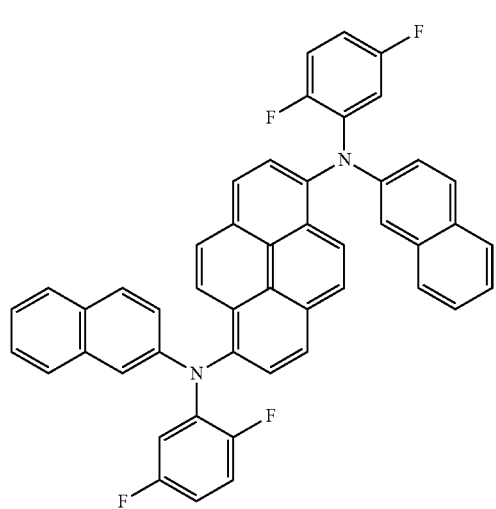
A-103 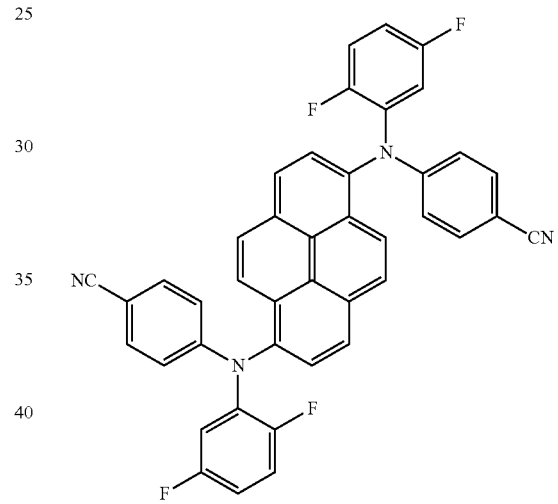
A-101 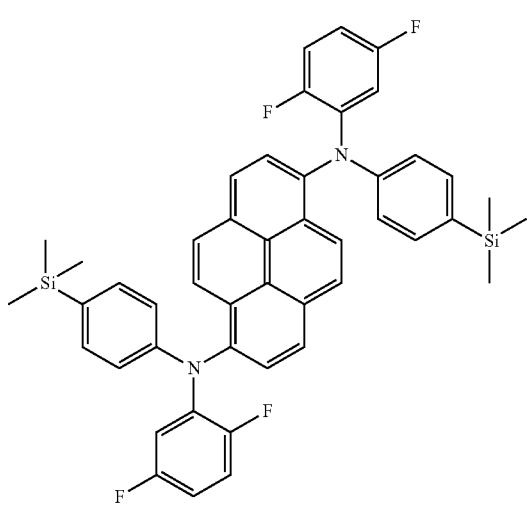
A-104 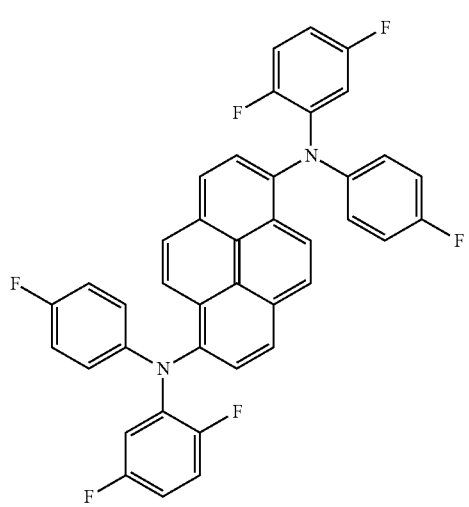

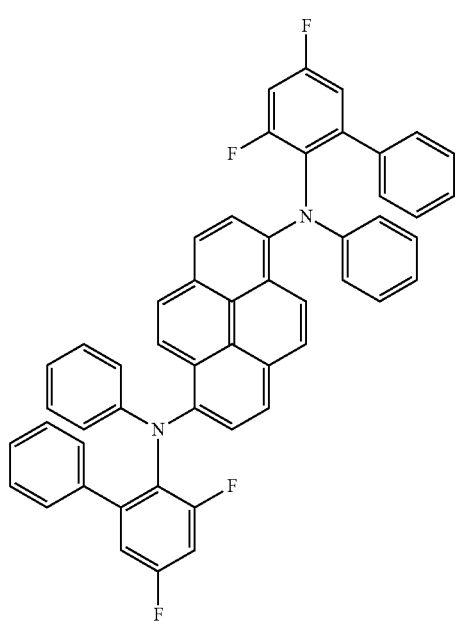
A-105
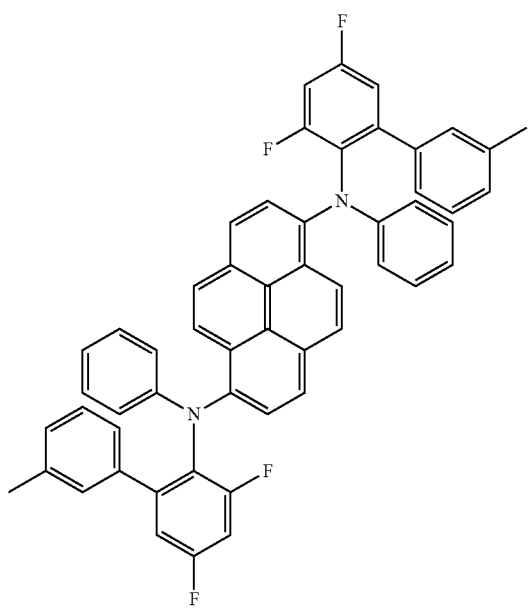
A-107
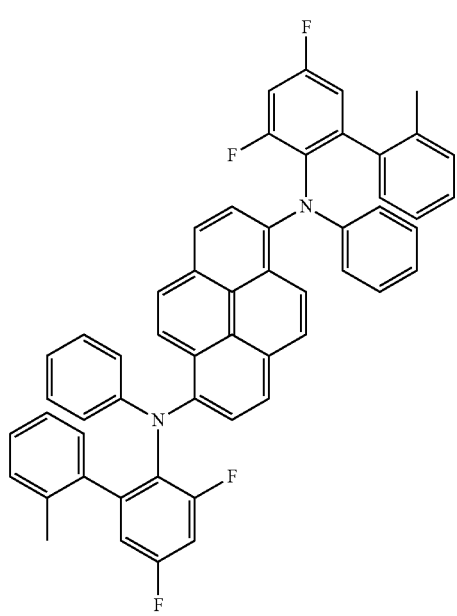
A-106
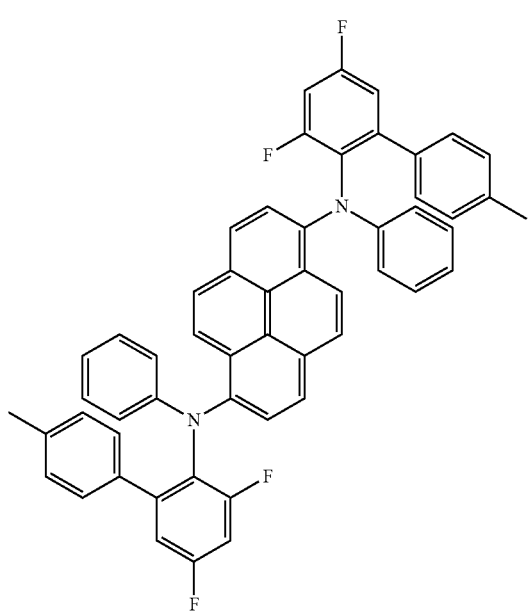
A-108

A-109
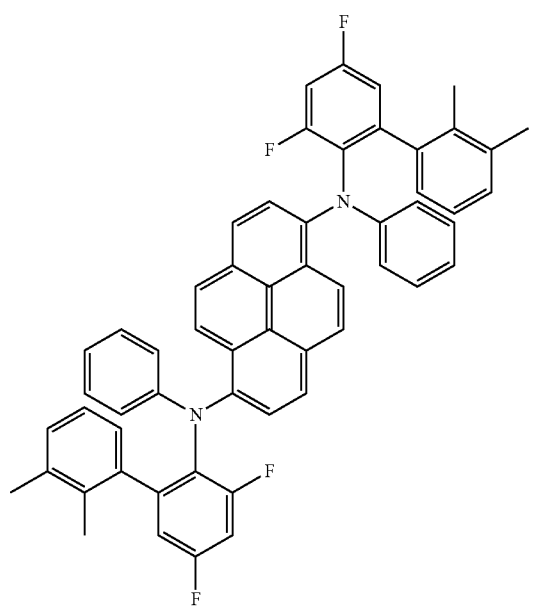
A-110
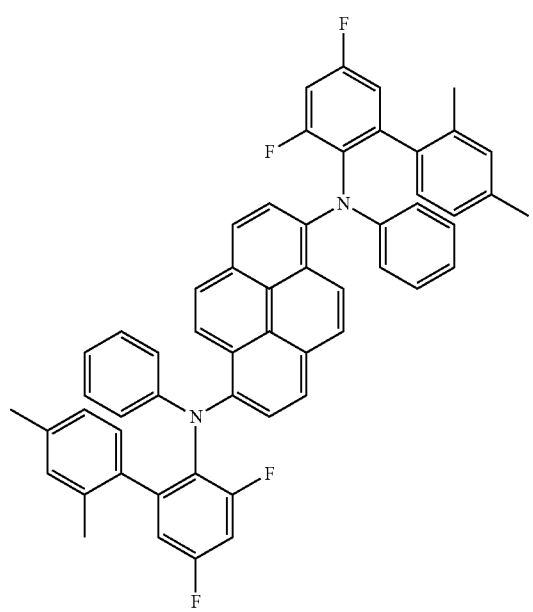
A-111
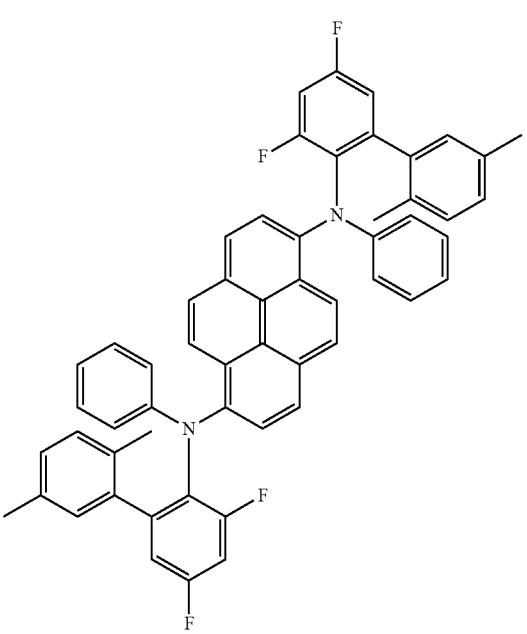
A-112

A-113
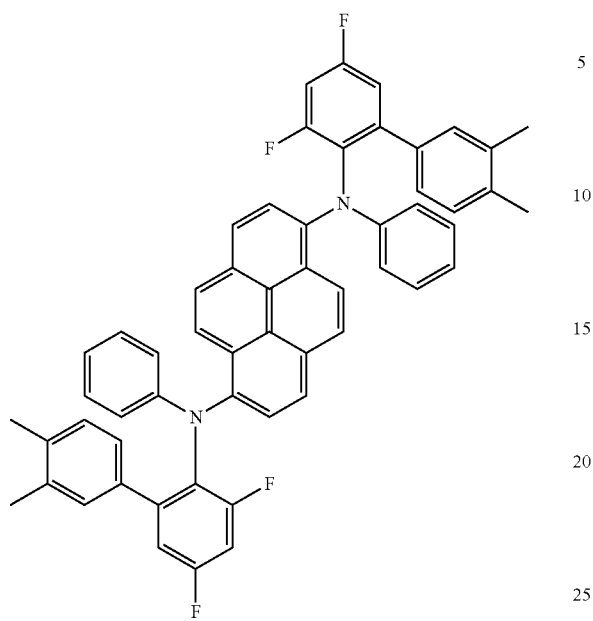
A-114
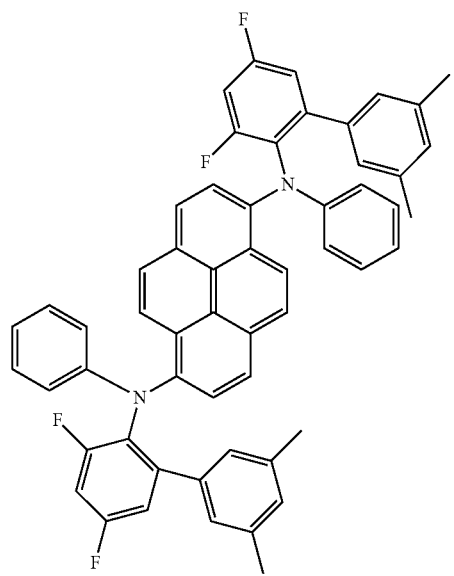
A-115
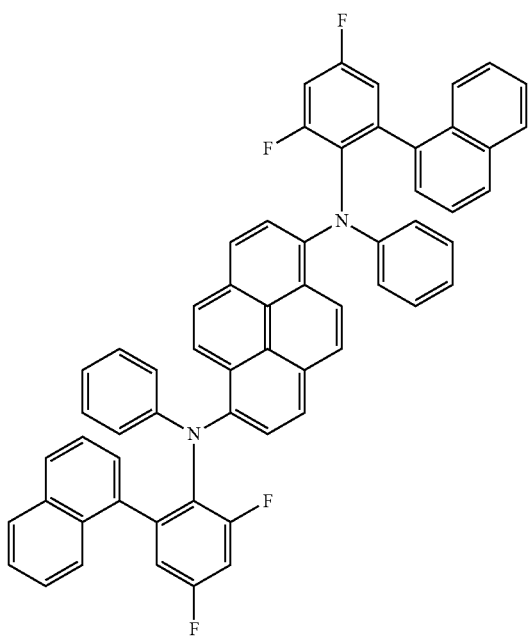
A-116
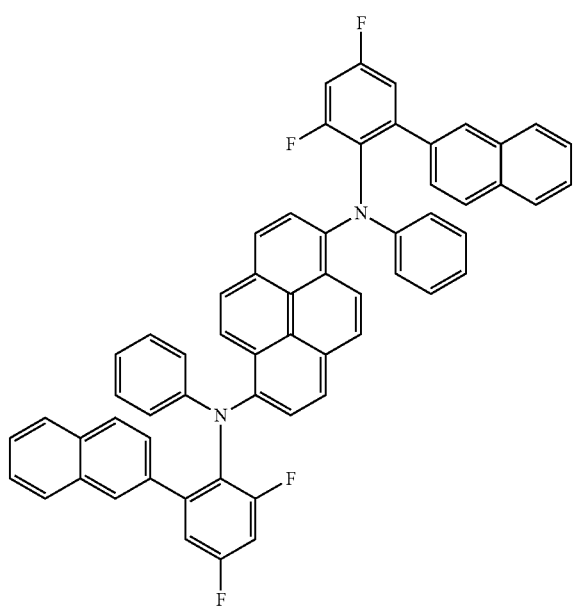

A-117
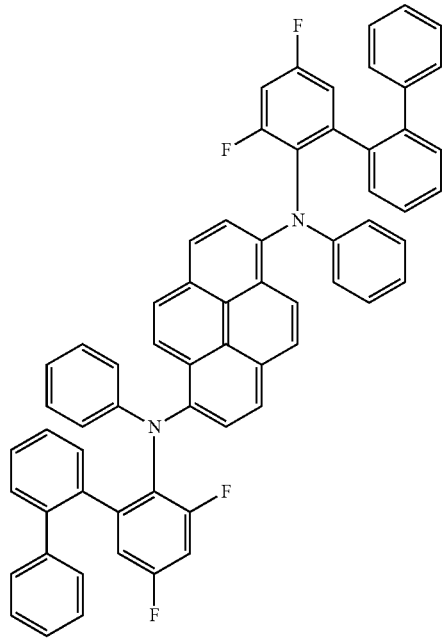
A-119
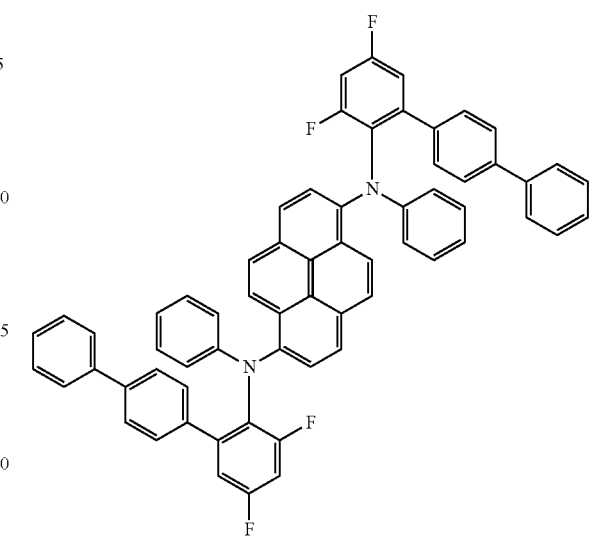
A-118
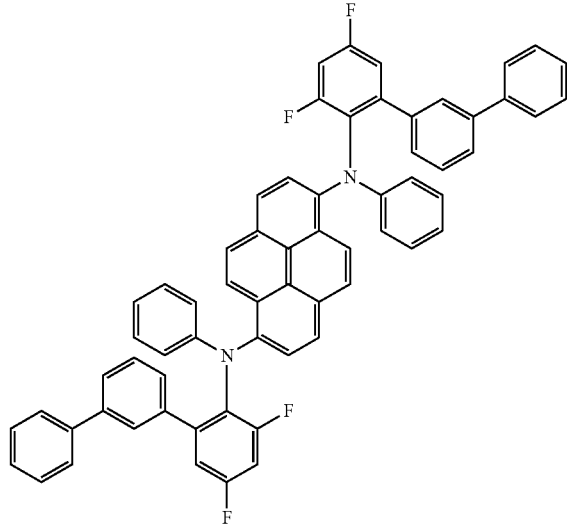
A-120
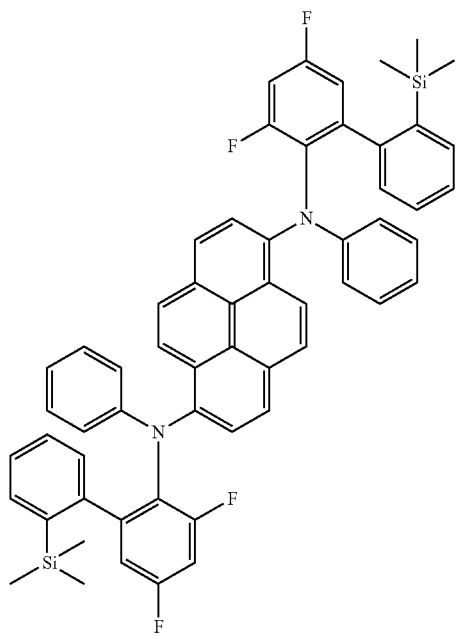

A-121
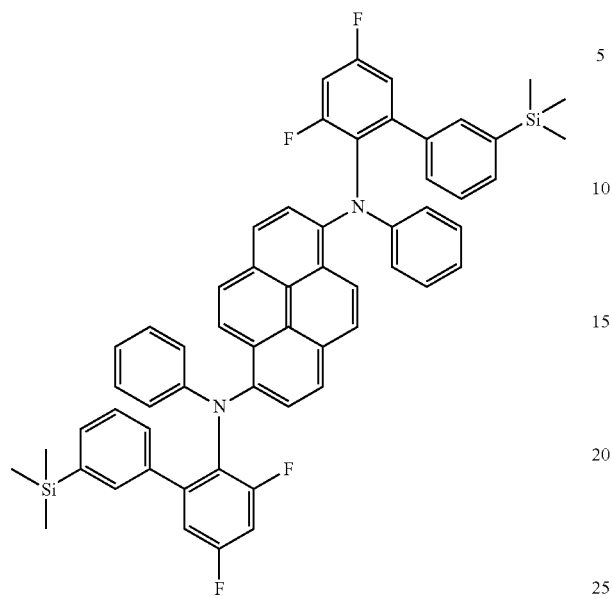
A-123
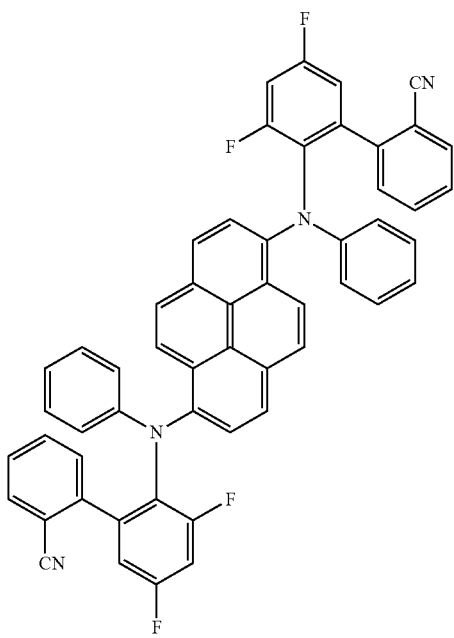
A-122
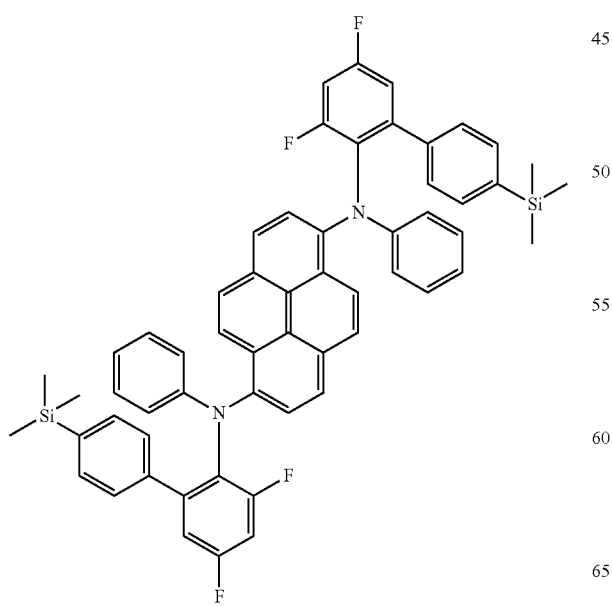
A-124
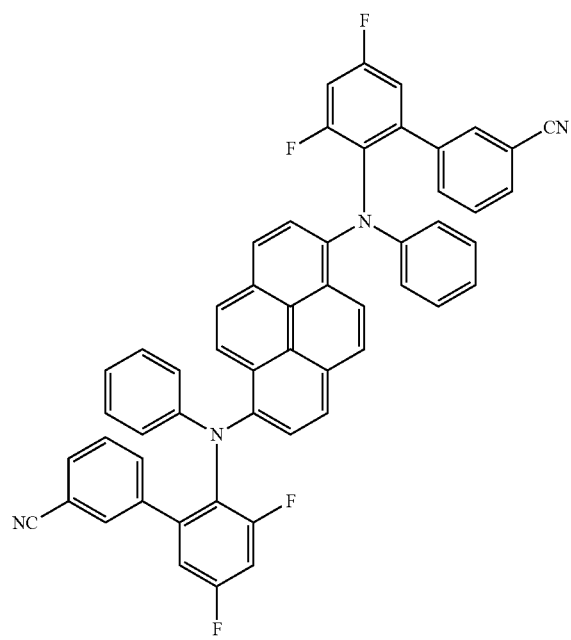

A-125
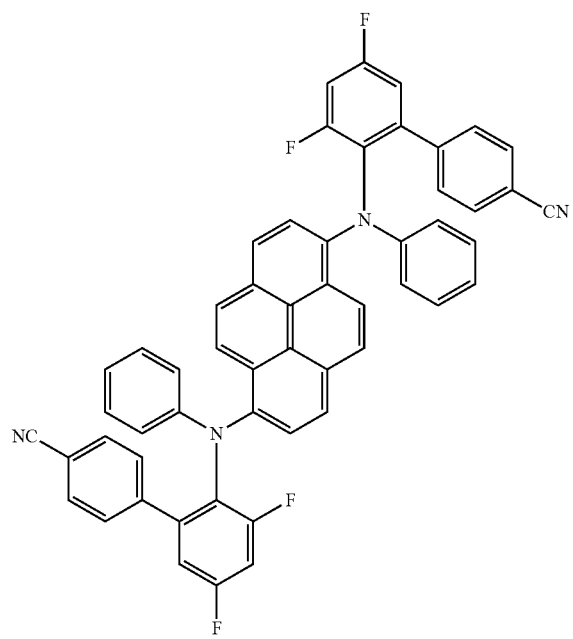
A-126
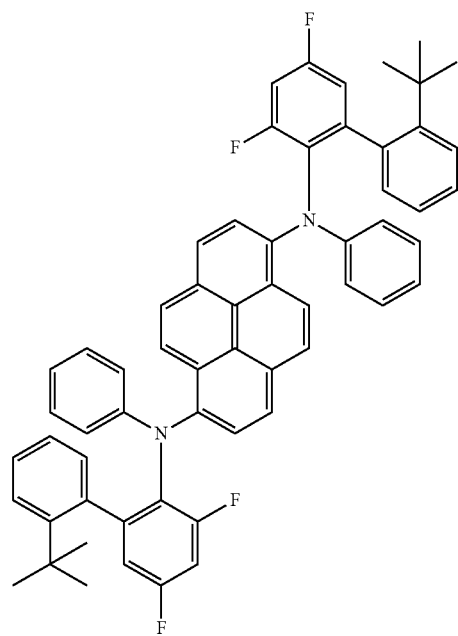
A-127
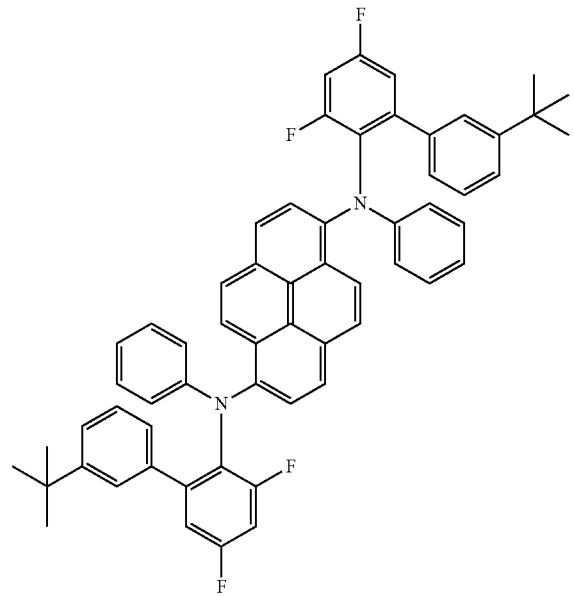
A-128
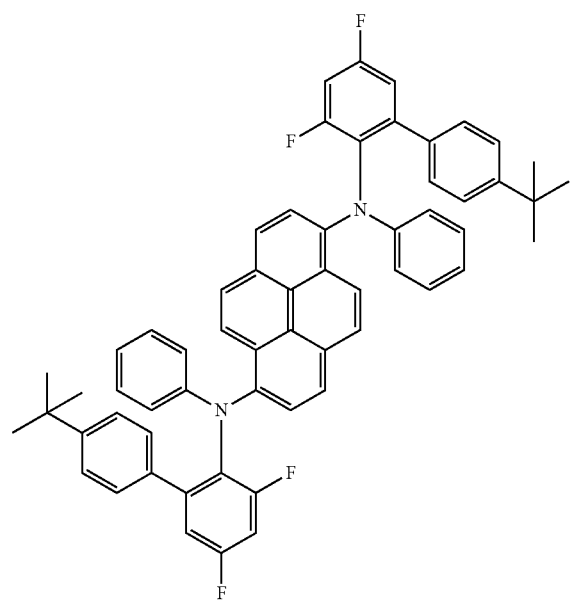

A-129
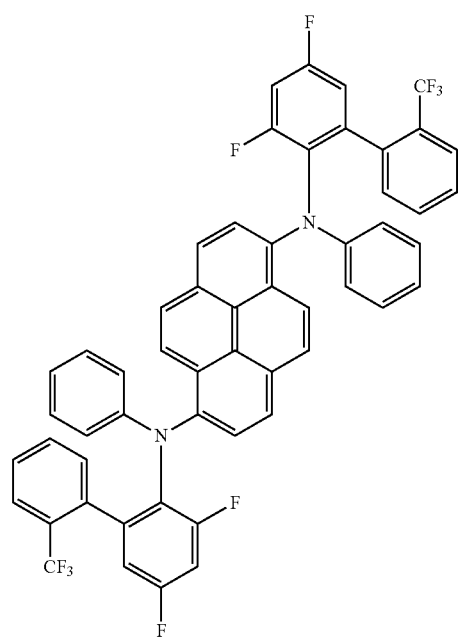
A-130
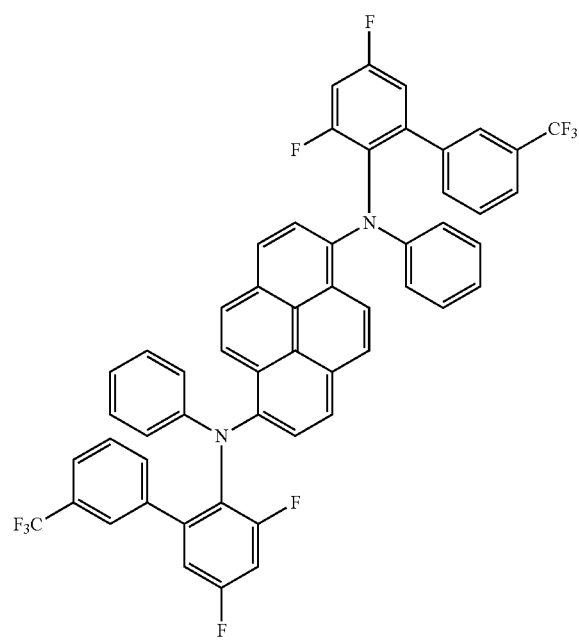
A-131
A-132
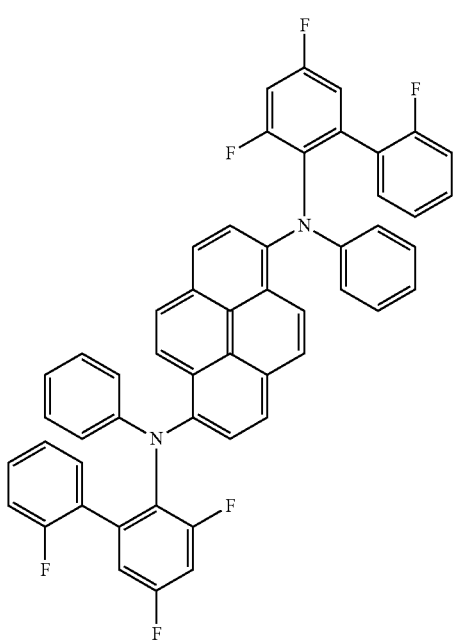

A-133
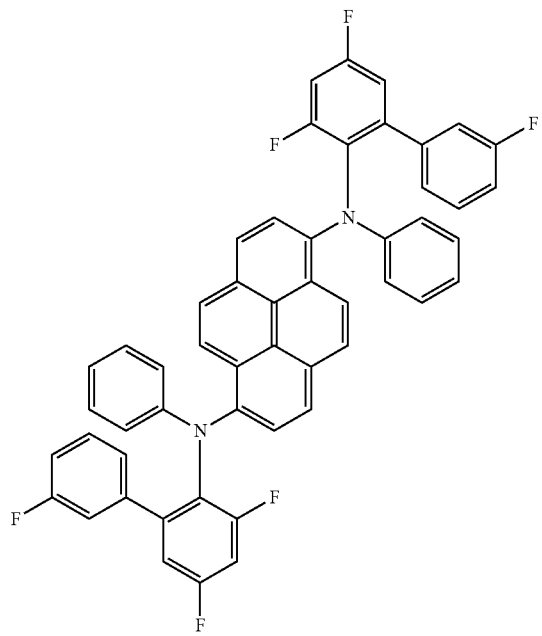
A-134
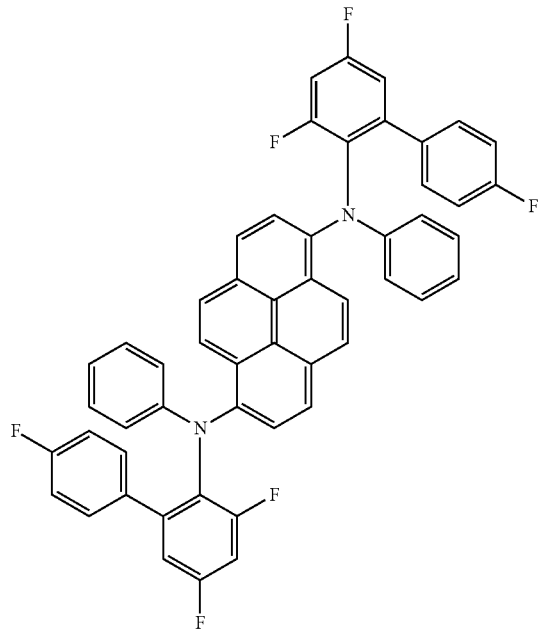
A-135
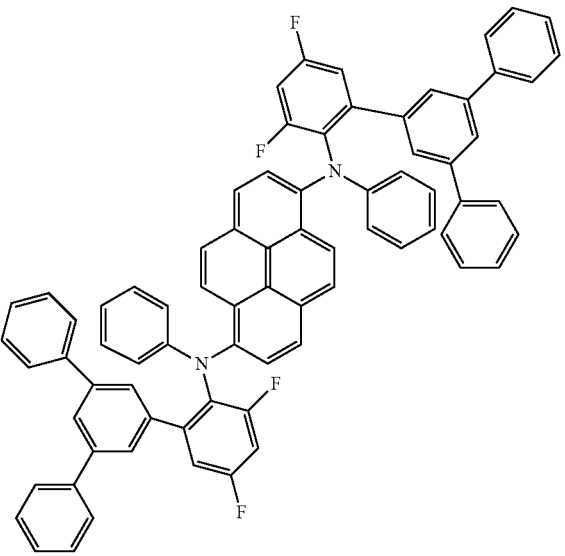
A-136
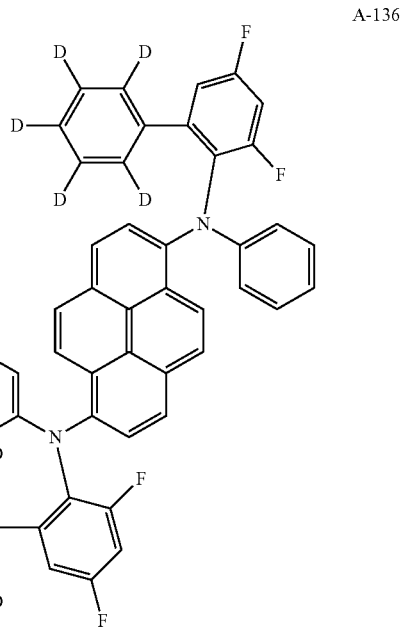

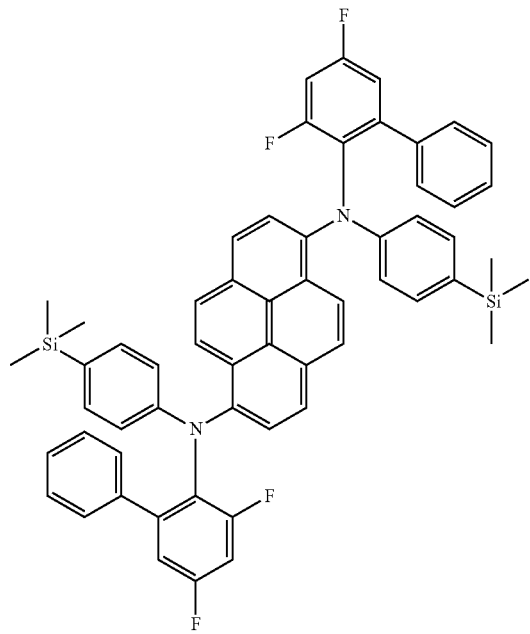
A-137
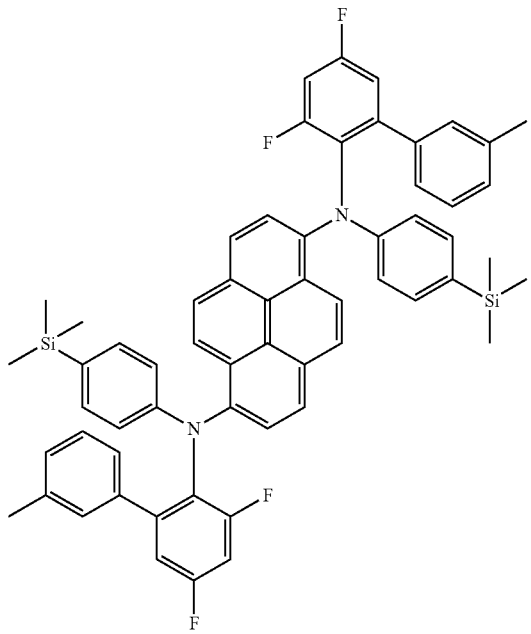
A-139
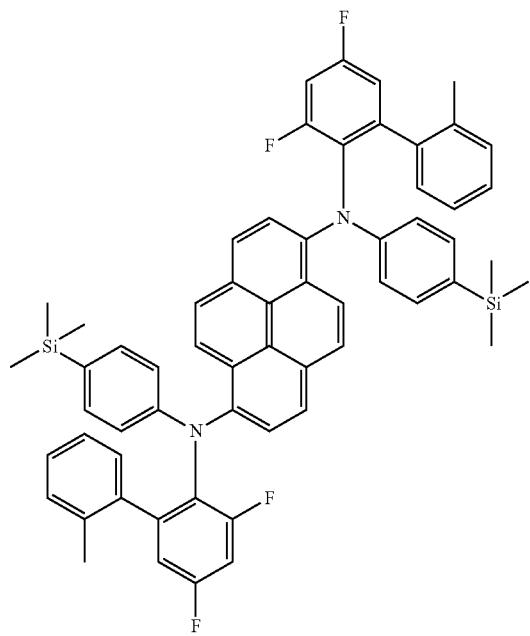
A-138
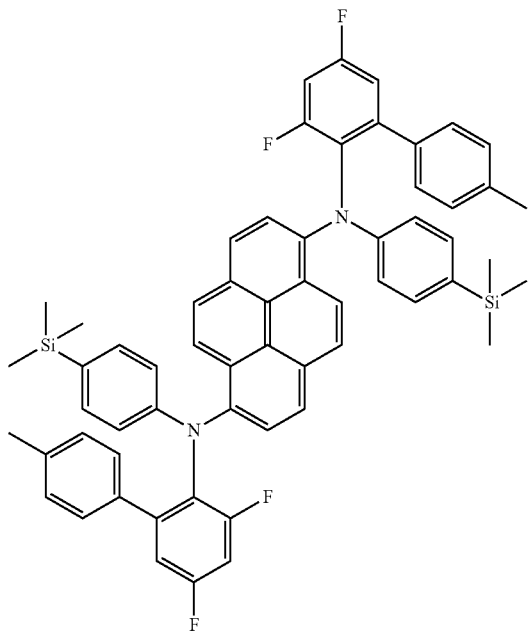
A-140

-continued
A-141
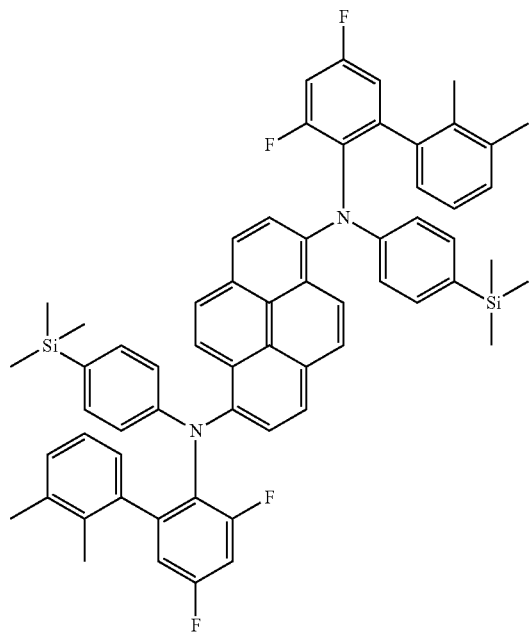
A-143
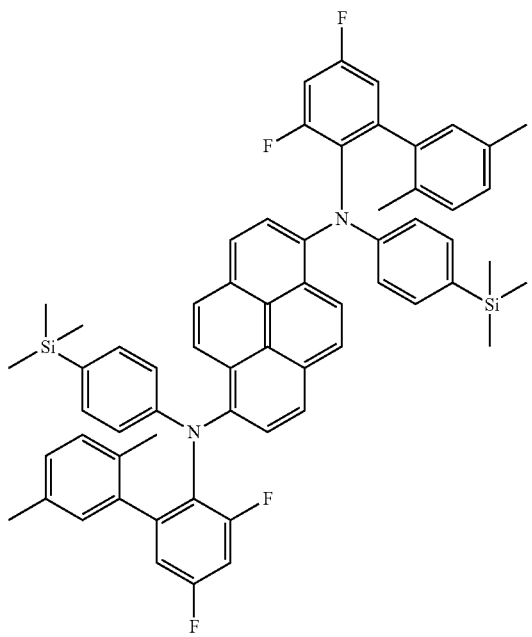
A-142
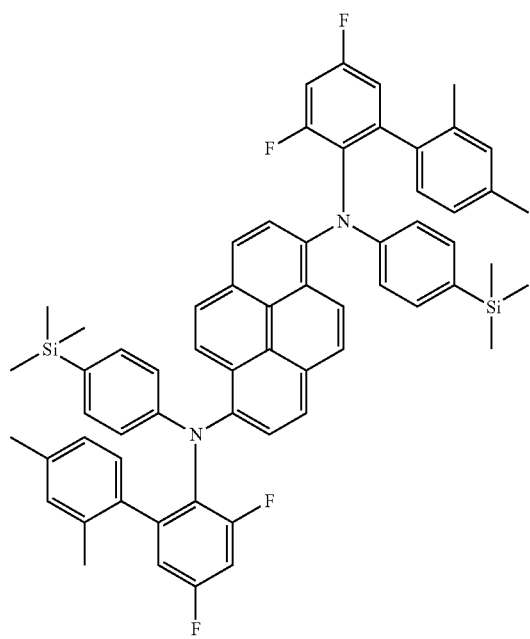
A-144
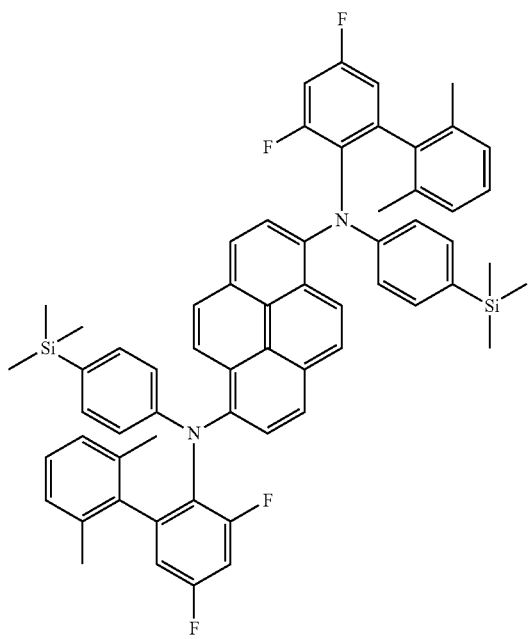

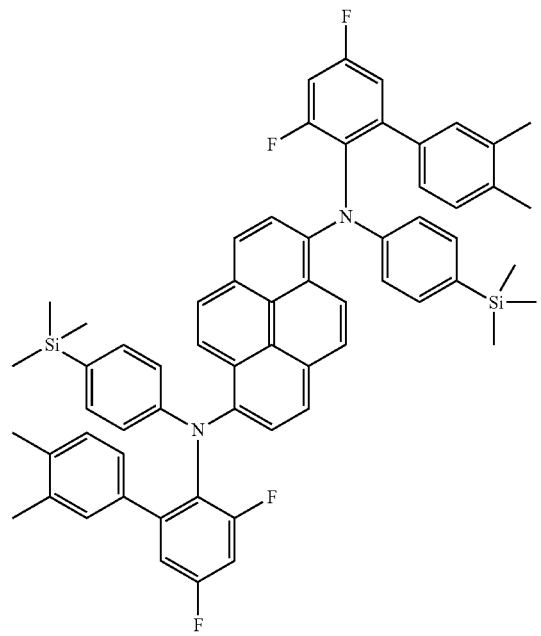
A-145
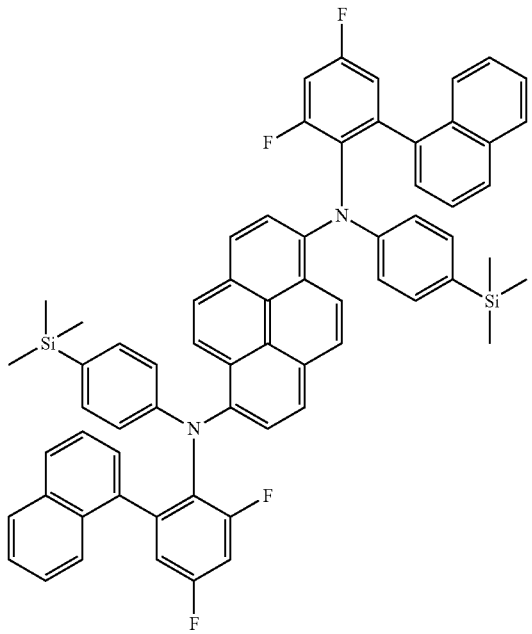
A-147
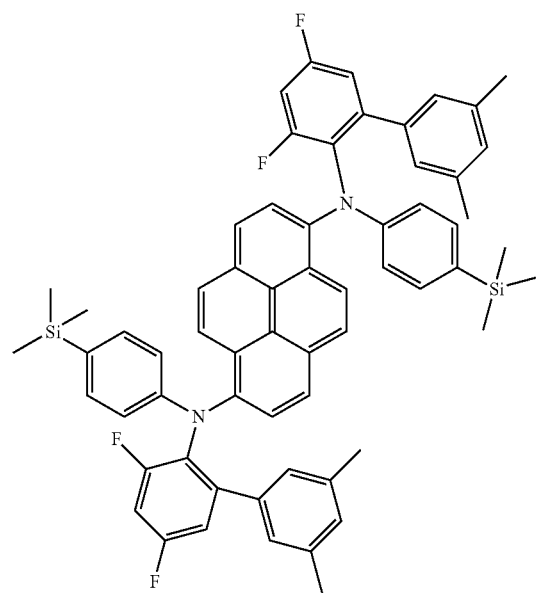
A-146
A-148

A-149
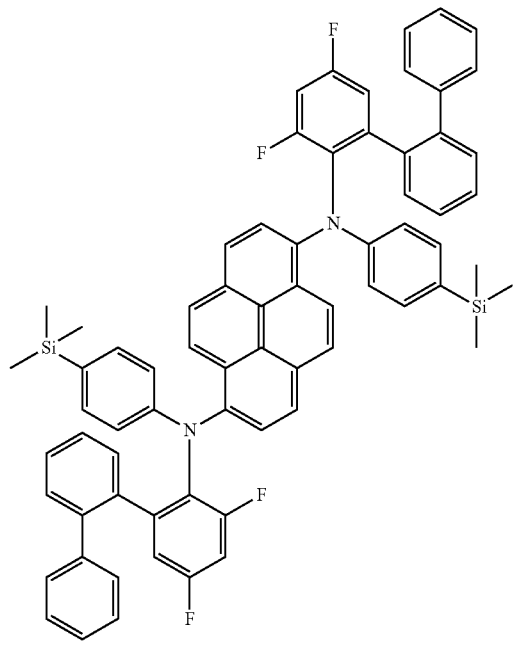
A-151
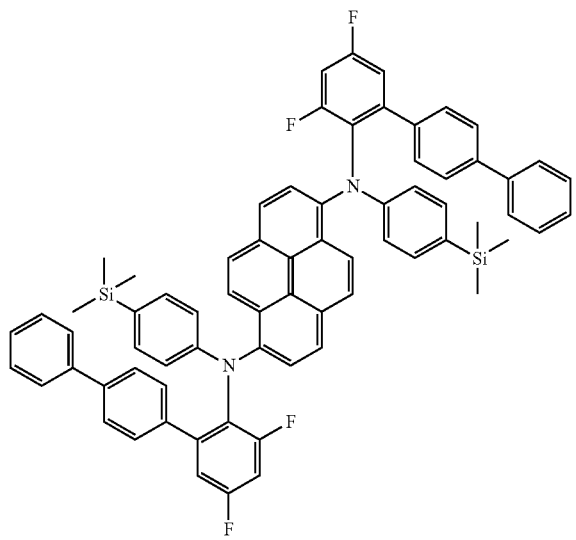
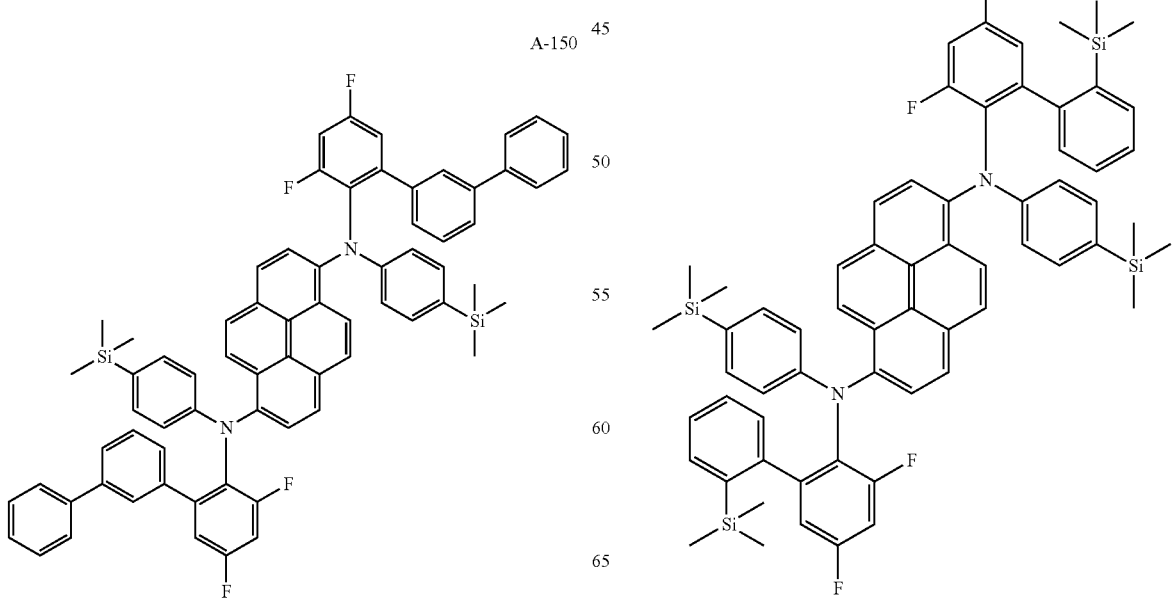
A-150
A-152

A-153
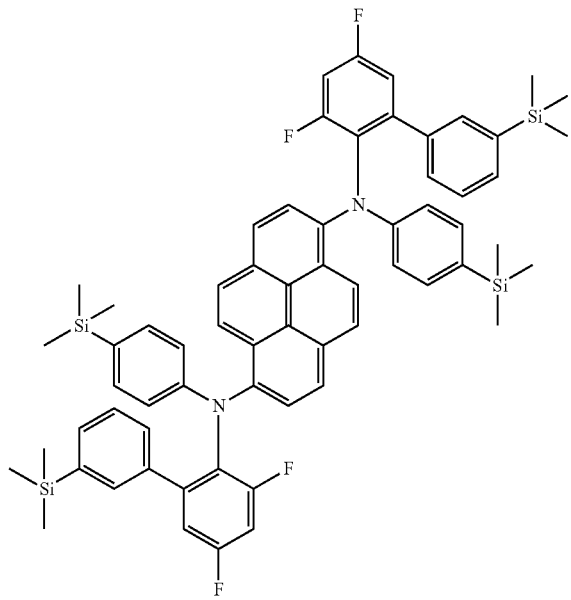
A-154
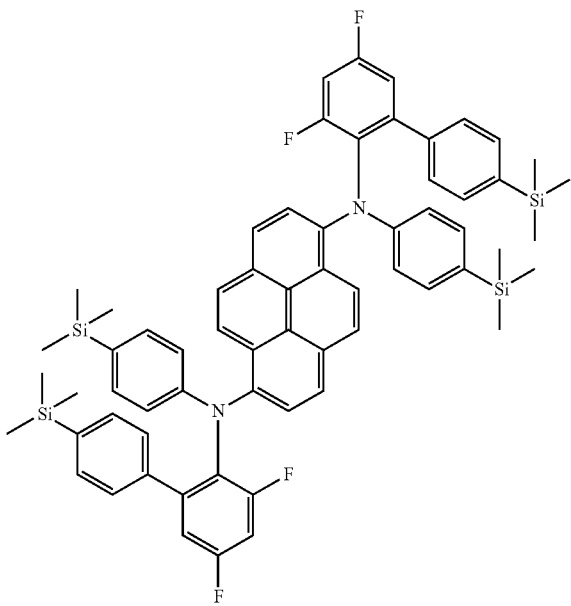
A-155
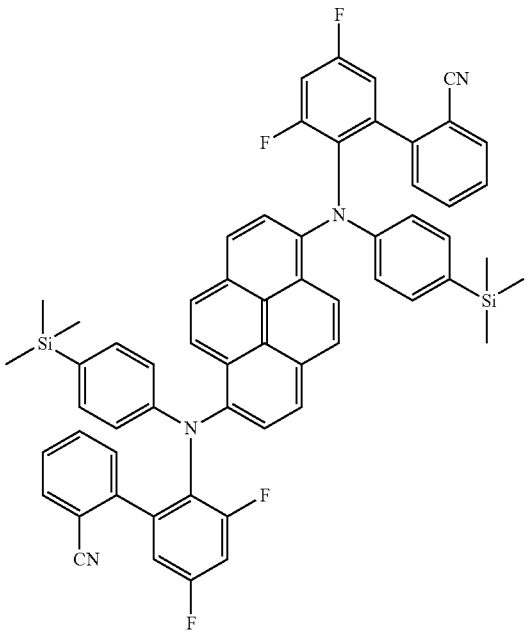
A-156
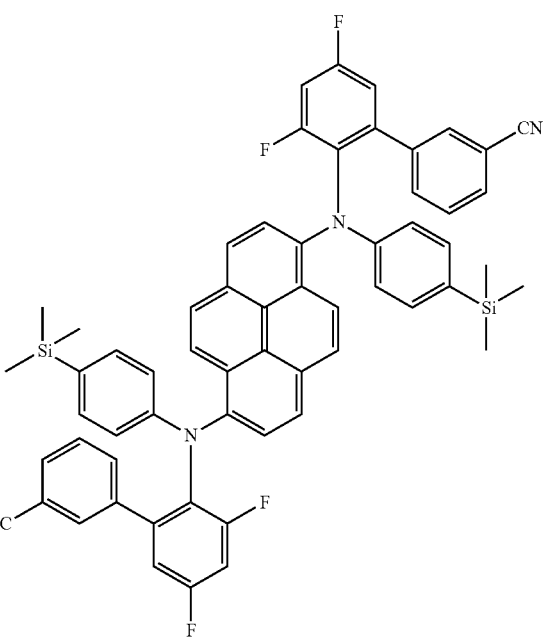

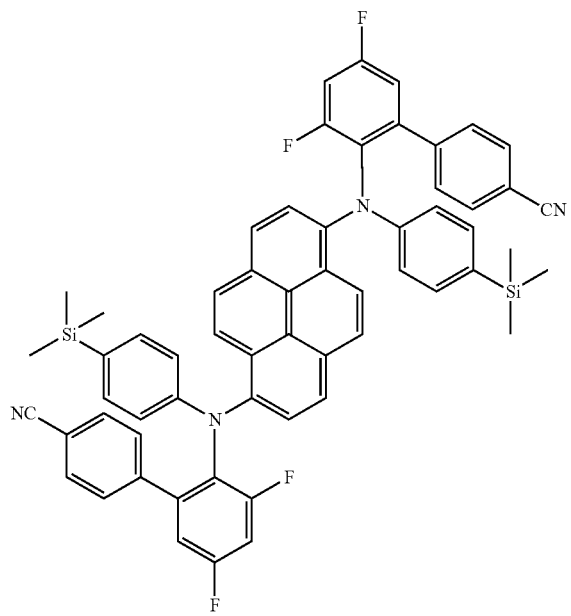
A-157
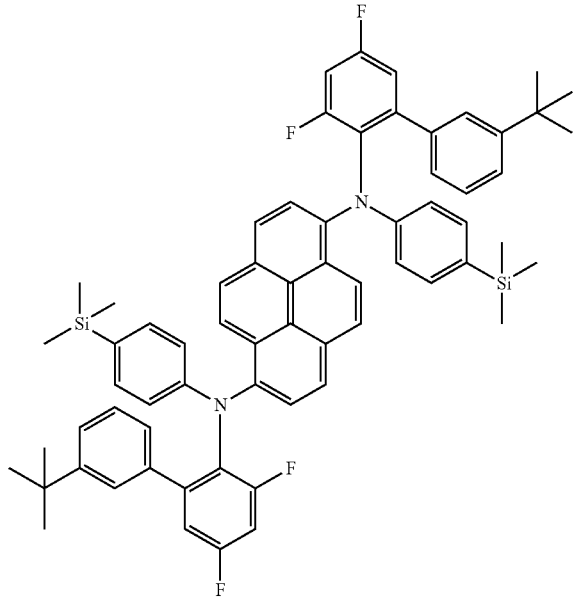
A-159
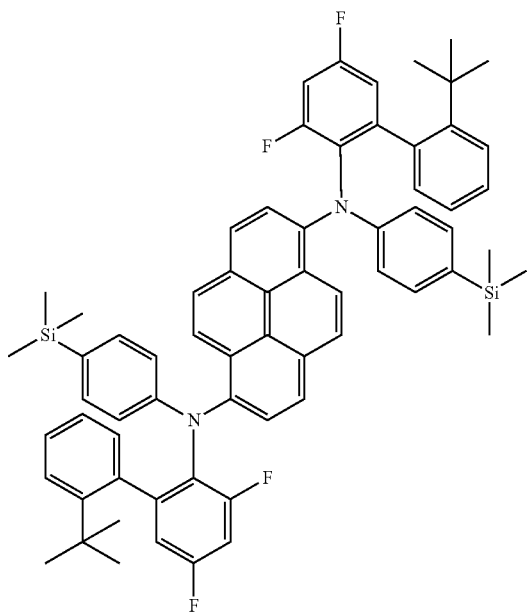
A-158
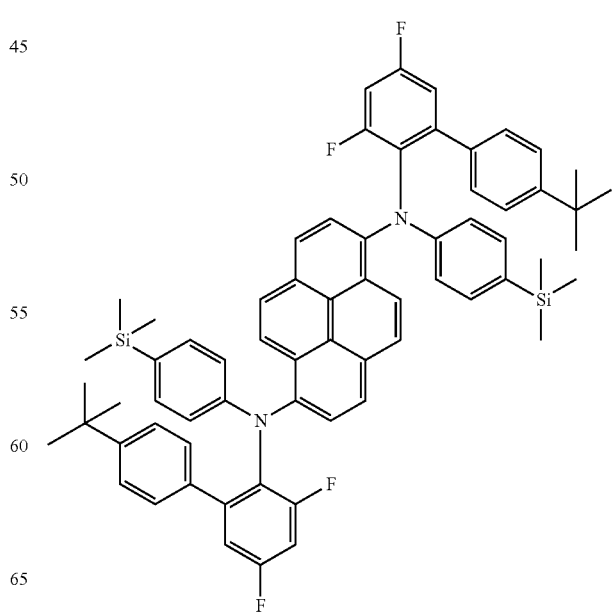
A-160

A-161
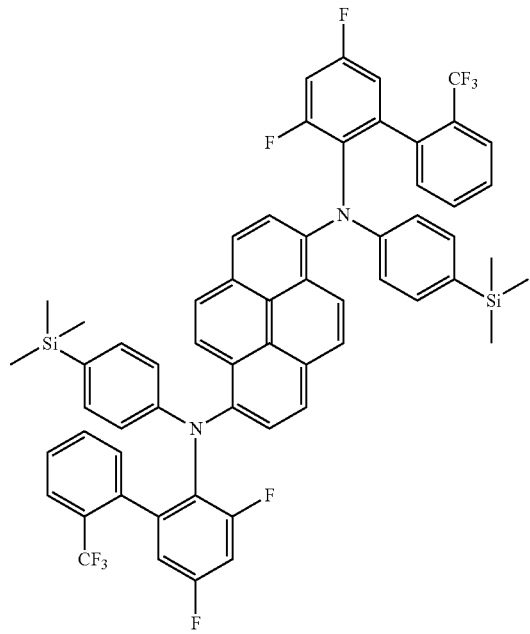
A-163
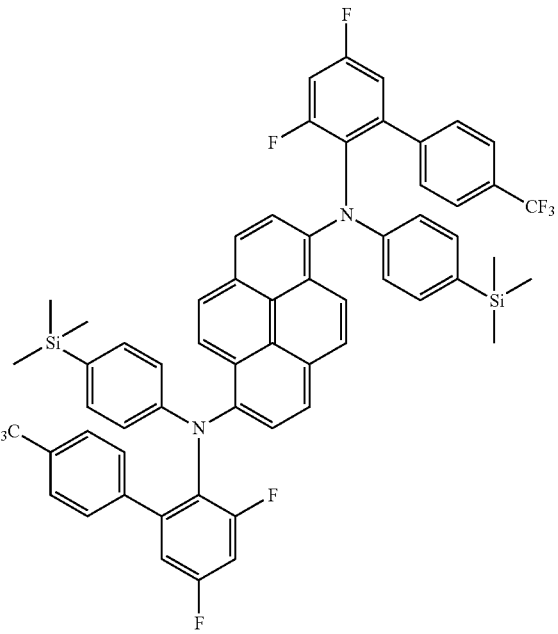
A-162
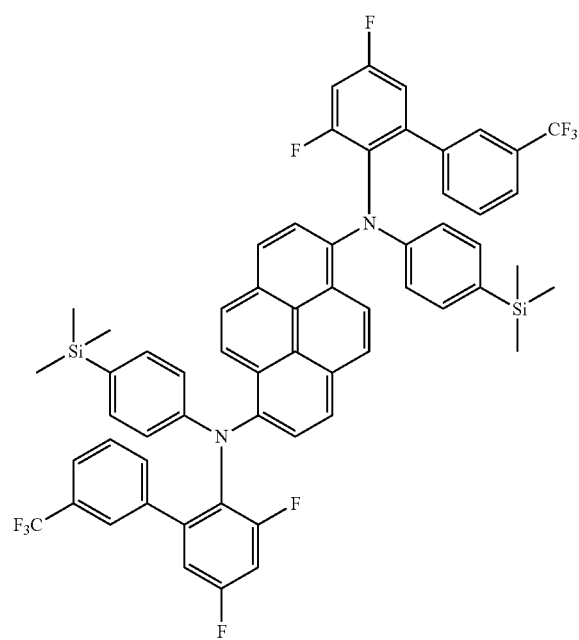
A-164
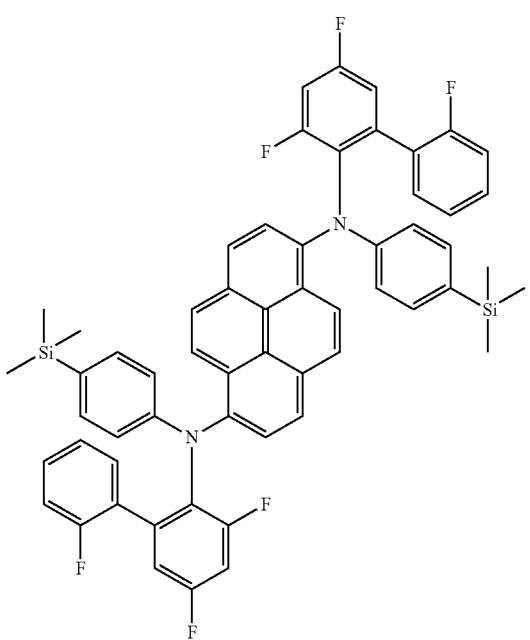

-continued
A-165
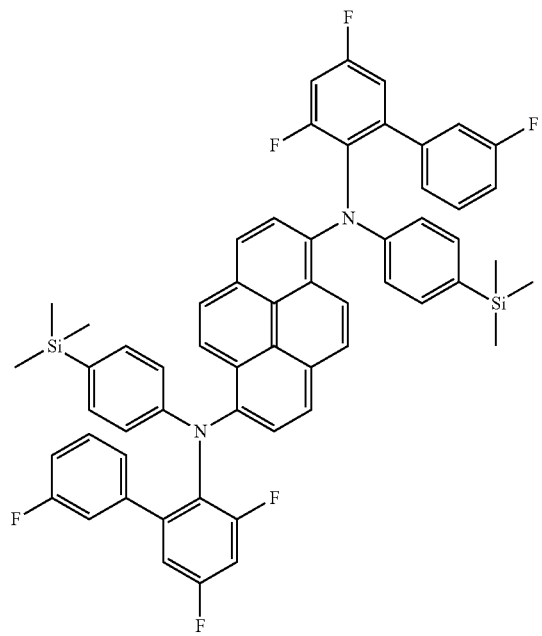
A-166
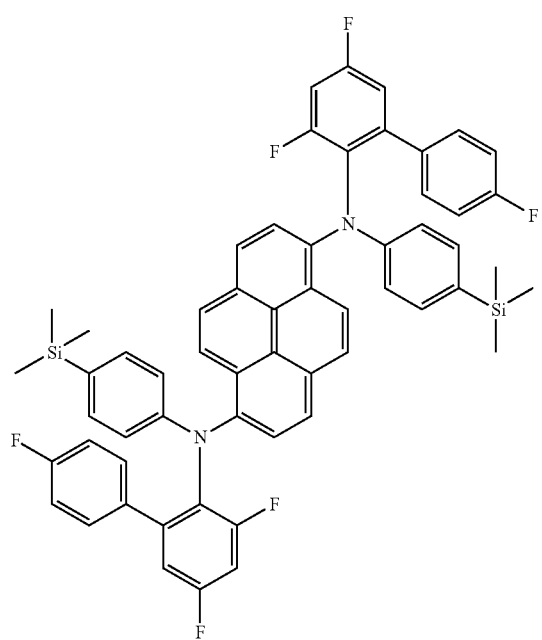
-continued
A-167
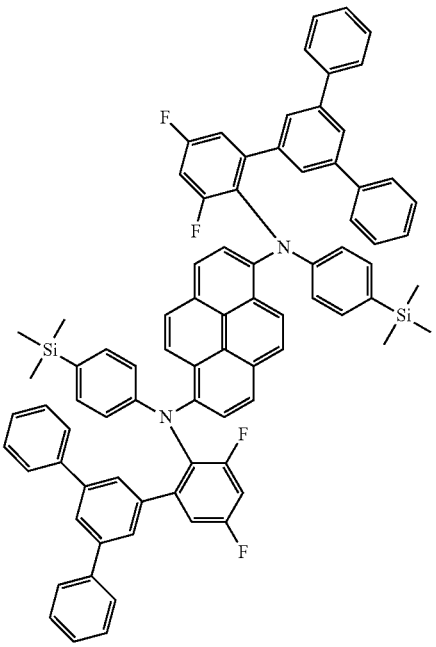
A-168
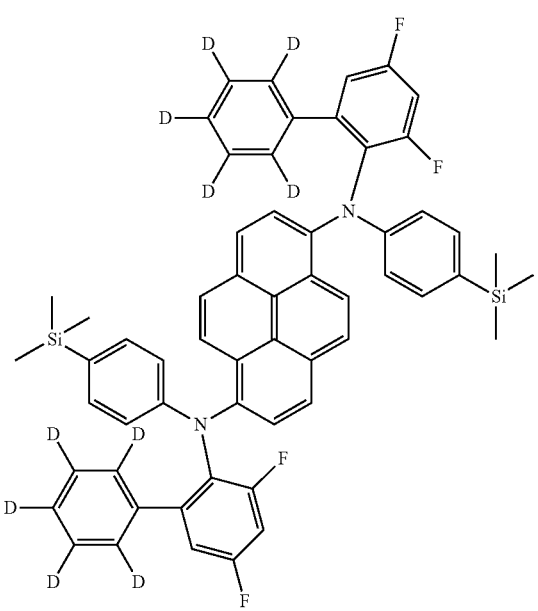

-continued
A-169
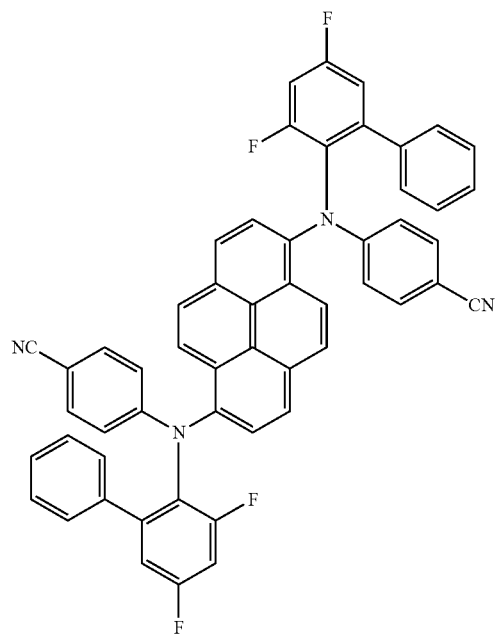
A-170
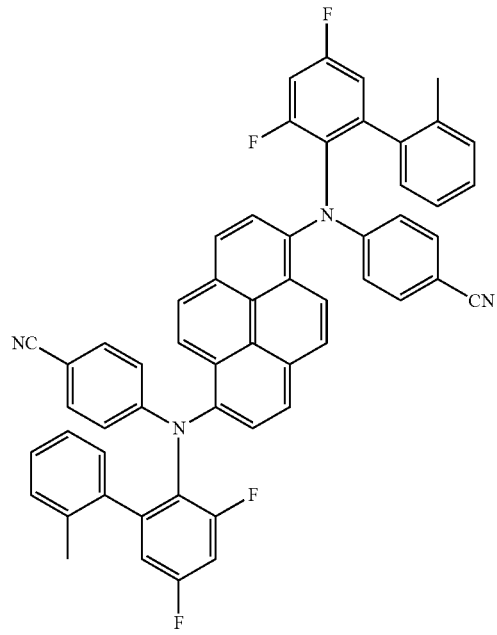
-continued
A-171
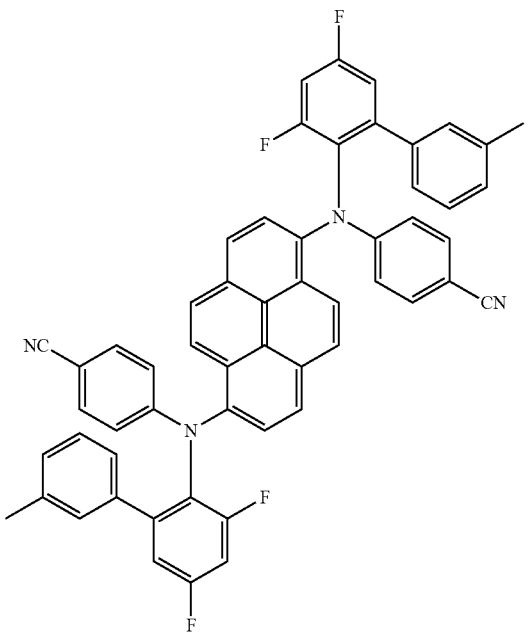
A-172
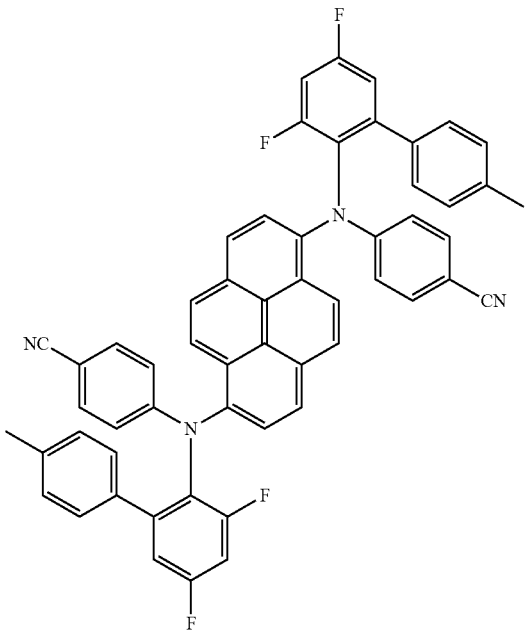

A-173
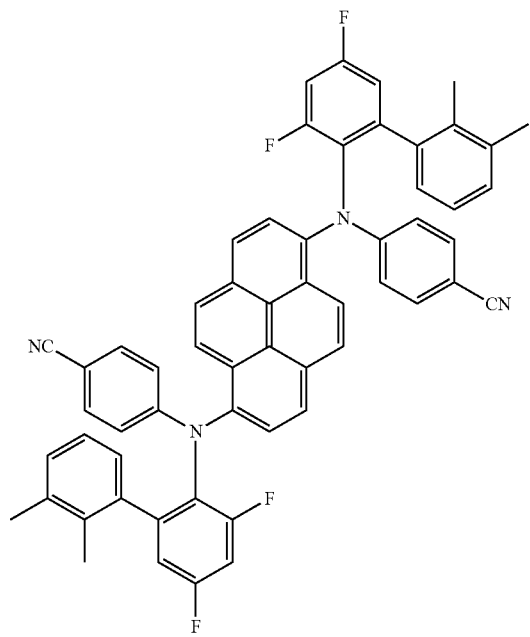
A-174
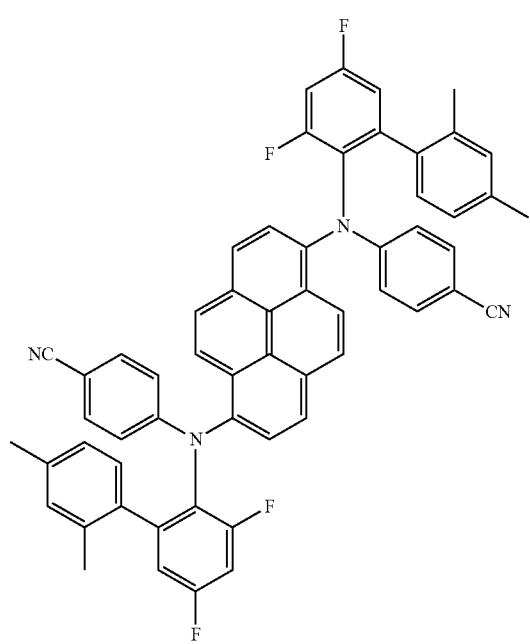
A-175
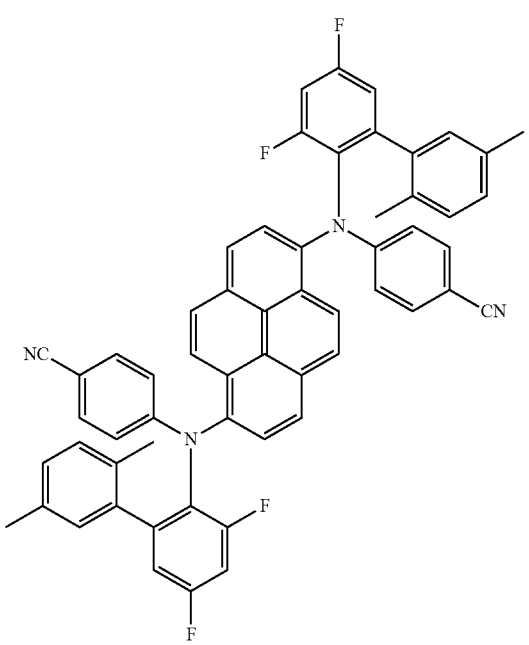
A-176
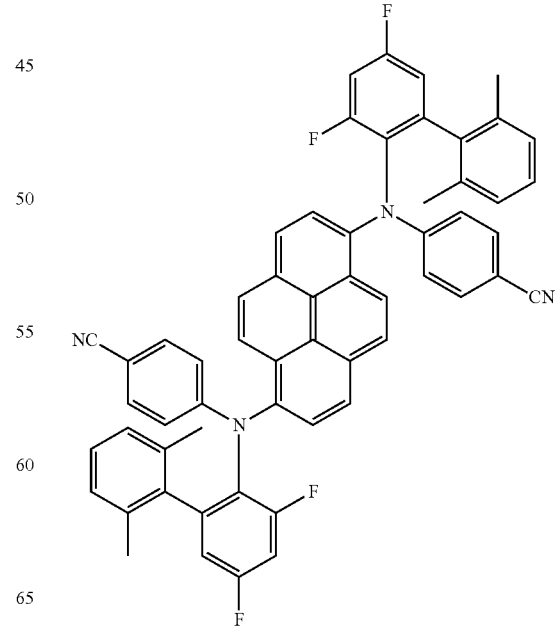

-continued
A-177
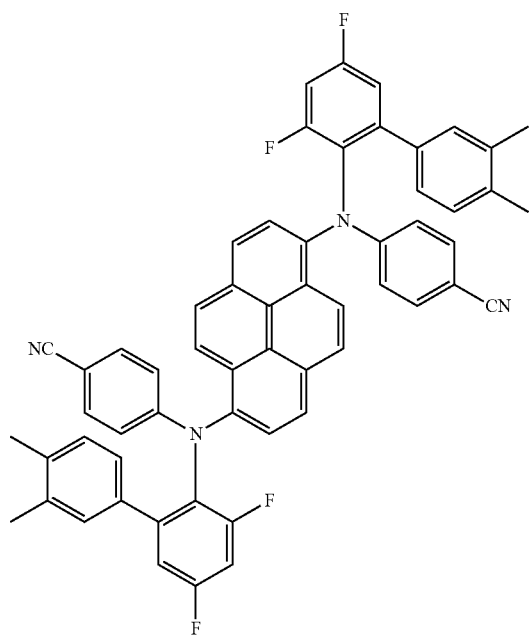
A-178
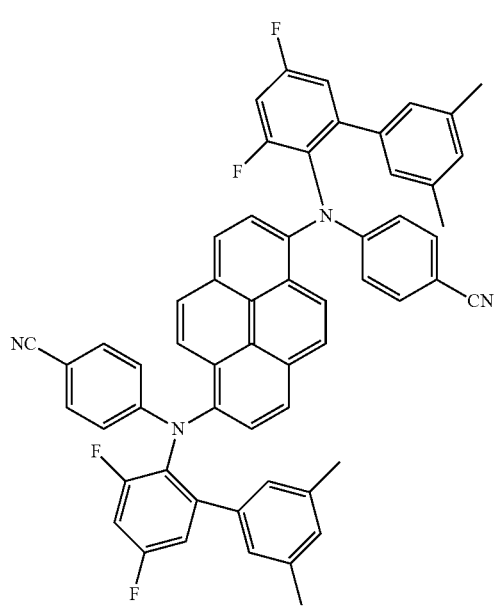
-continued
A-179
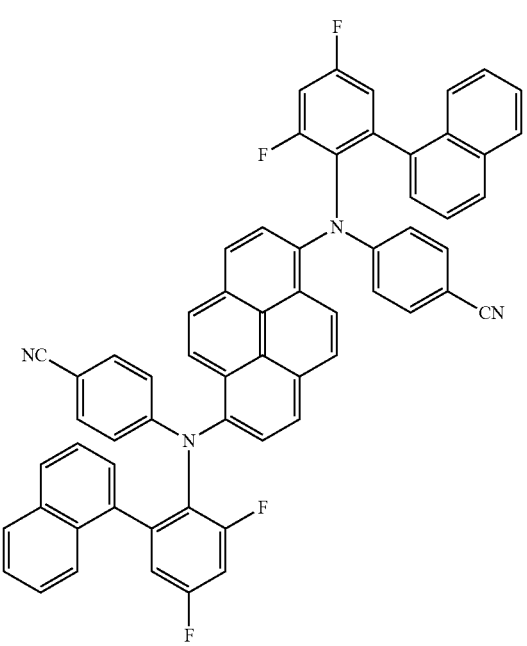
A-180
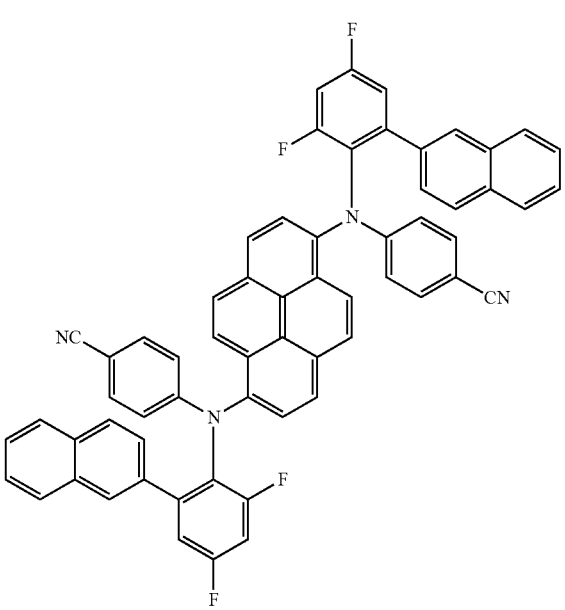

A-181
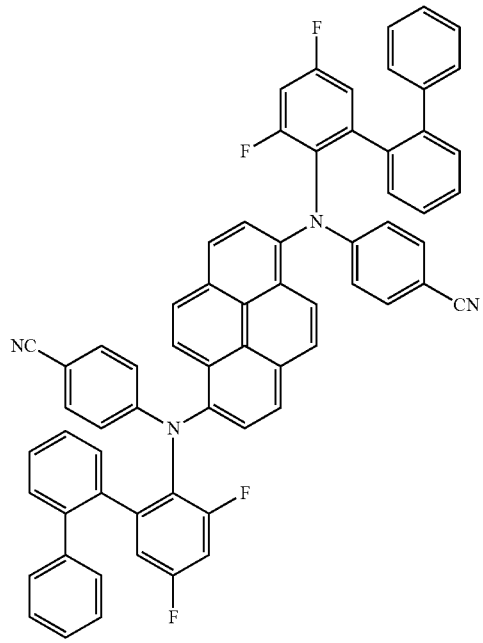
A-183
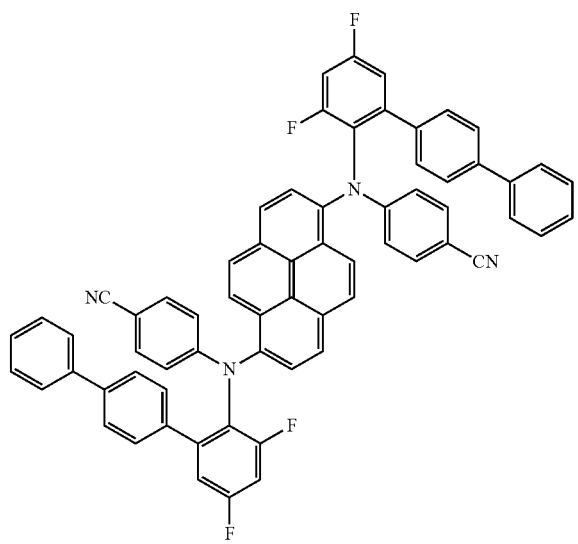
A-182
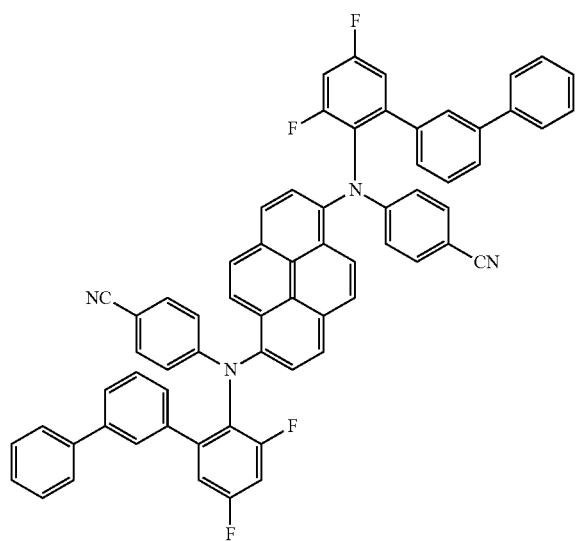
A-184
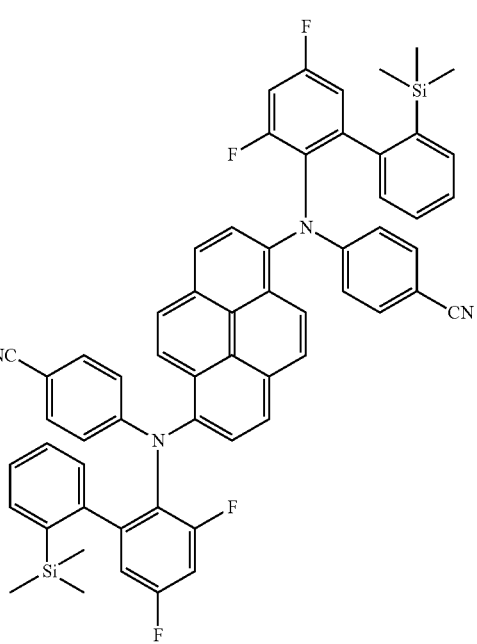

A-185
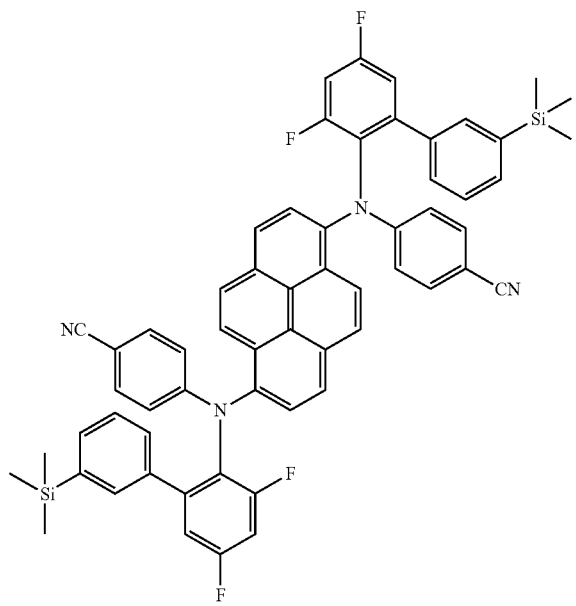
A-186
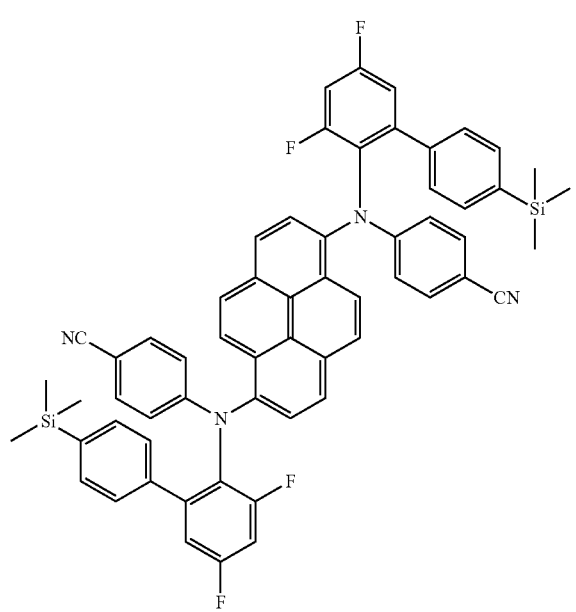
A-187
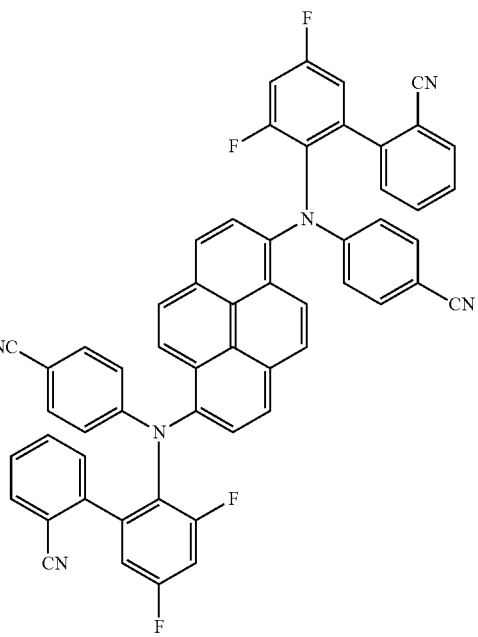
A-188
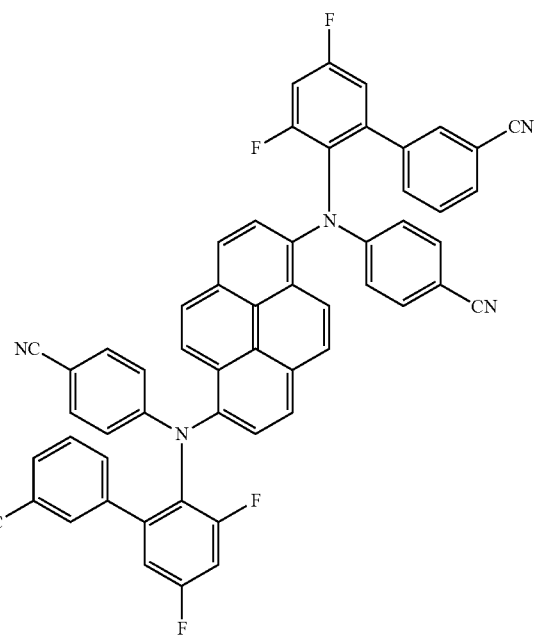

-continued
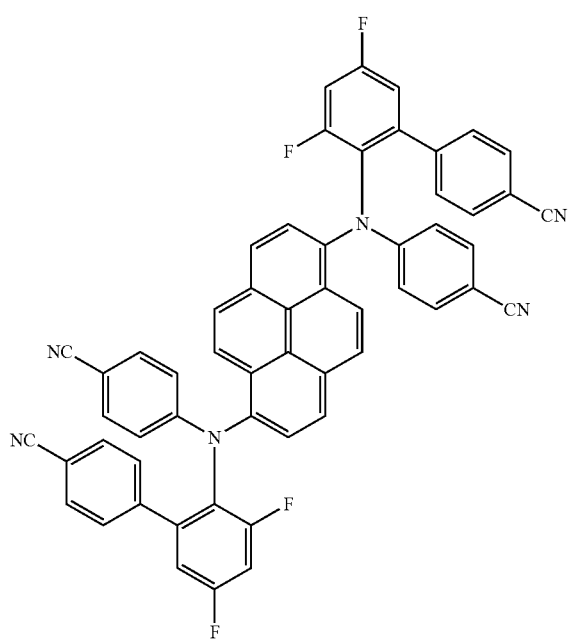
A-189
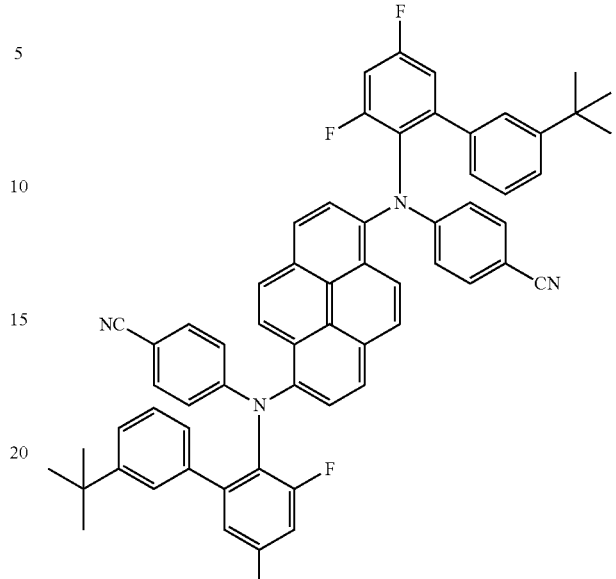
A-191
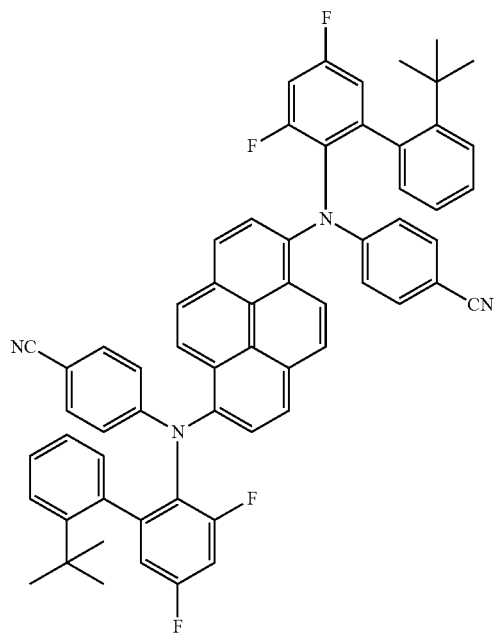
A-190
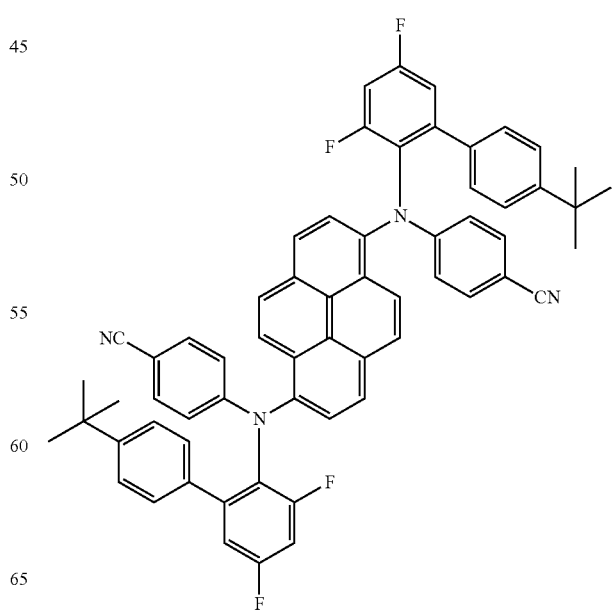
A-192

A-193
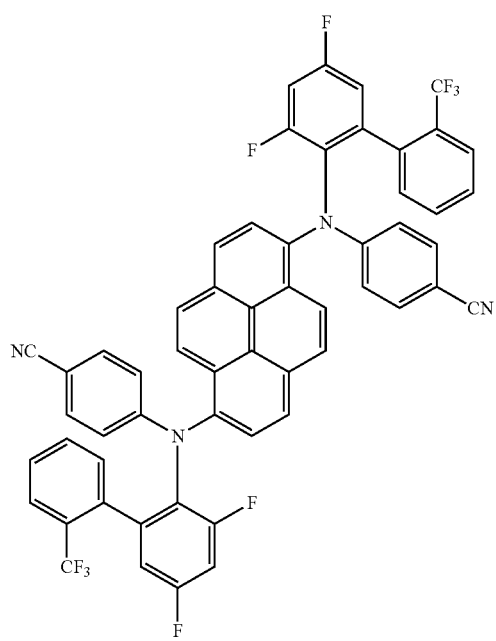
A-195
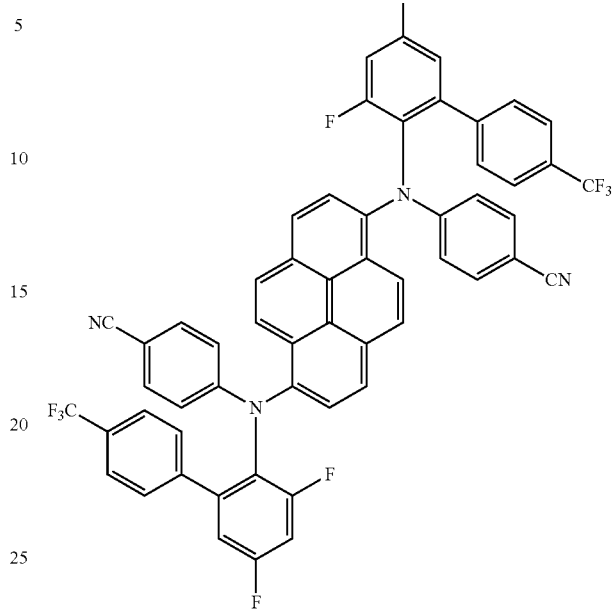
A-194
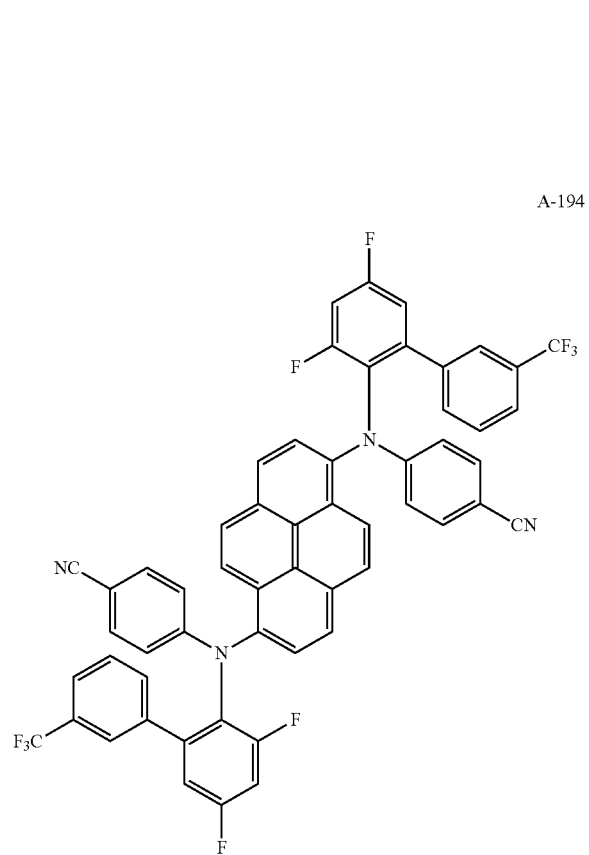
A-196
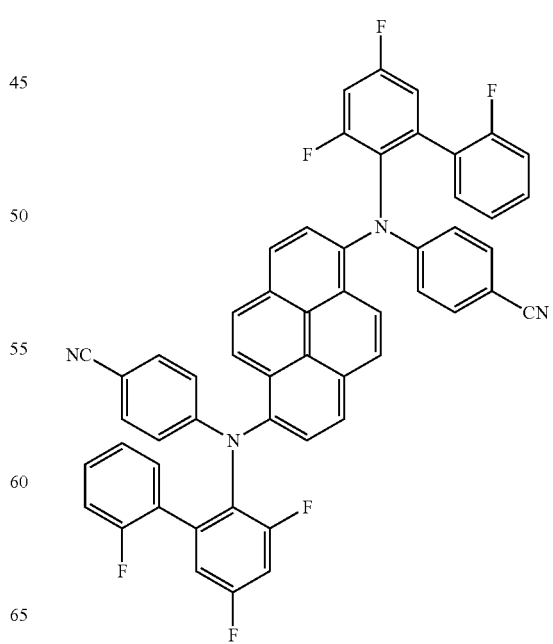

A-197
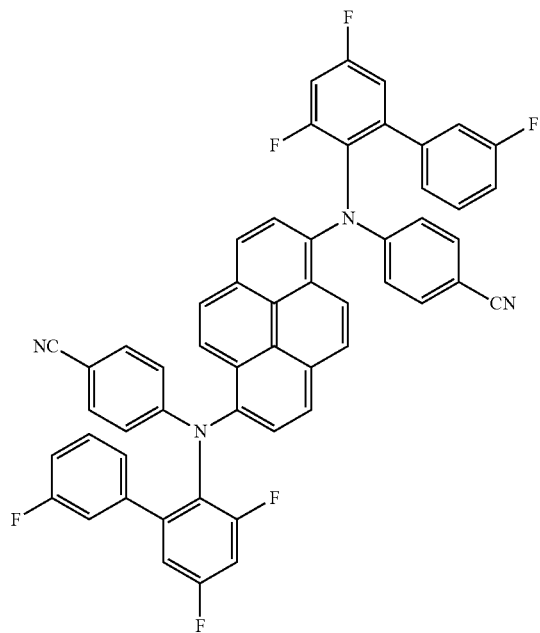
A-198
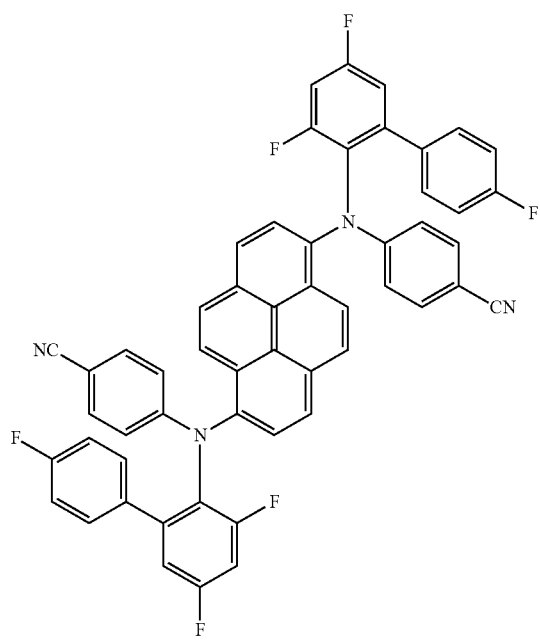
A-199
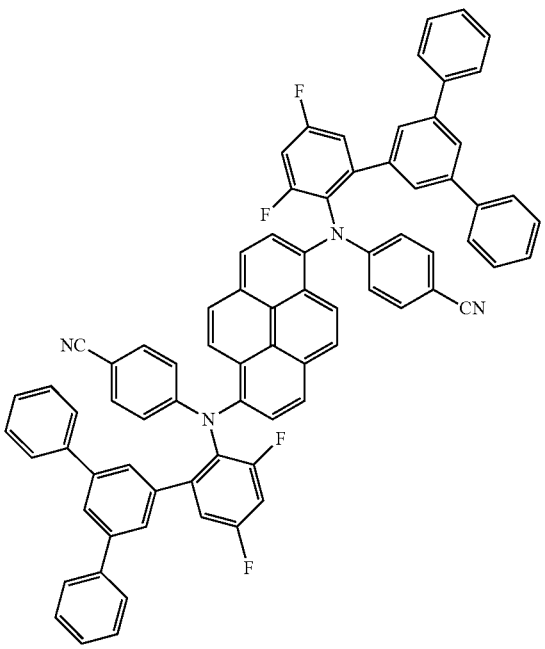
A-200
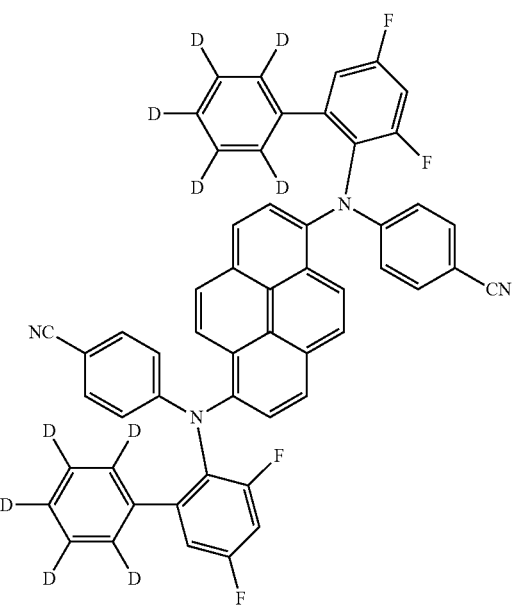

A-201
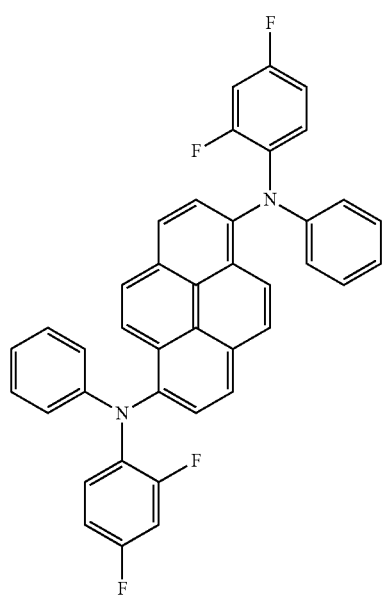
A-203
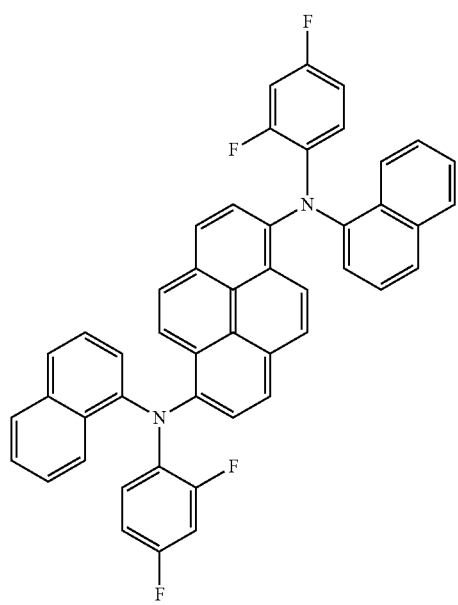
A-202
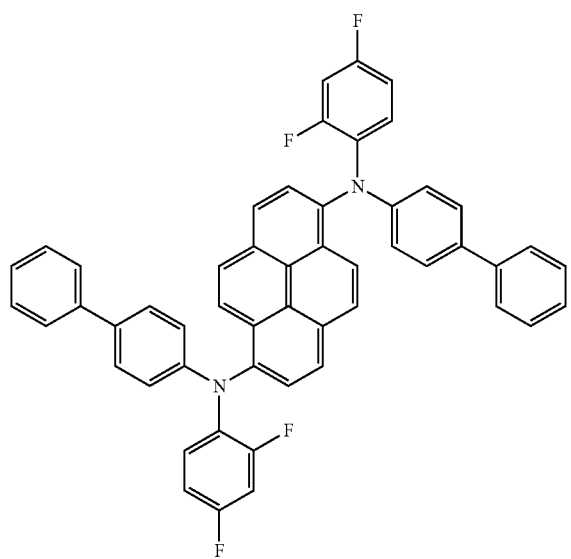
A-204
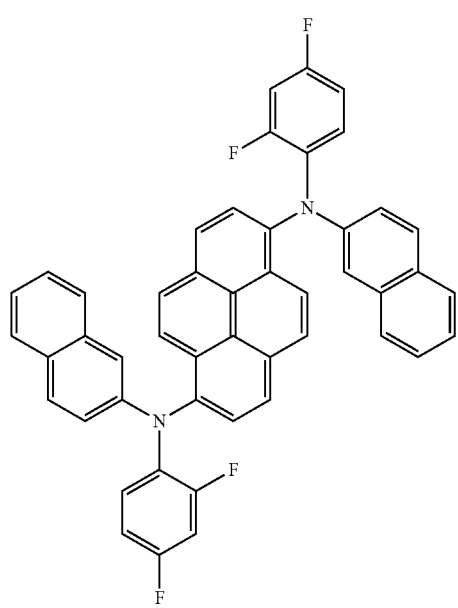

A-205
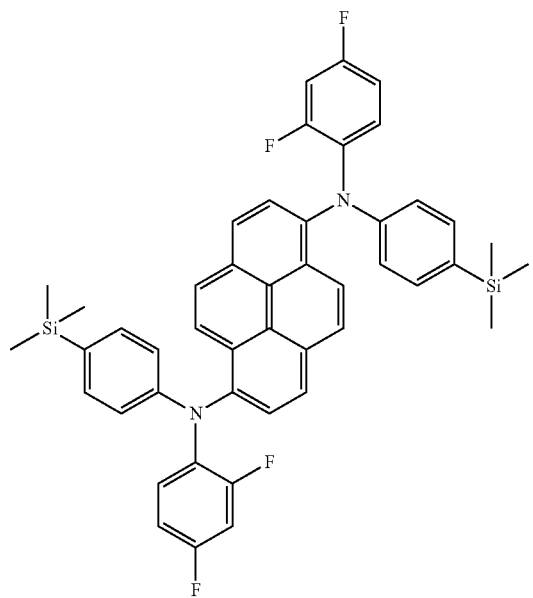
A-207
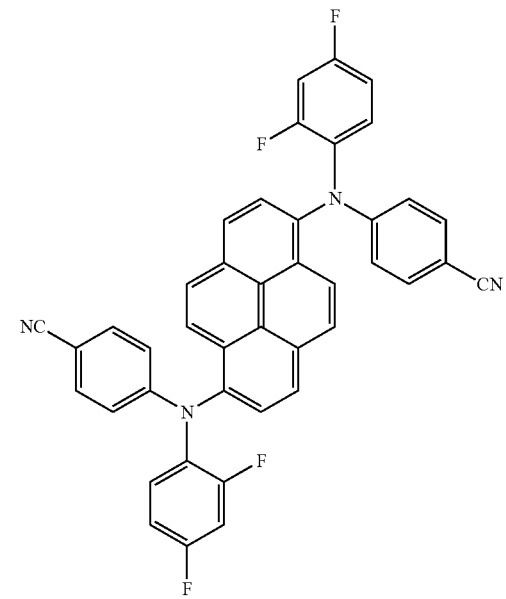
A-206
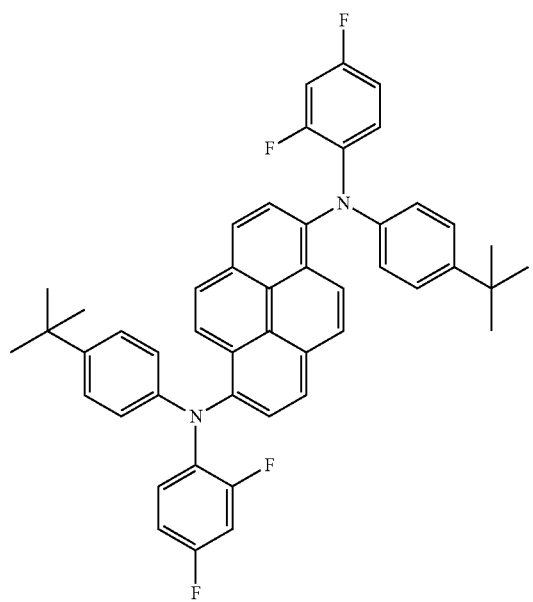
A-208
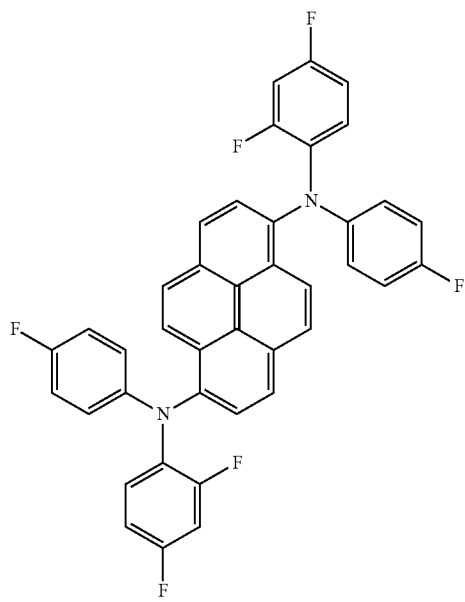

-continued
A-209
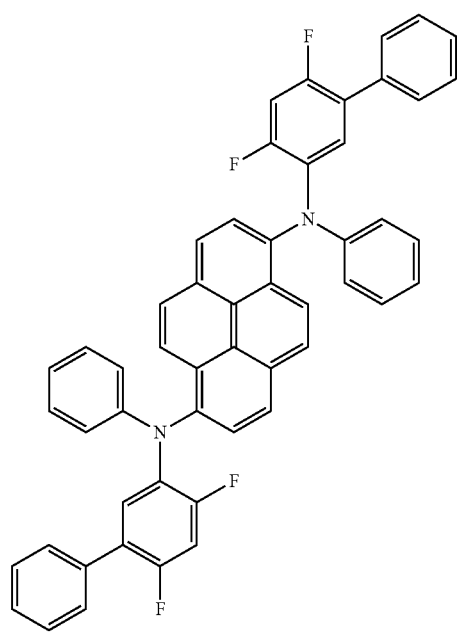
A-210
A-211
-continued
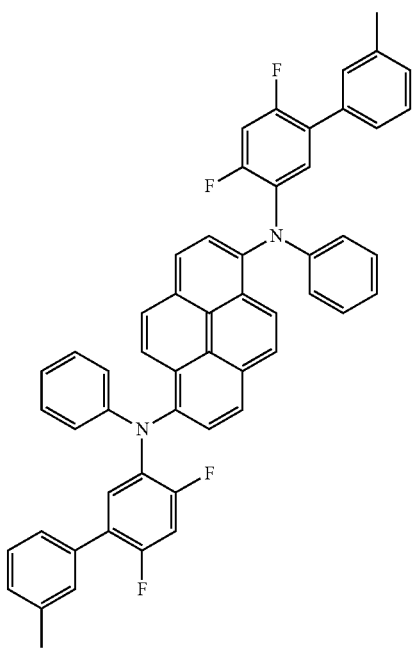
A-212

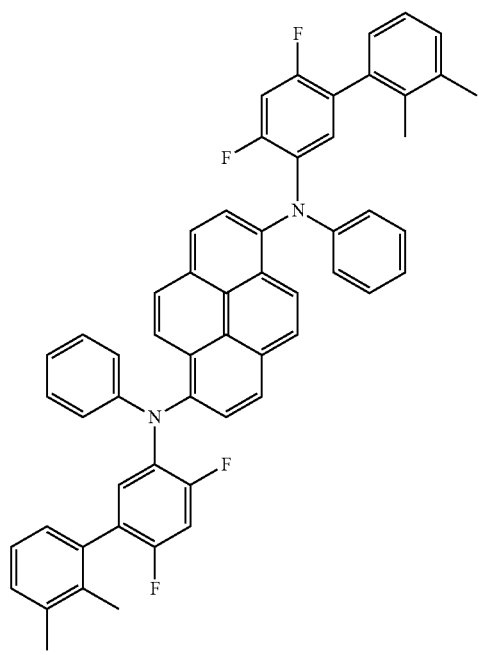
A-213
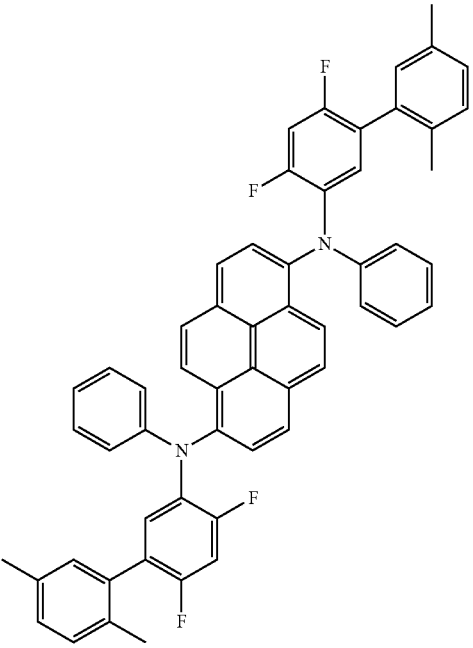
A-215
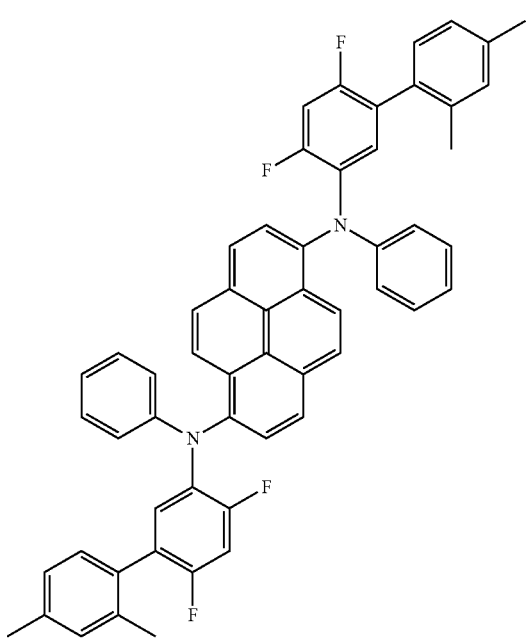
A-214
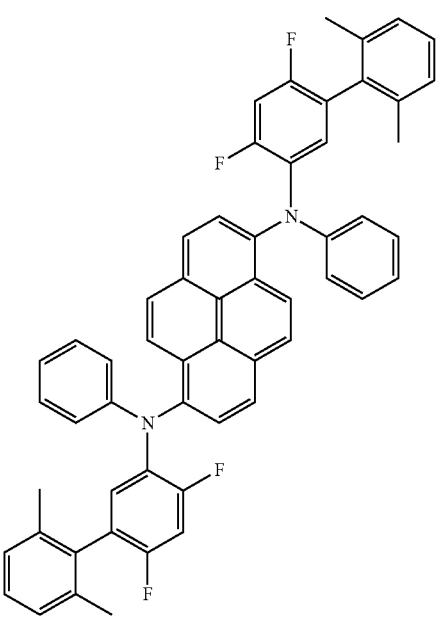
A-216

A-217
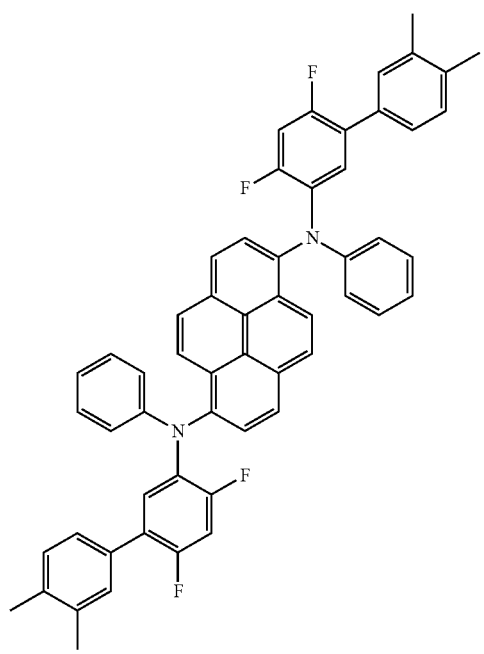
A-218
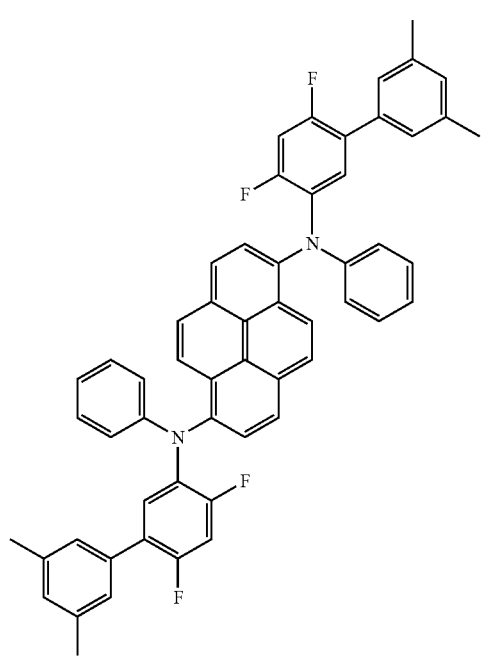
A-219
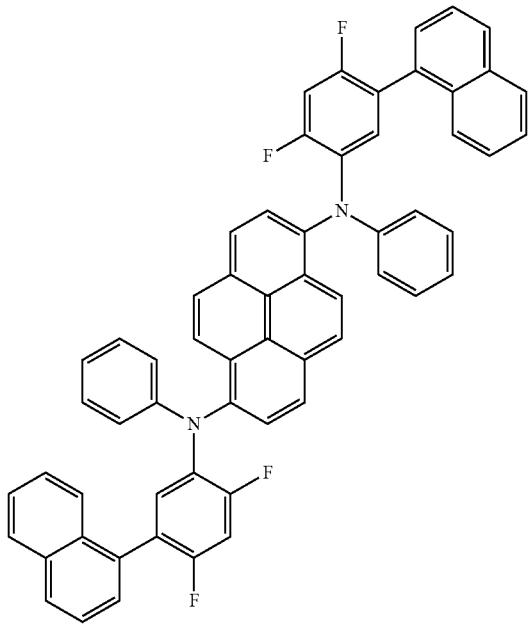
A-220
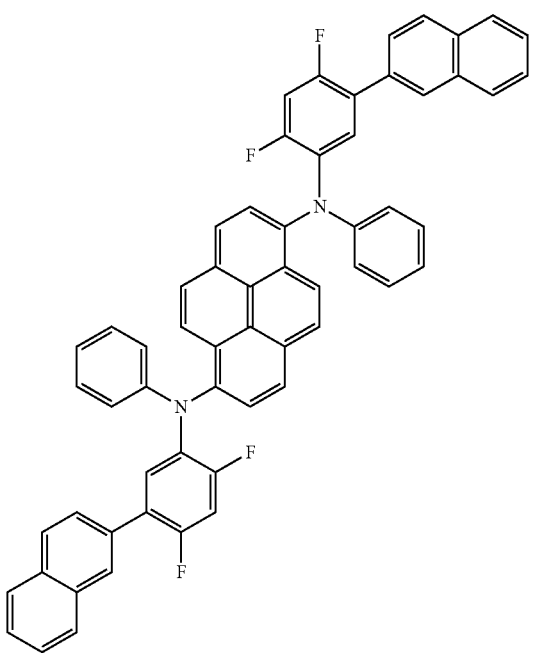

A-221
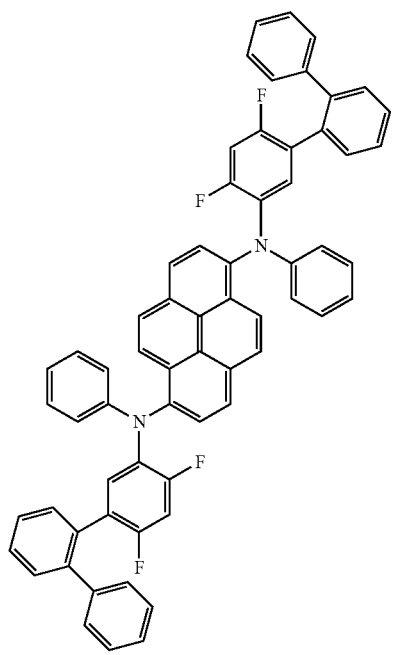
A-223
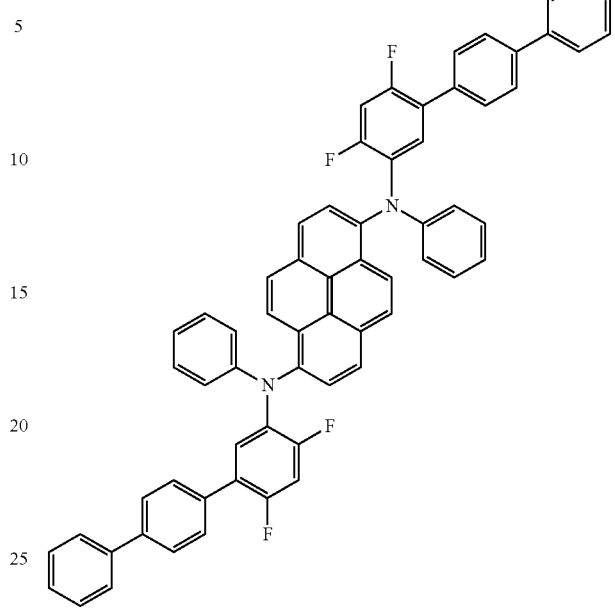
A-222
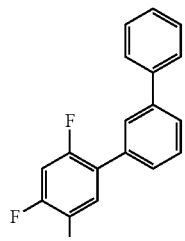
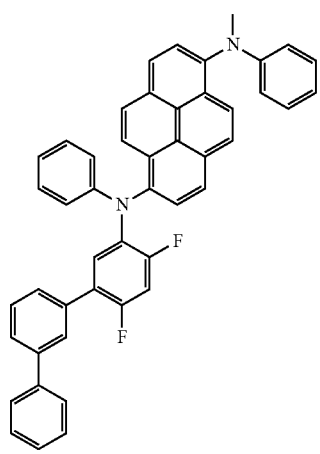
A-224
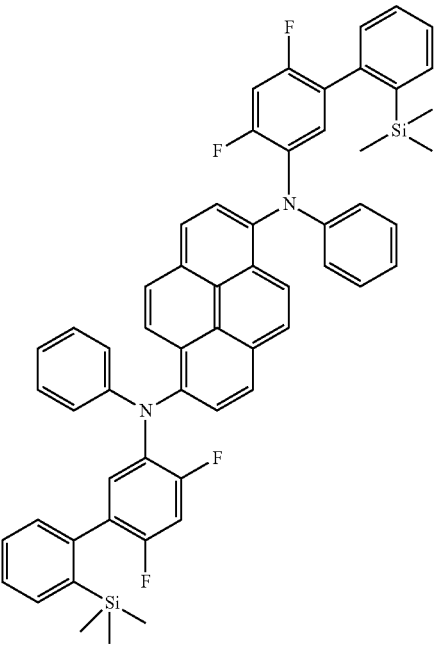

A-225
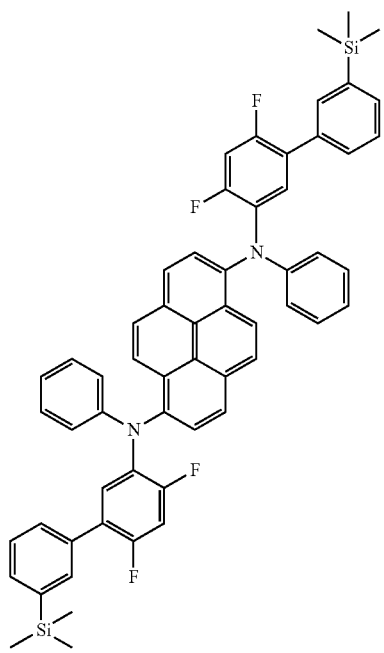
A-226
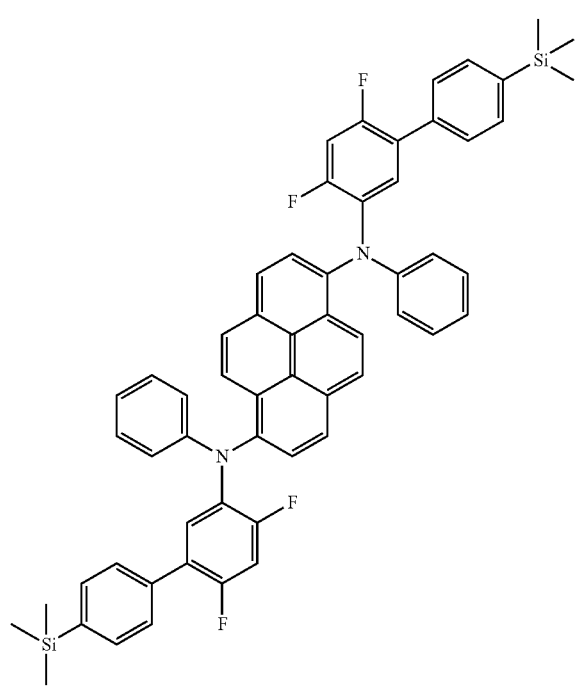
A-227
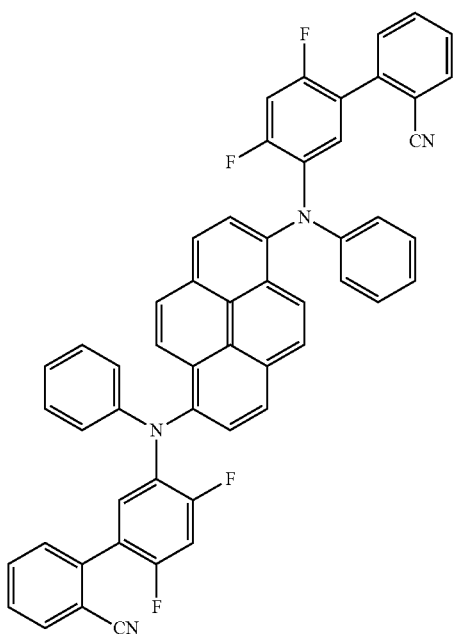
A-228

-continued
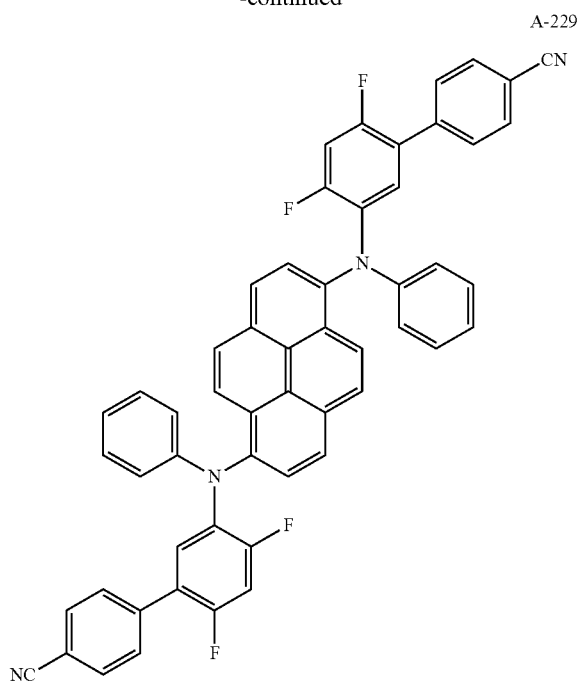
A-229
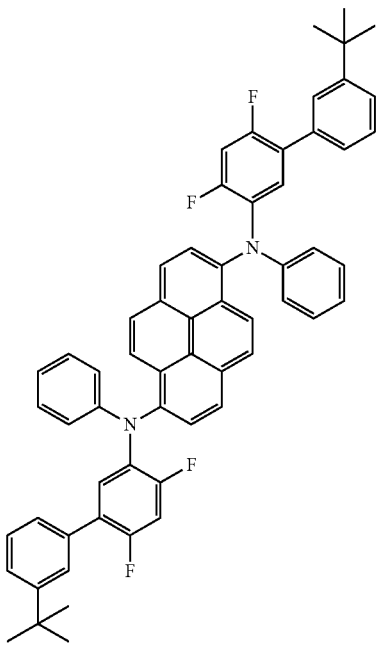
A-231
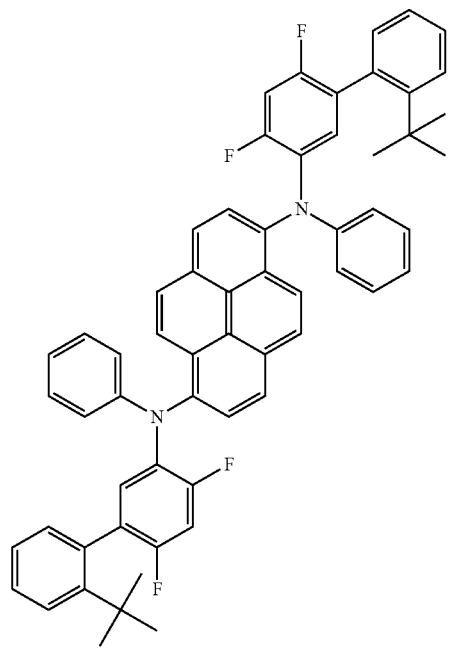
A-230
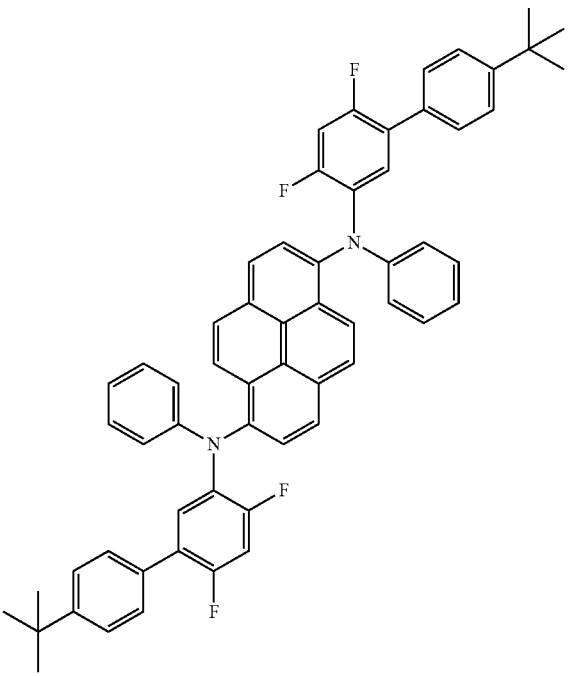
A-232

A-233
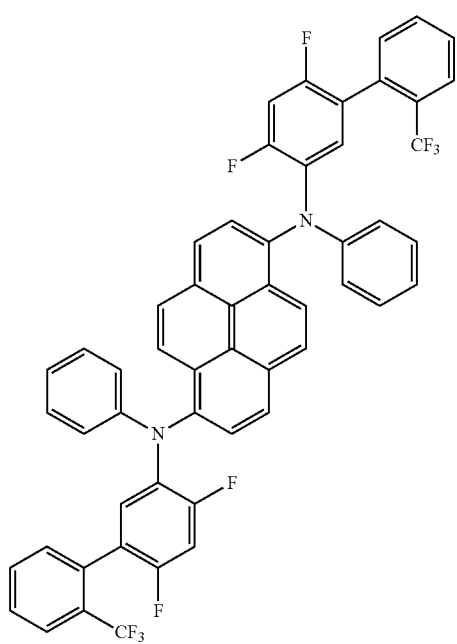
A-234
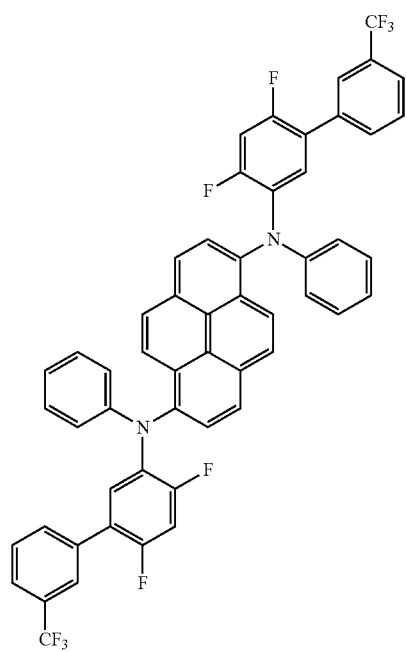
A-235
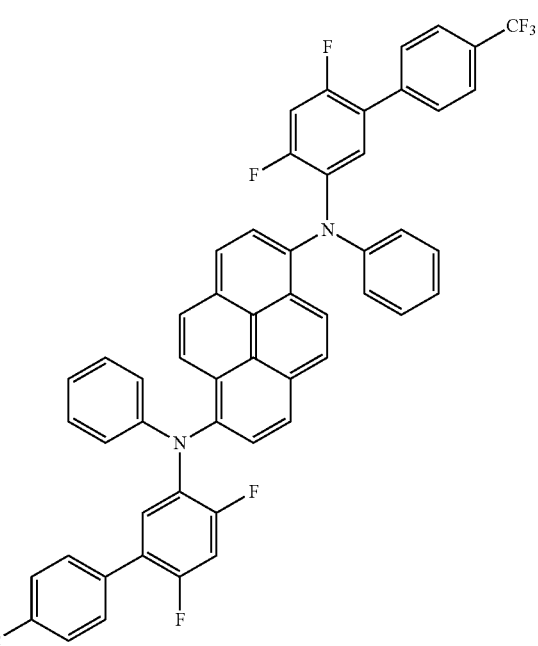
A-236
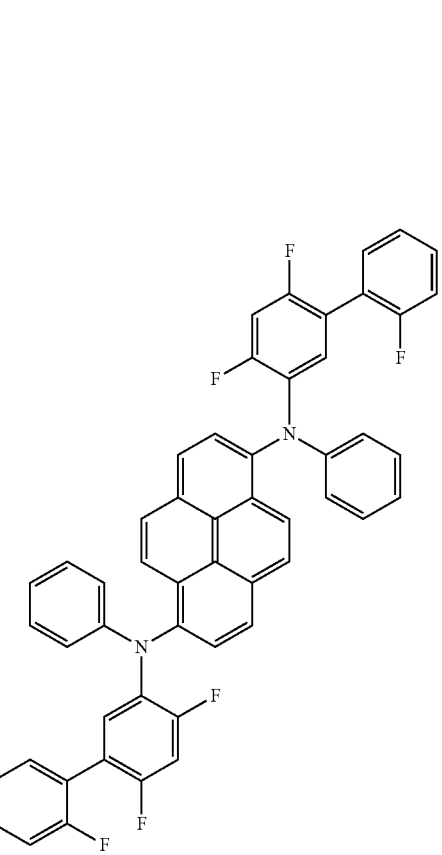

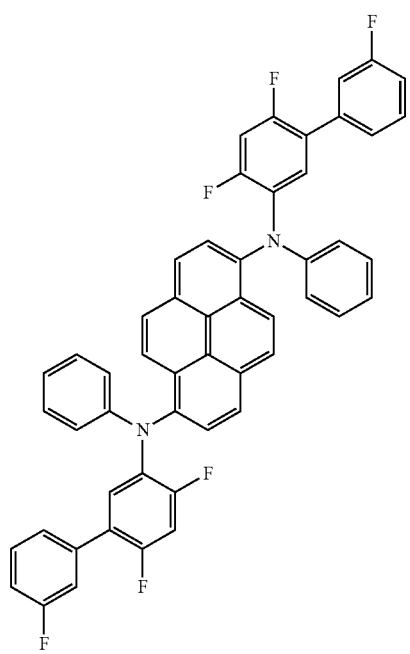
A-237
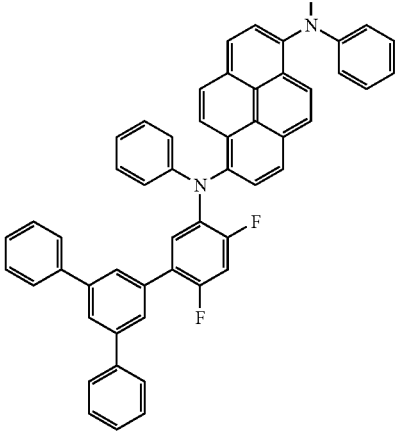
A-239
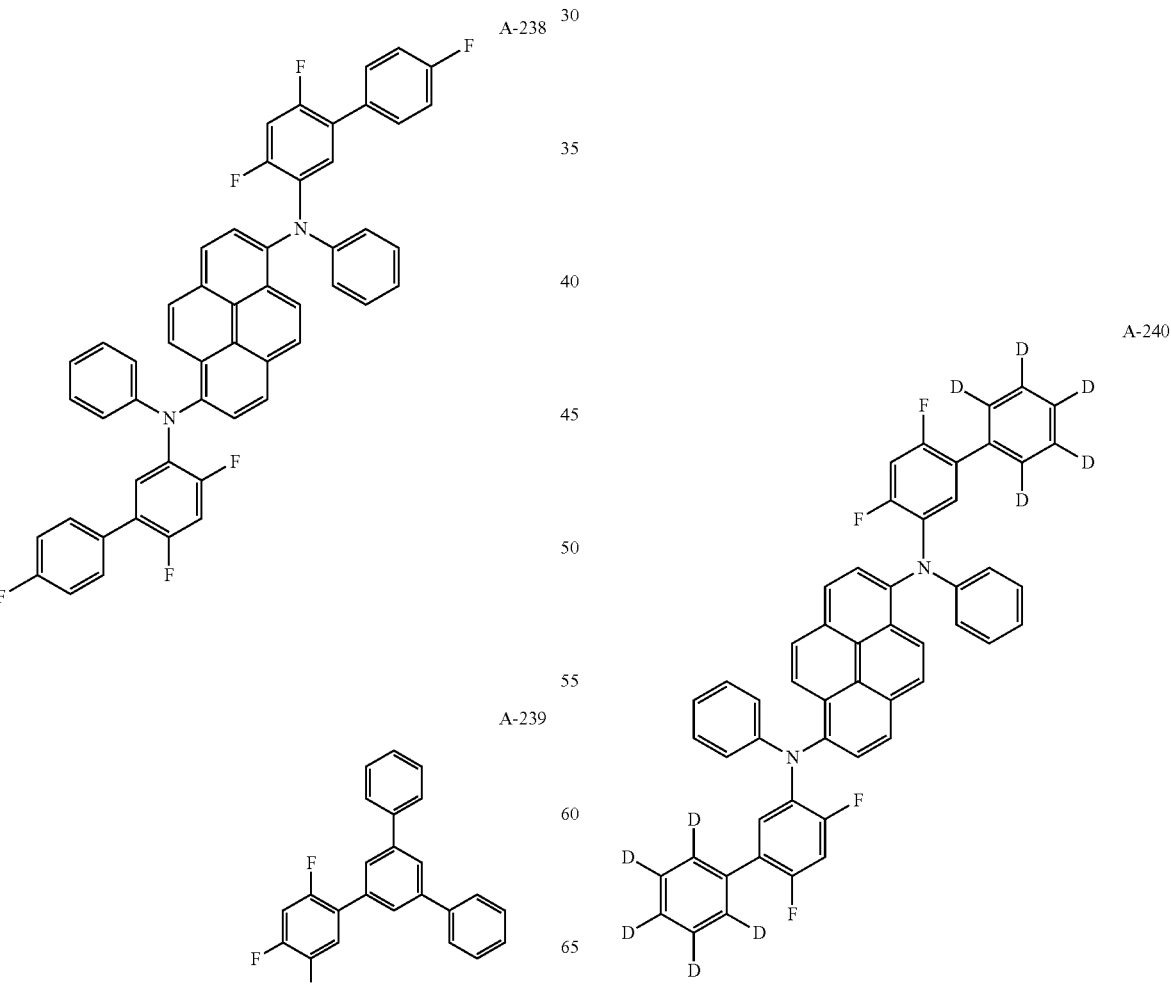

A-241
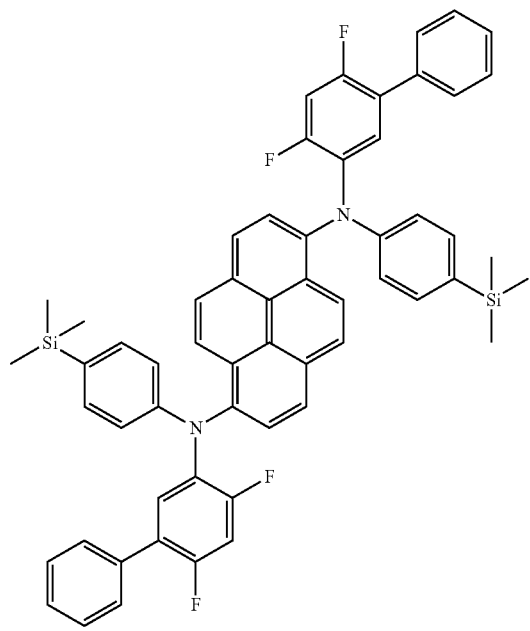
A-243
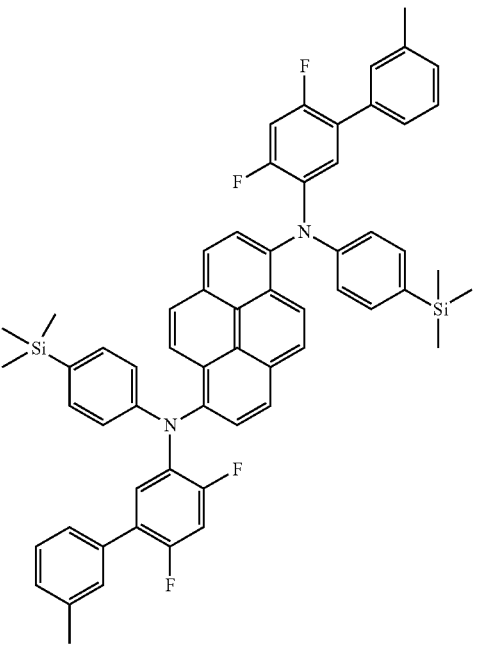
A-242
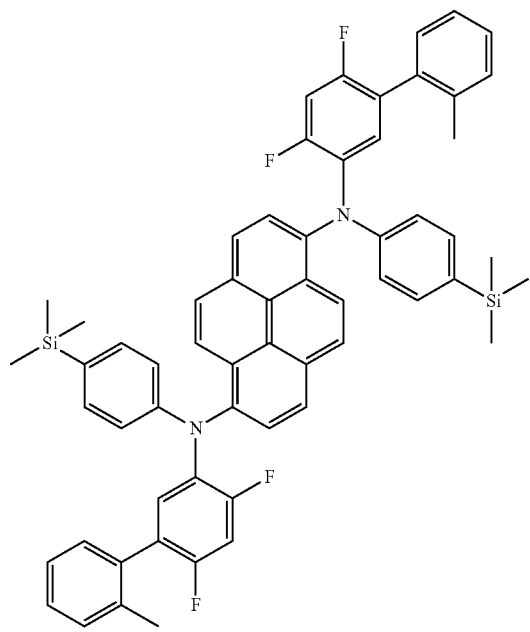
A-244
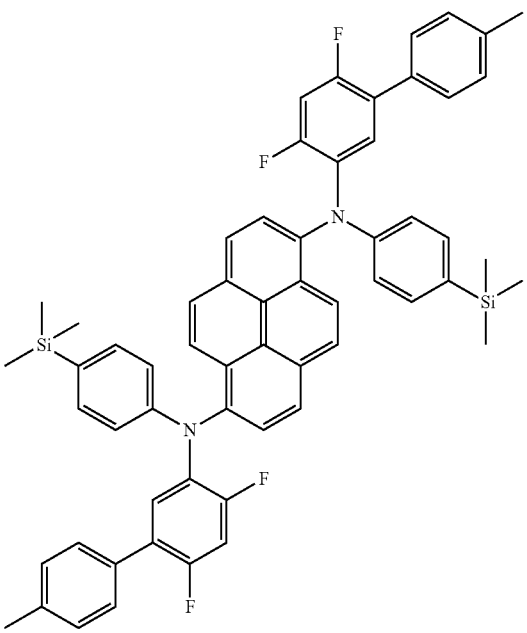

-continued
A-245
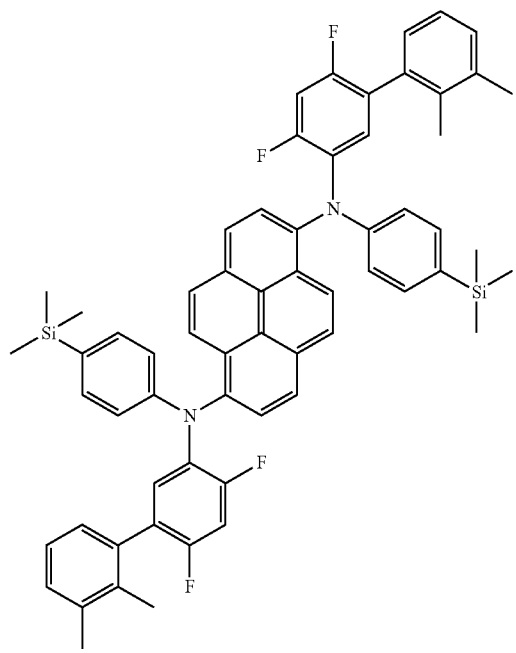
A-247
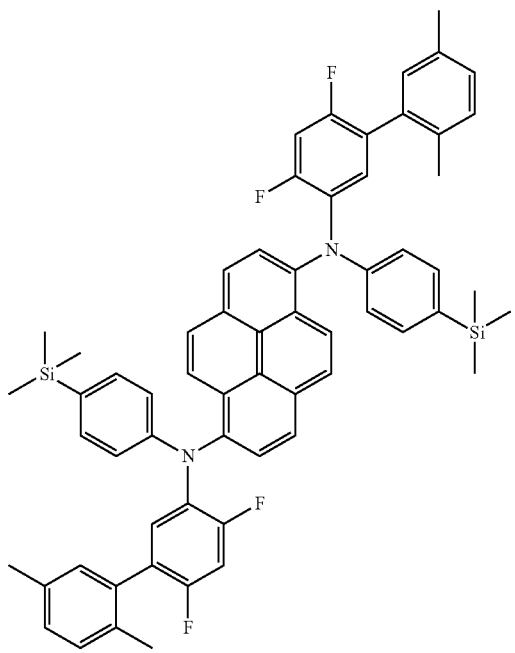
A-246
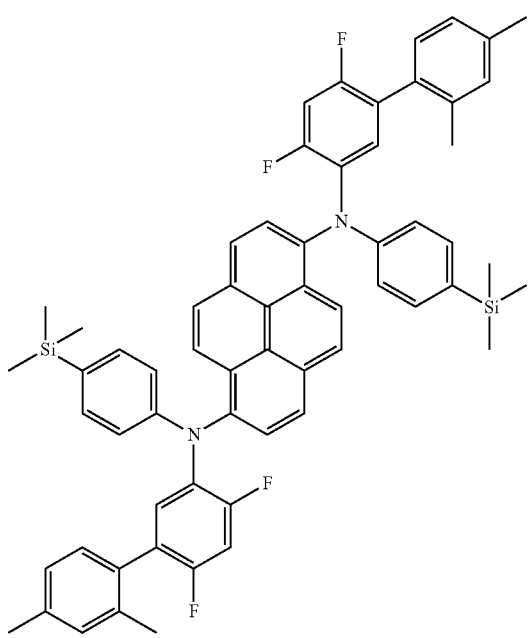
A-248
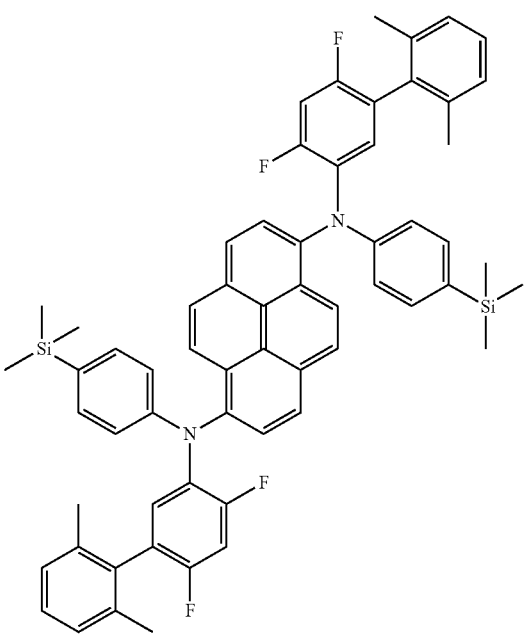

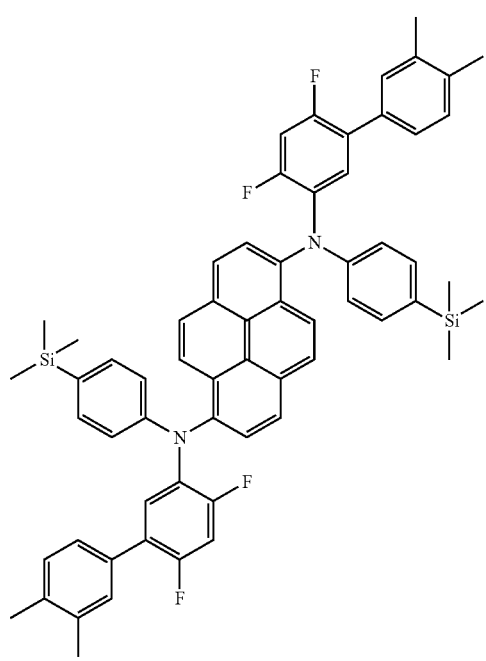
A-249
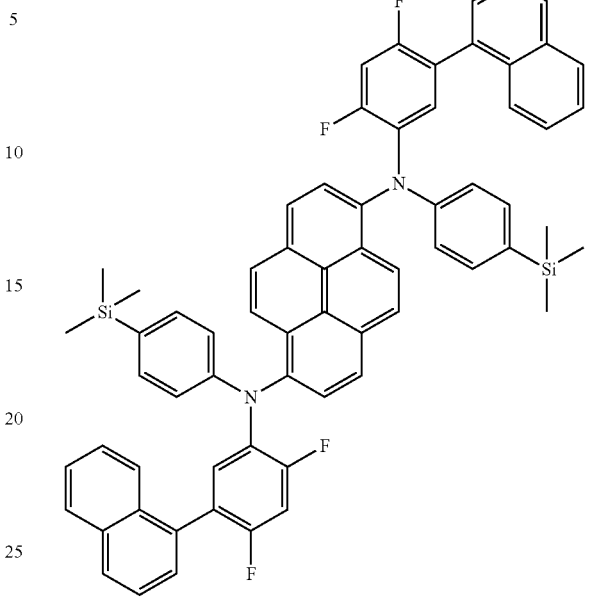
A-251
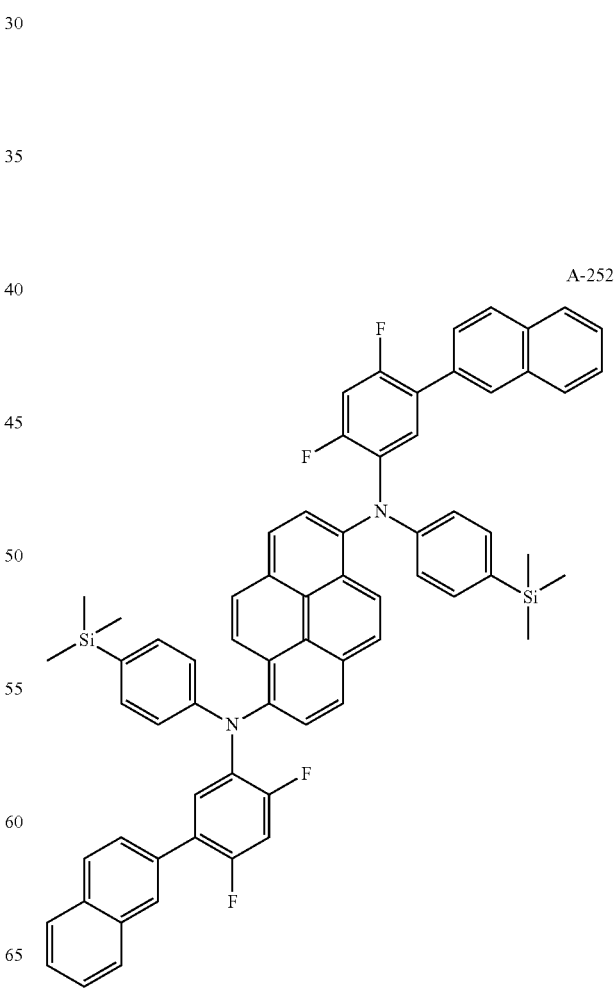
A-250
A-252

A-253
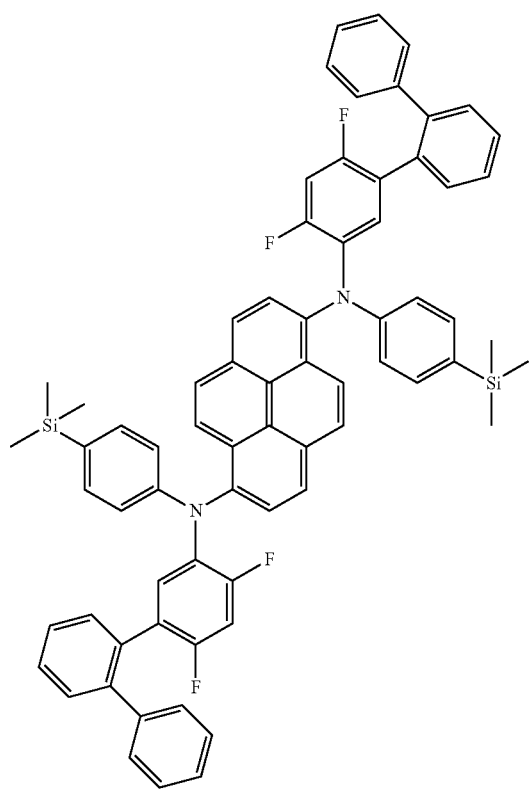
A-254
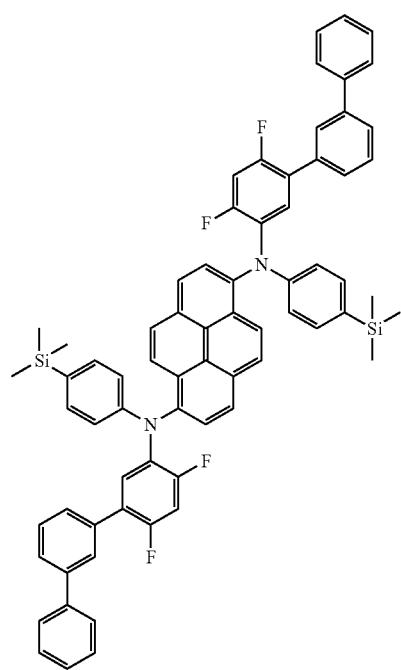
A-255
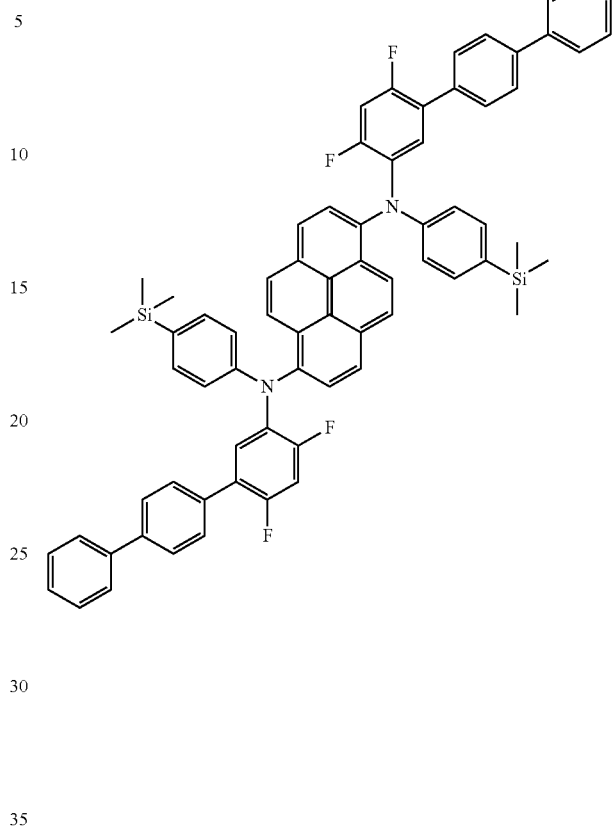
A-256
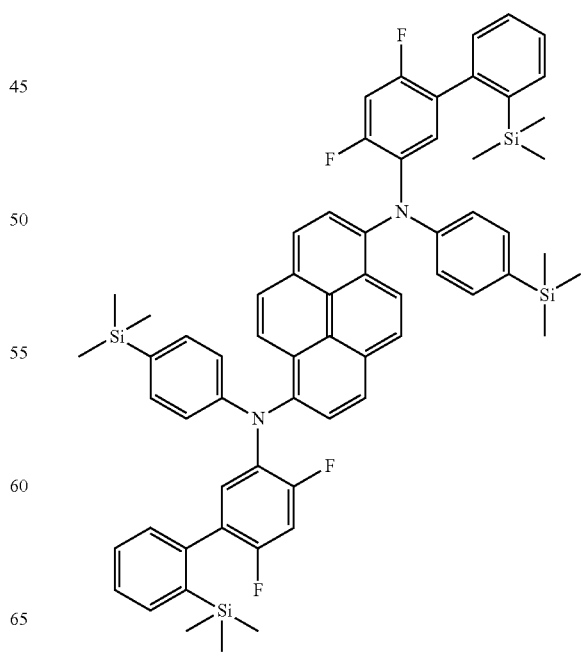

A-257
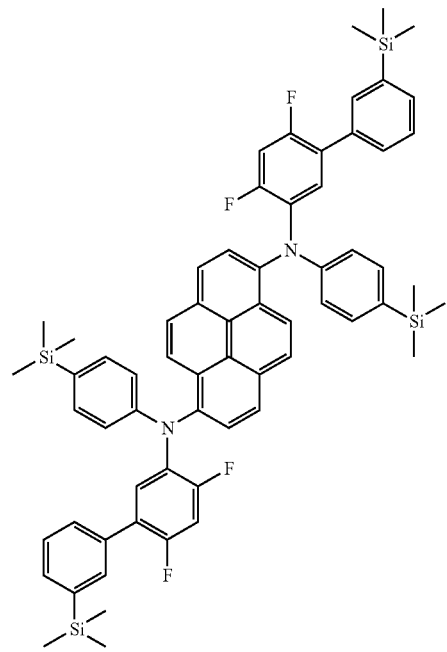
A-258
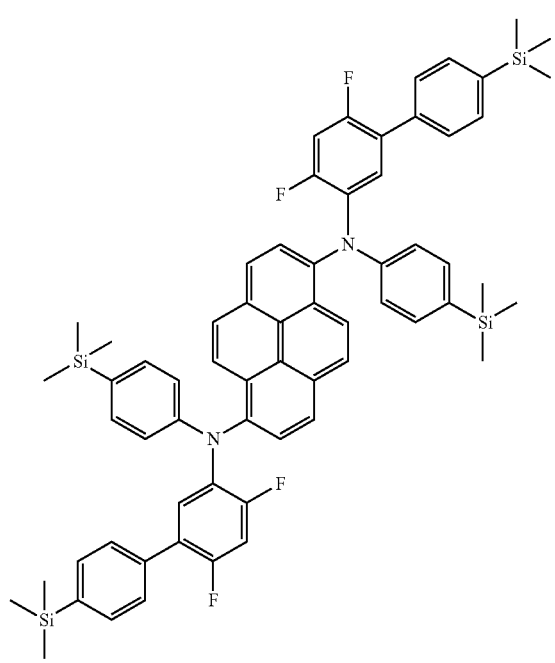
A-259
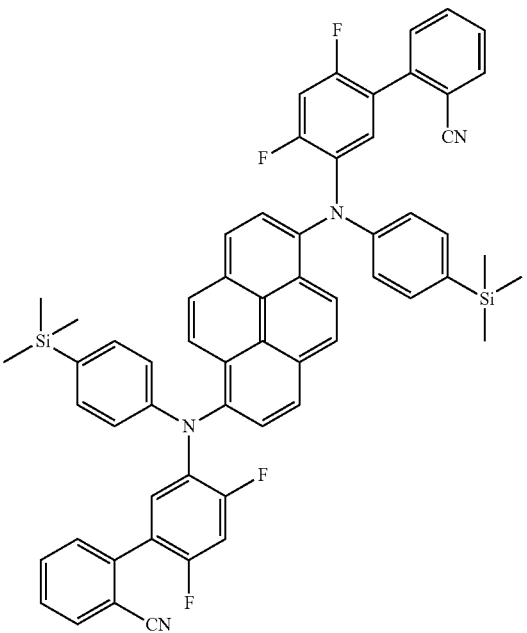
A-260
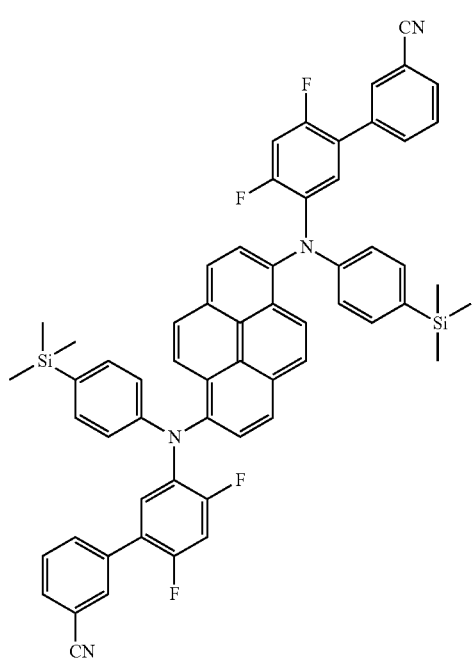

-continued
A-261
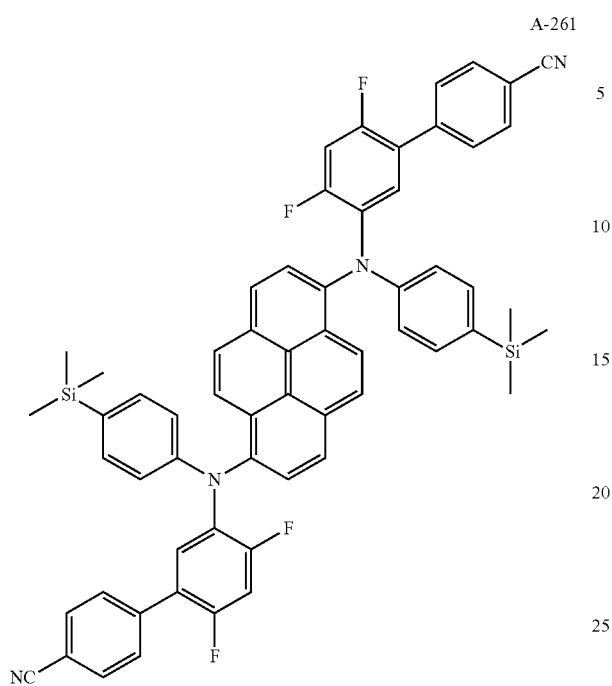
A-263
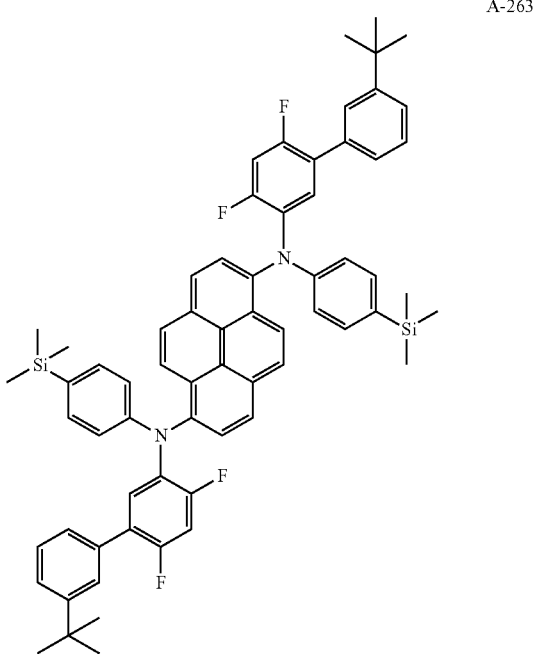
A-262
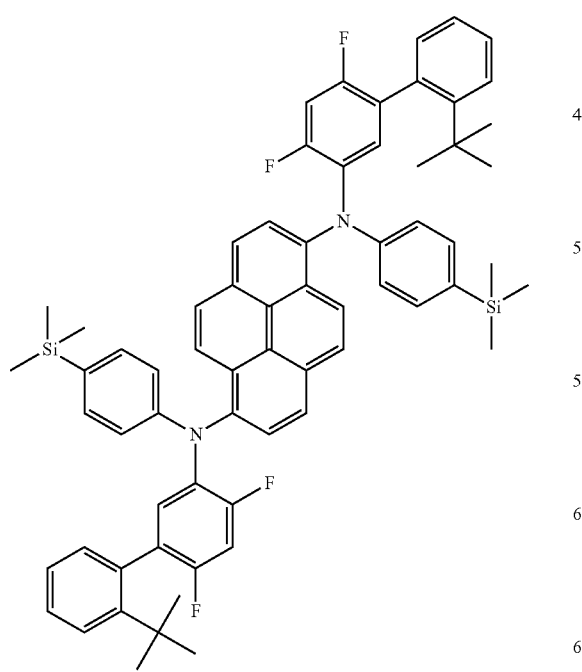
A-264
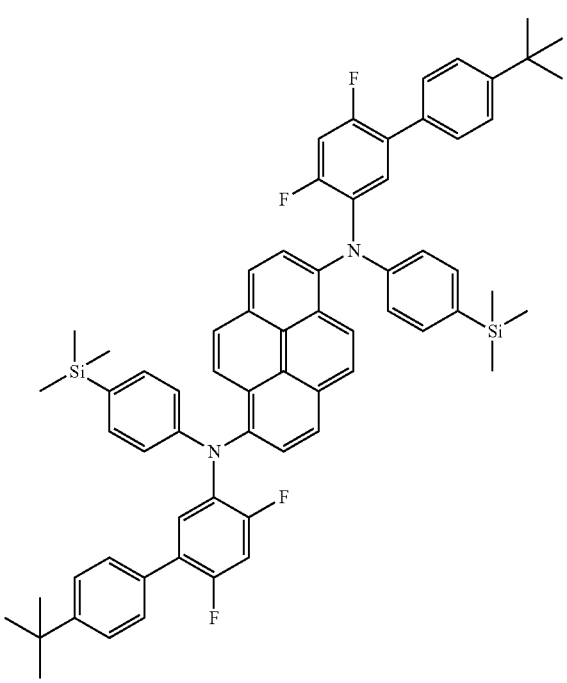

-continued
A-265
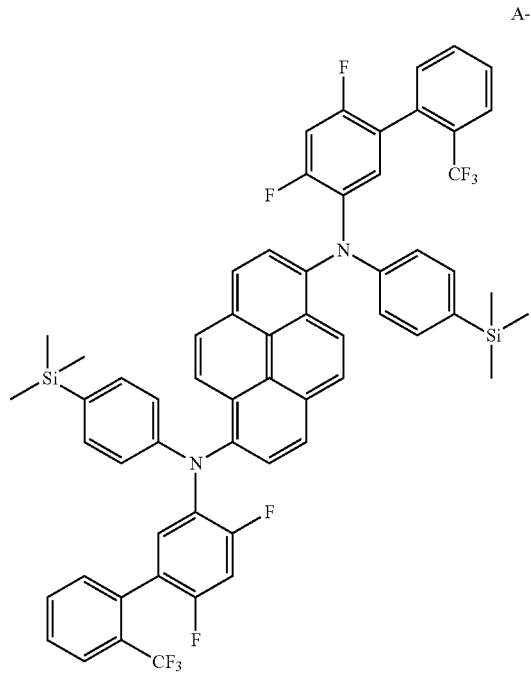
A-266
A-267
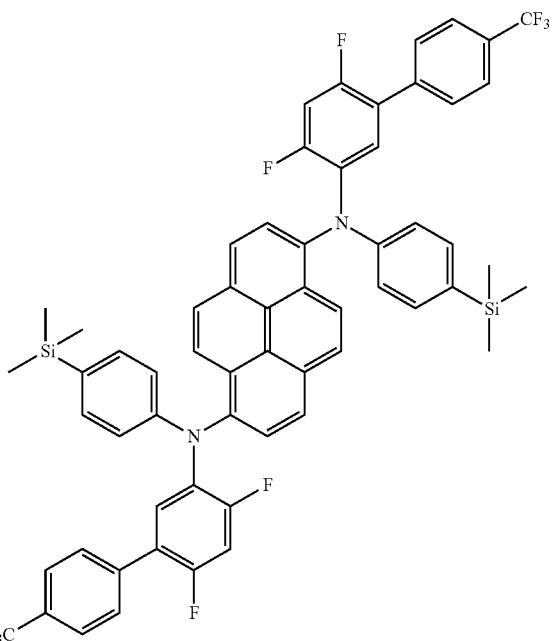
A-268
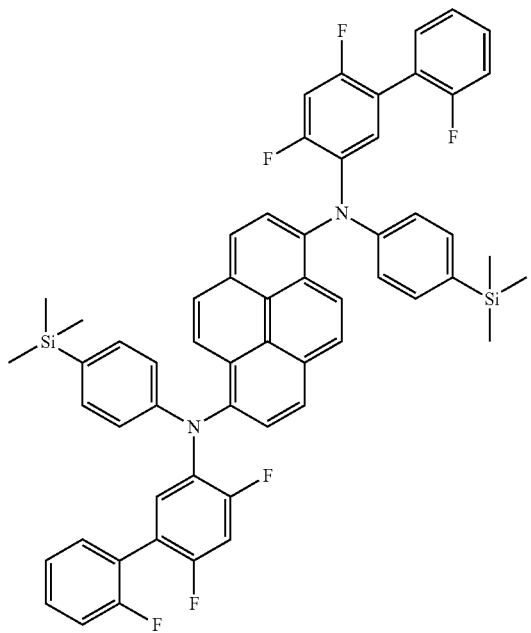

A-269
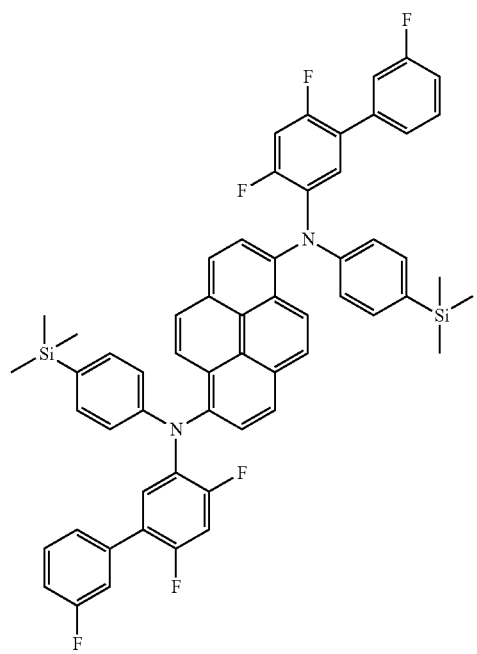
A-270
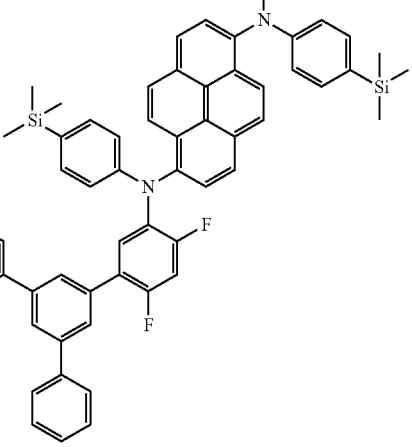
A-271
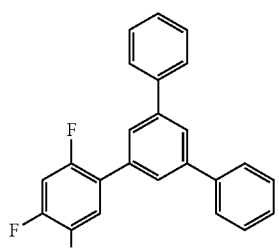
A-272
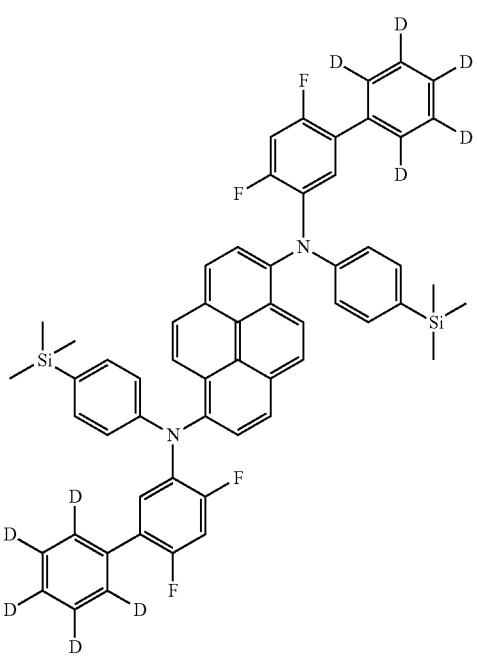

A-273
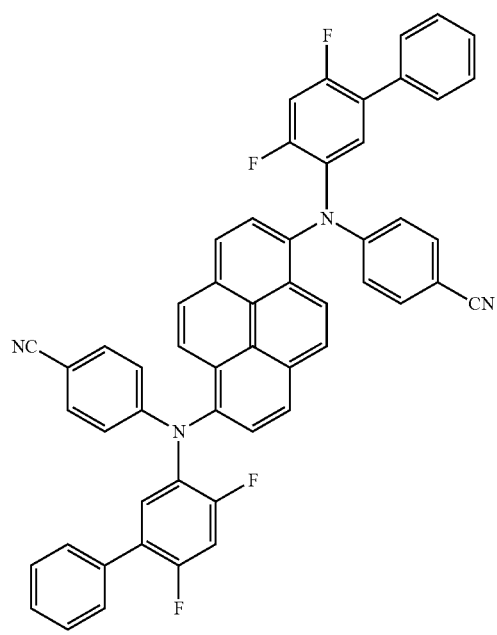
A-274
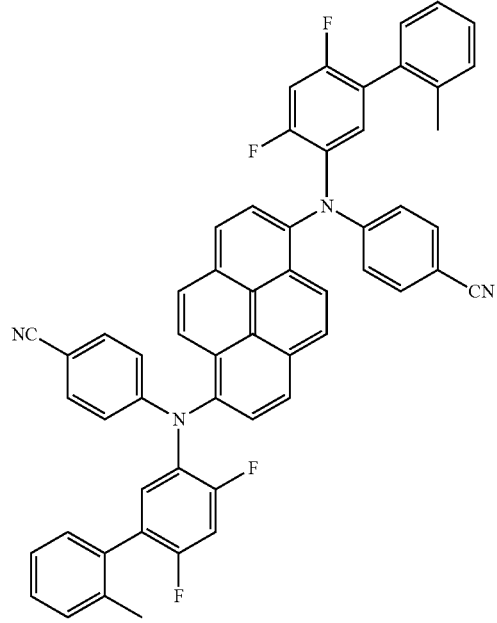
A-275
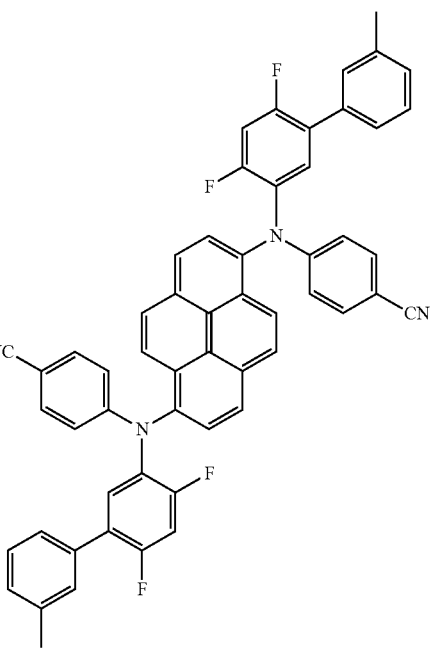
A-276
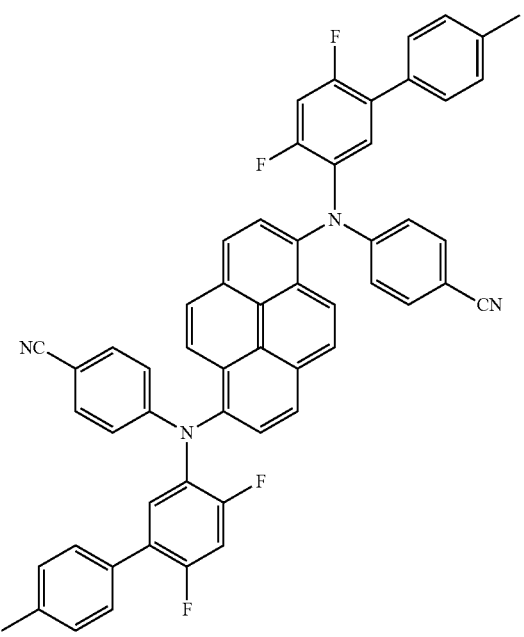

-continued
A-277
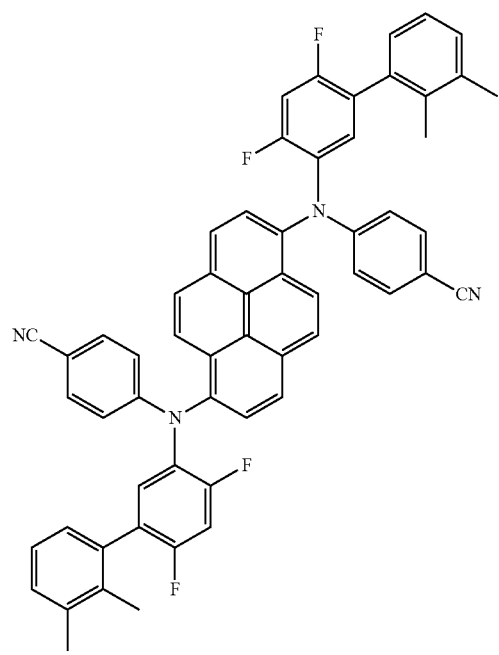
A-278
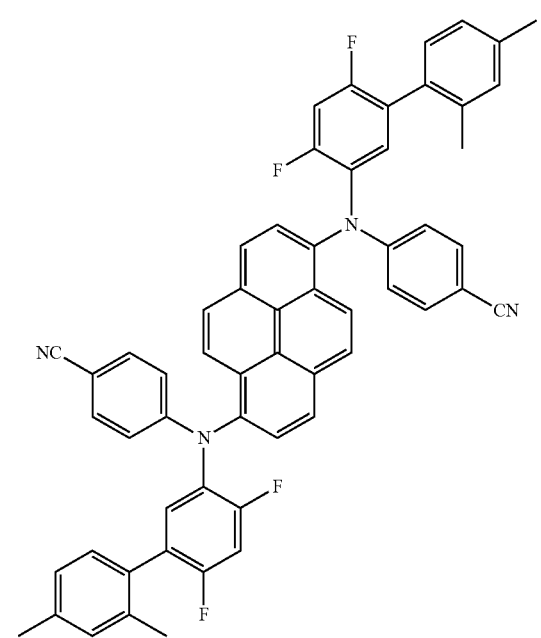
A-279
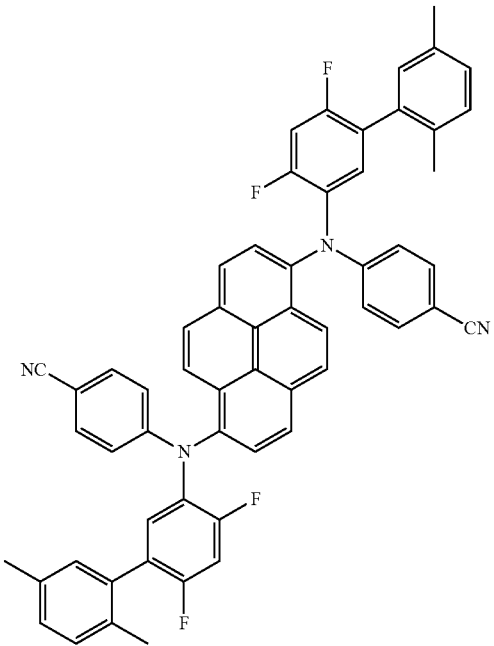
A-280
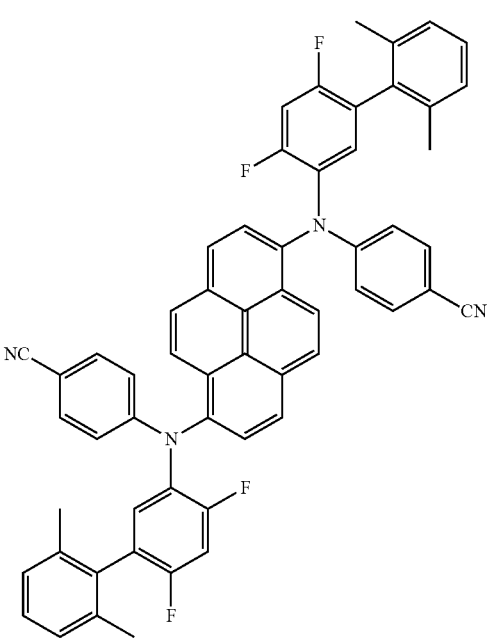

A-281
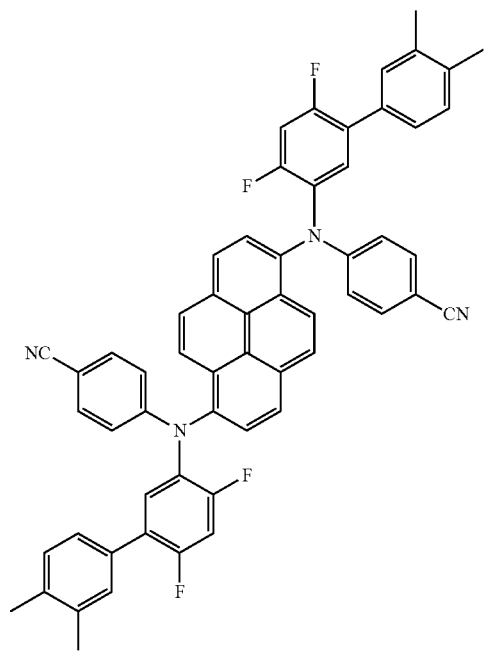
A-282
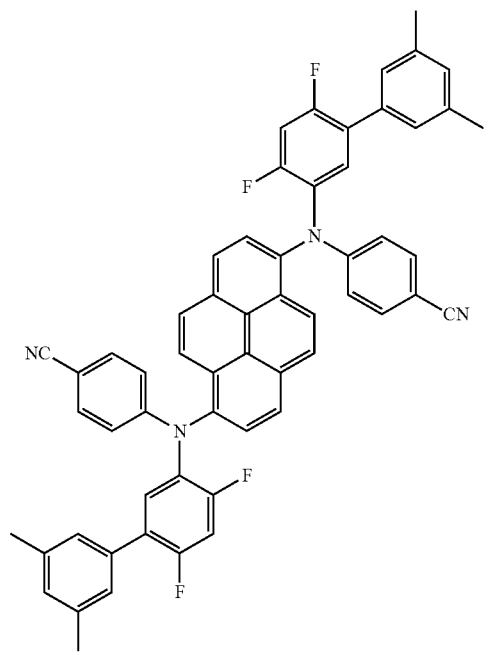
A-283
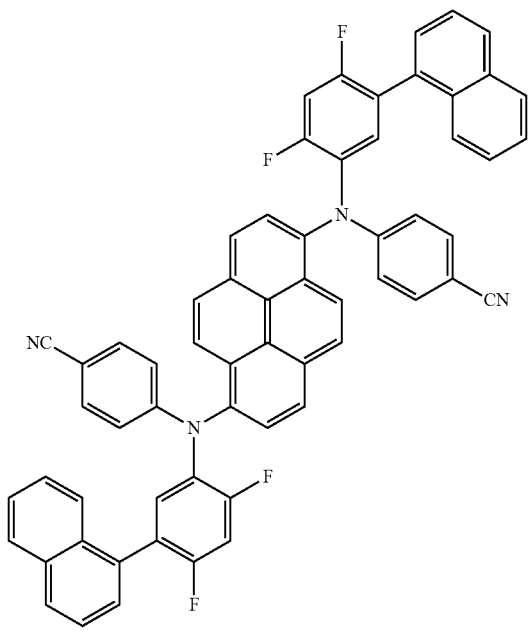
A-284
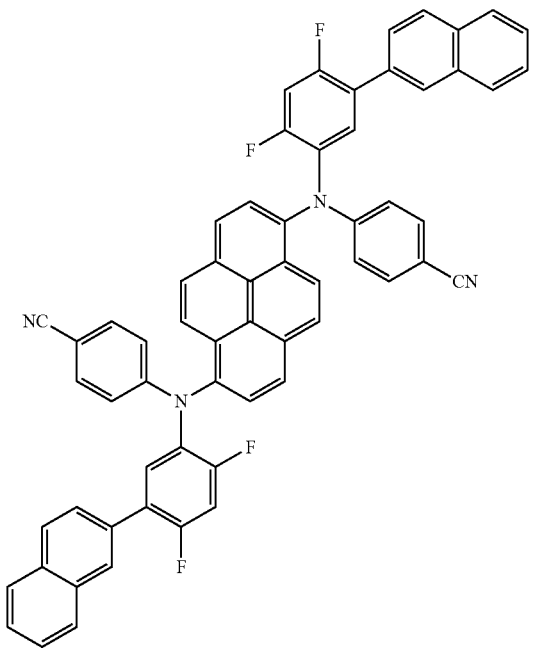

A-285
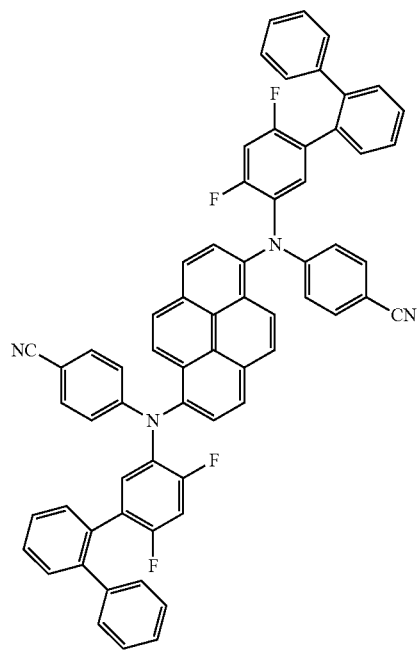
A-286
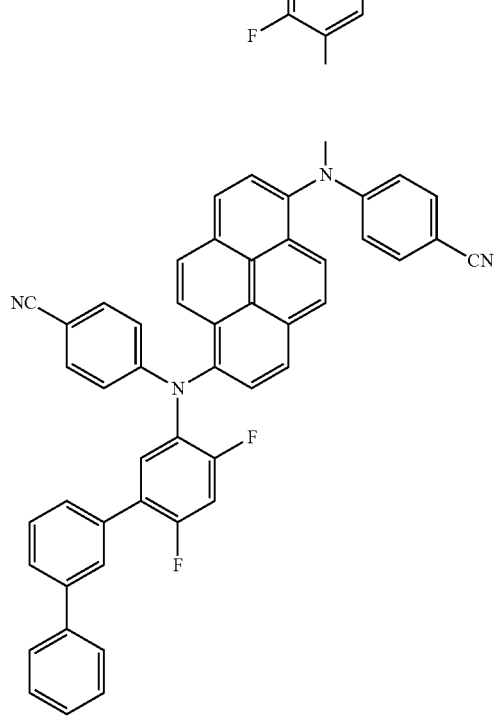
A-287
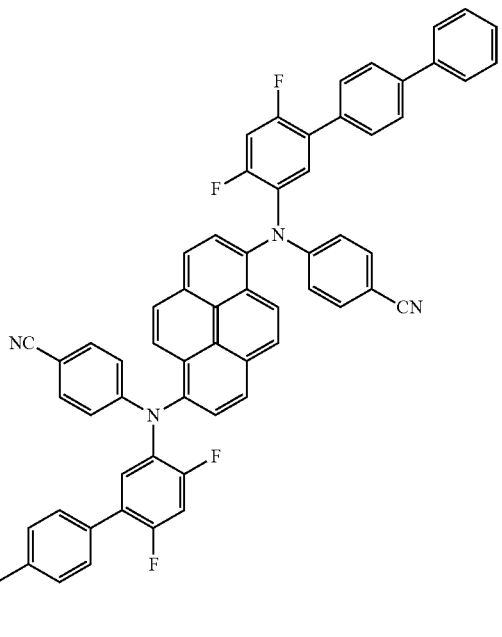
A-288
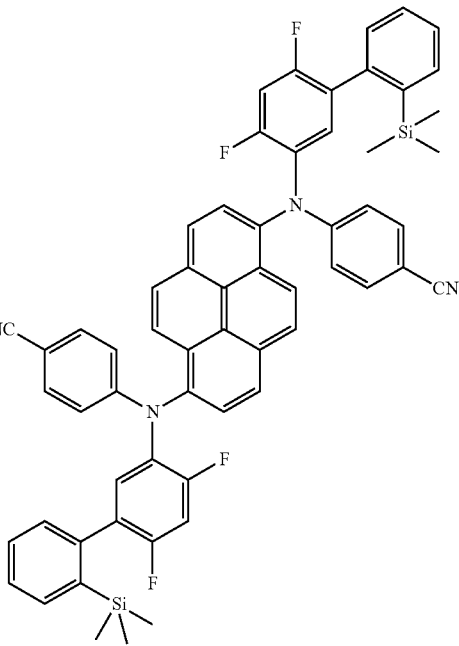

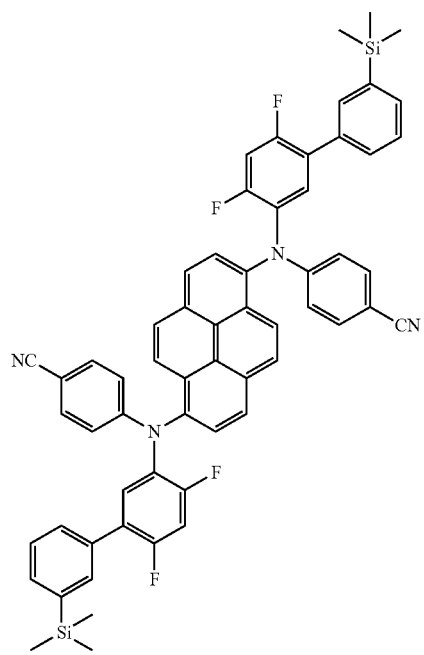
A-289
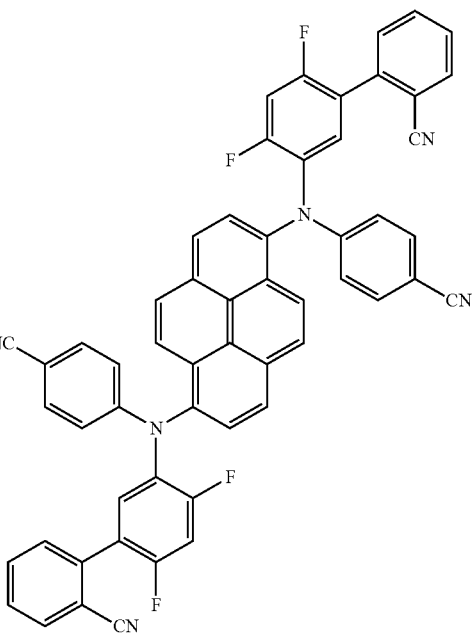
A-291
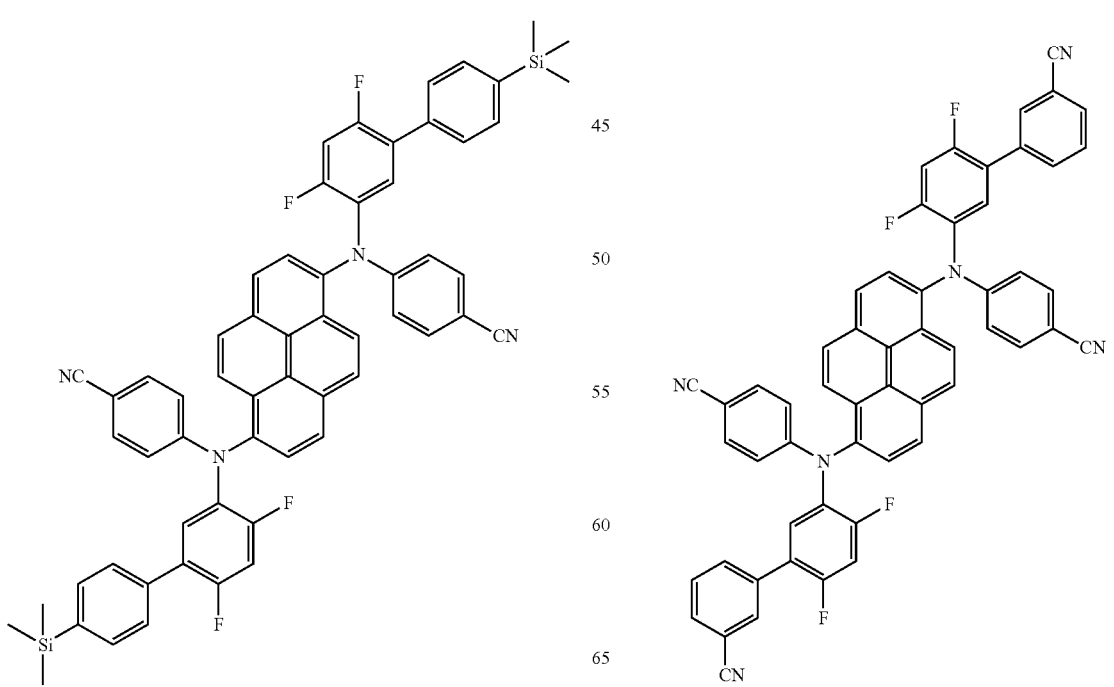
A-290
A-292

A-293
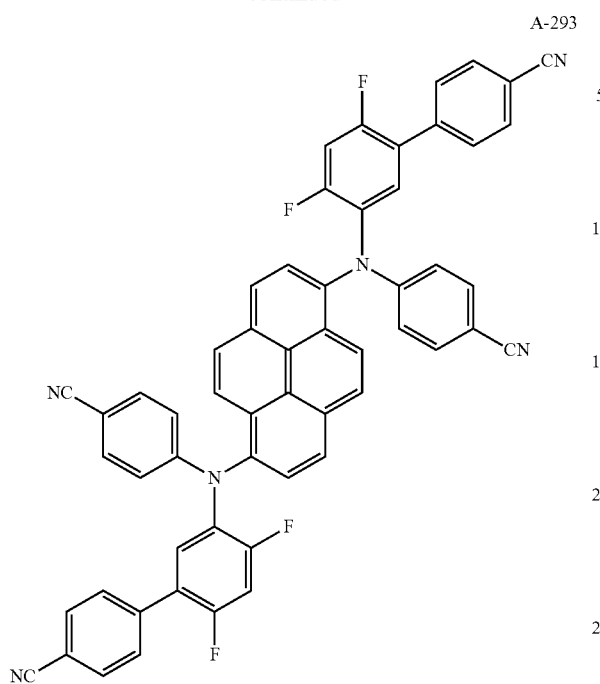
A-294
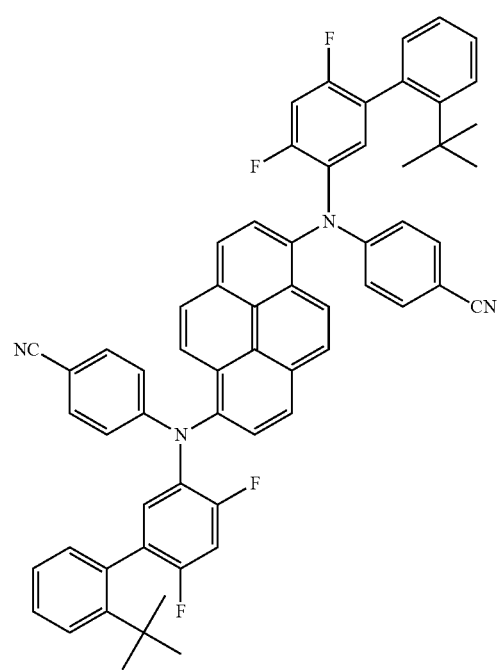
A-295
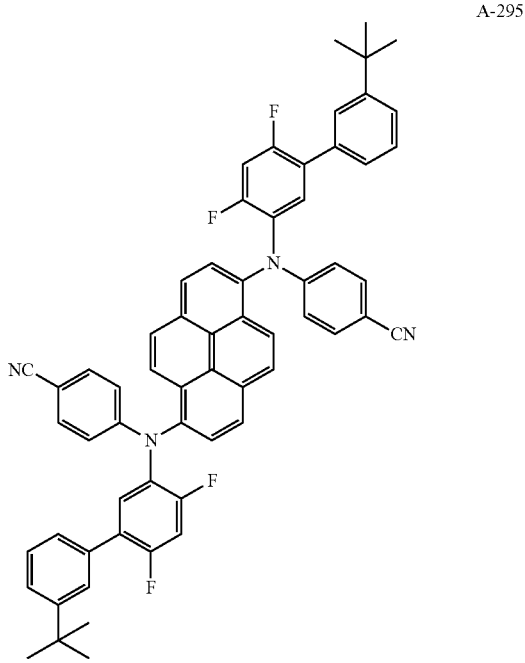
A-296
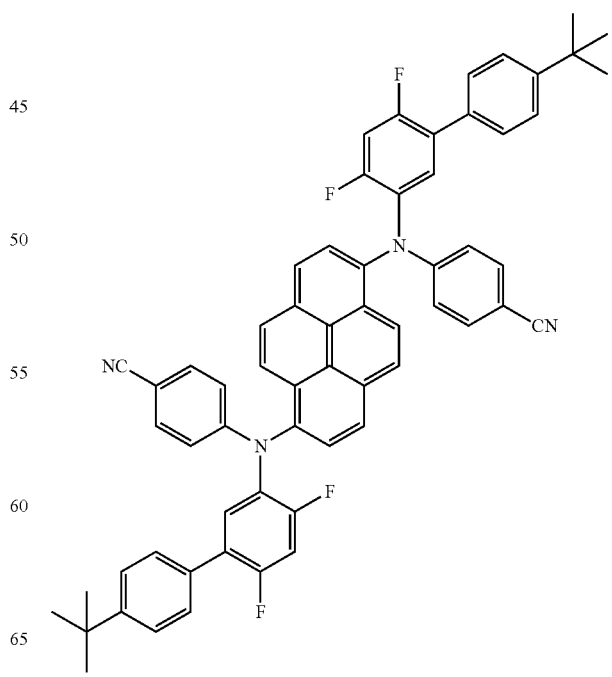

A-297
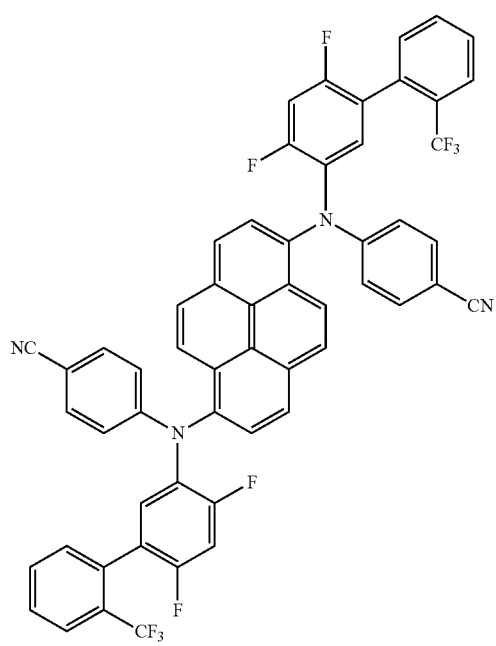
A-298
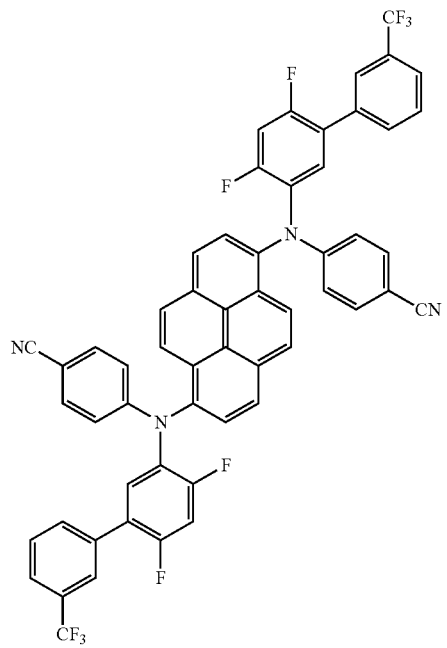
A-299
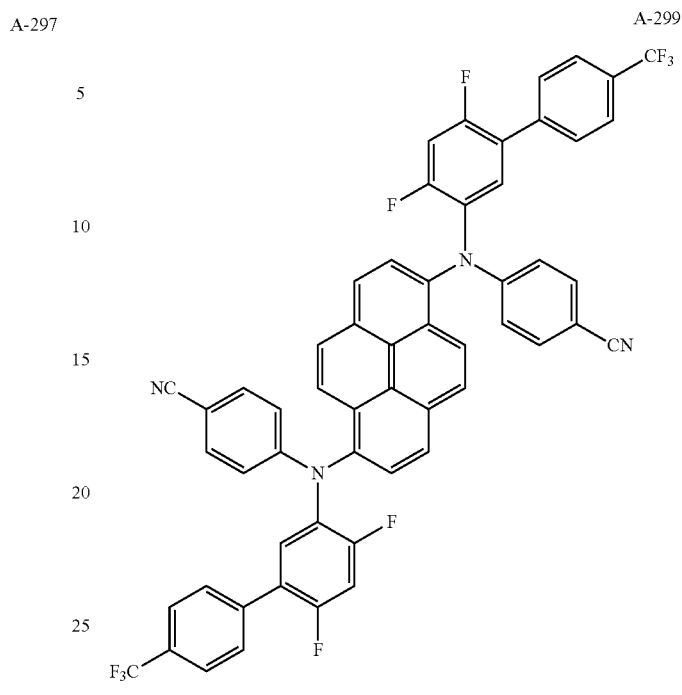
A-300
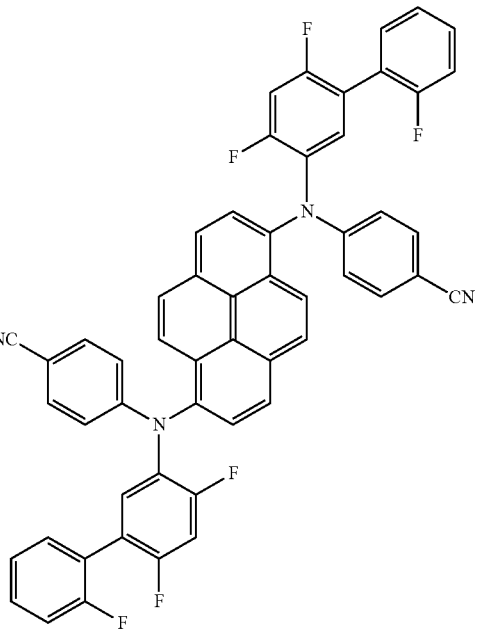

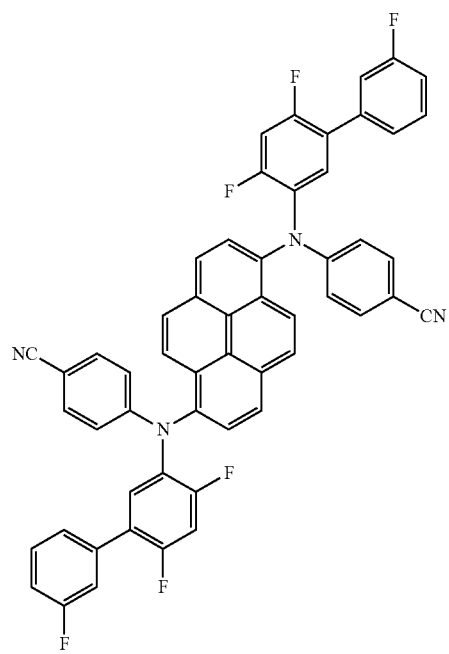
A-301
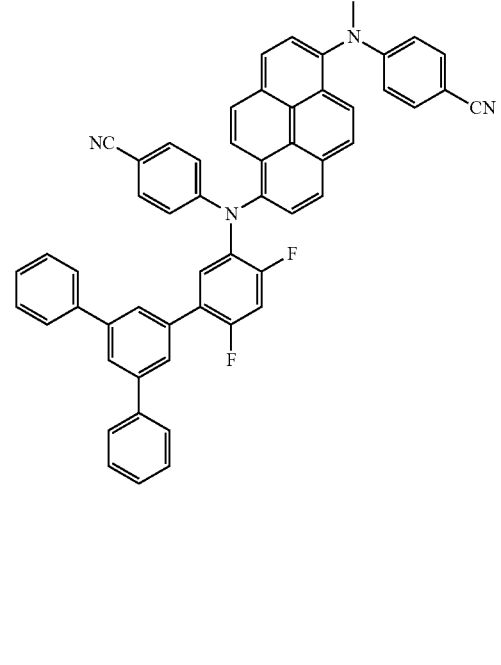
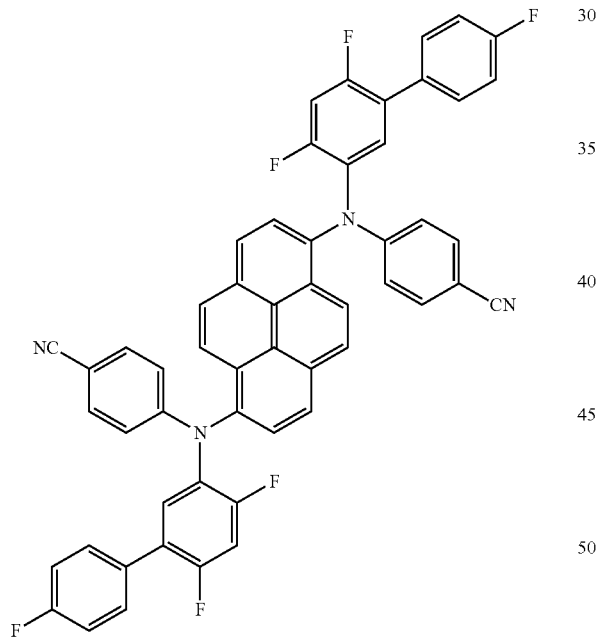
A-302
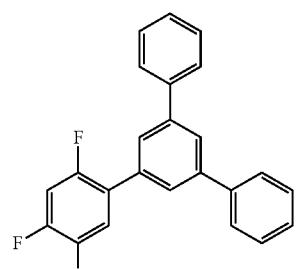
A-303
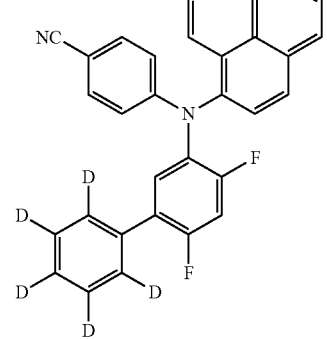
A-304

-continued
A-305
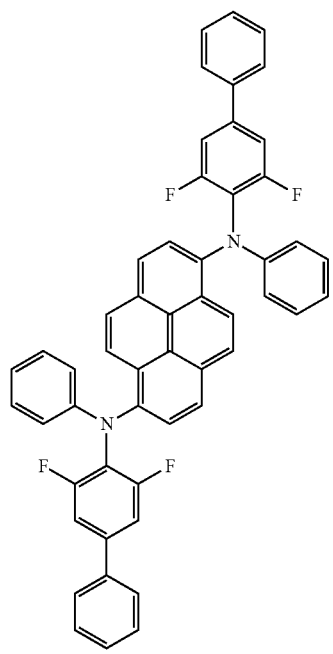
A-306
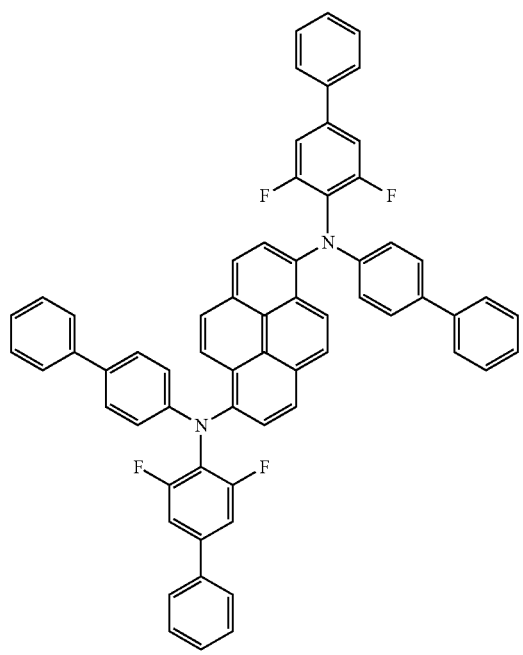
-continued
A-307
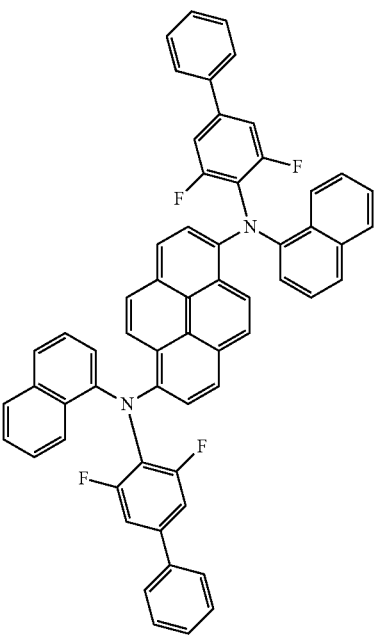
A-308
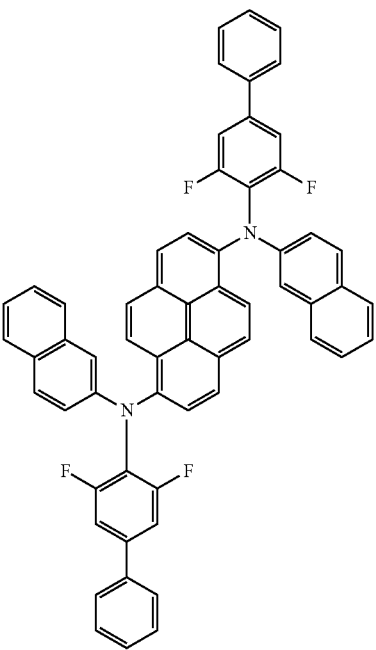

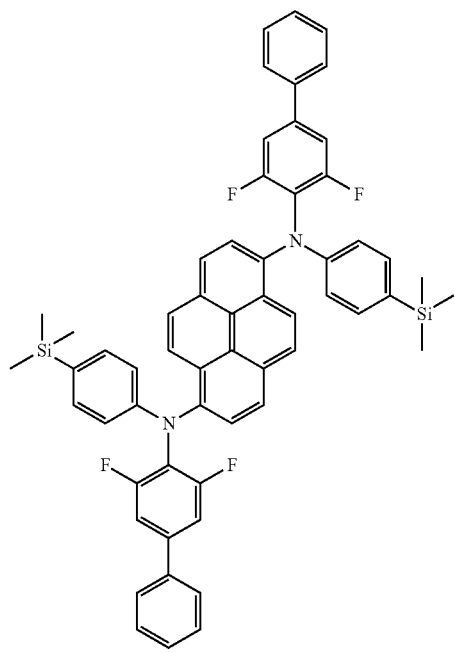
A-309
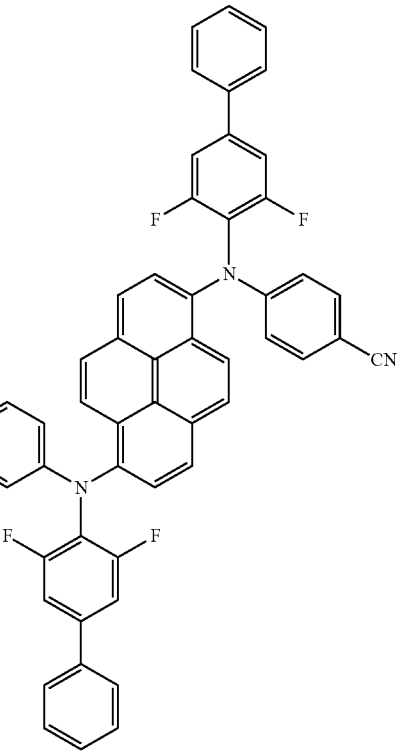
A-311
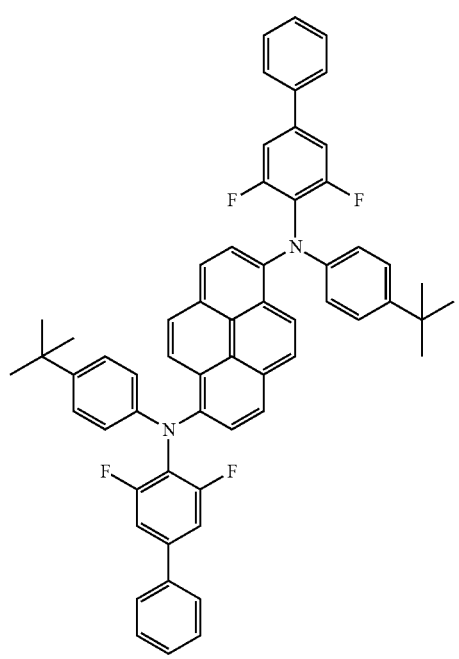
A-310
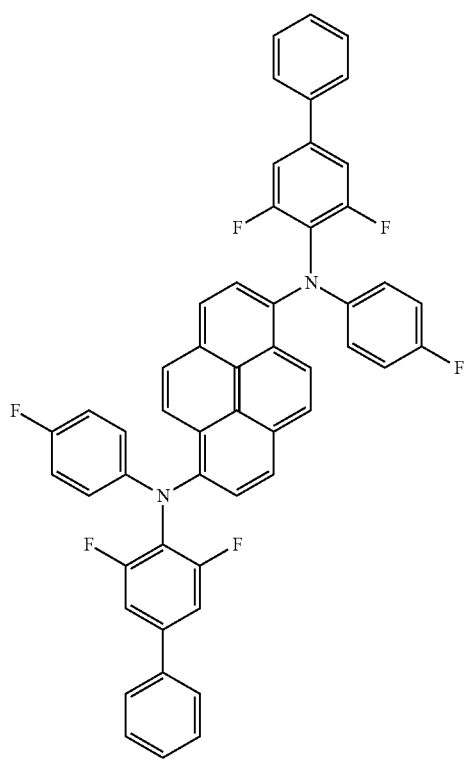
A-312

A-313
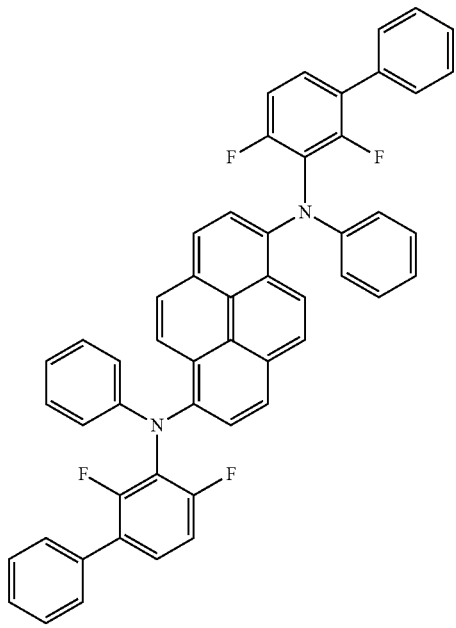
A-315
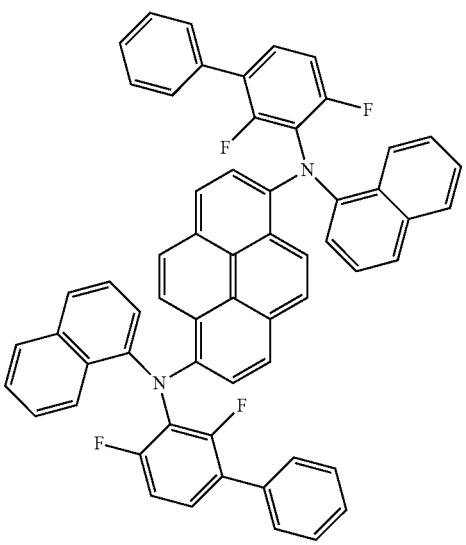
A-314
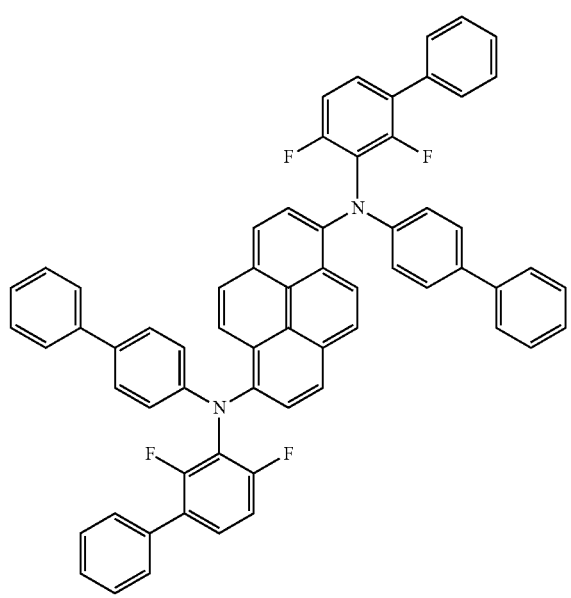
A-316
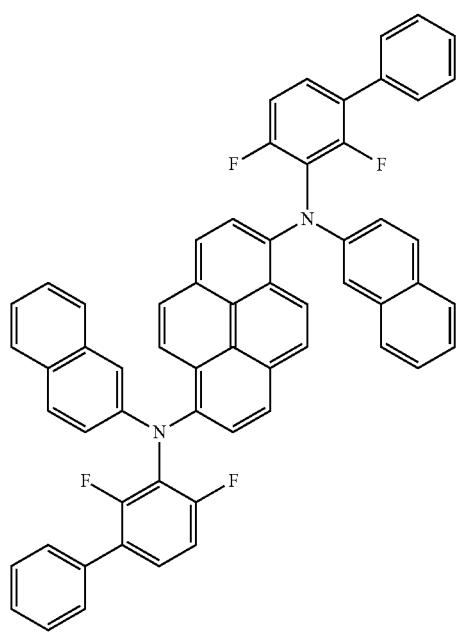

A-317 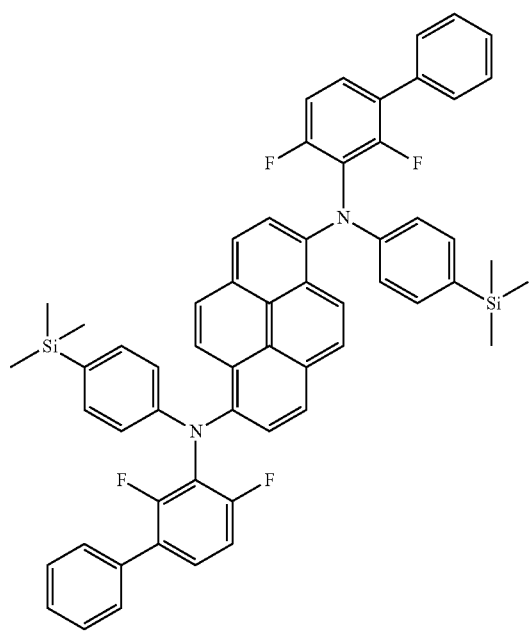
A-319 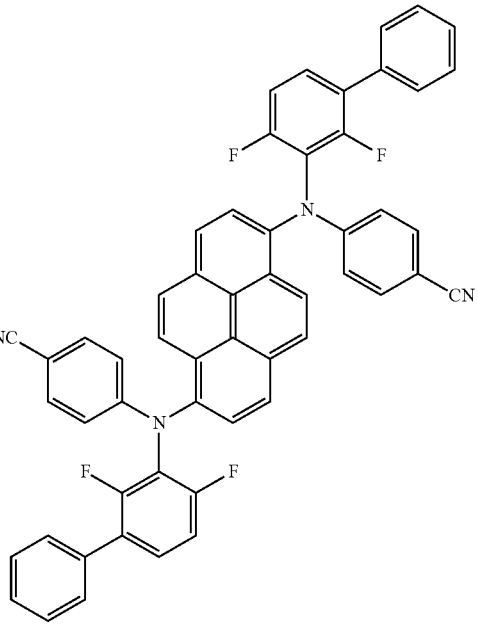
A-318 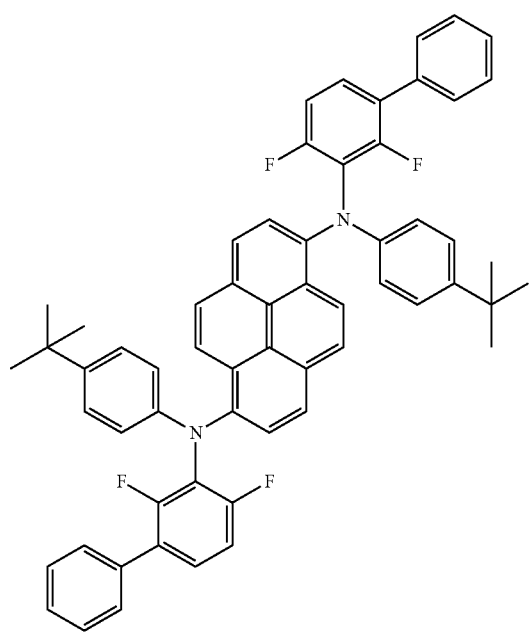
A-320 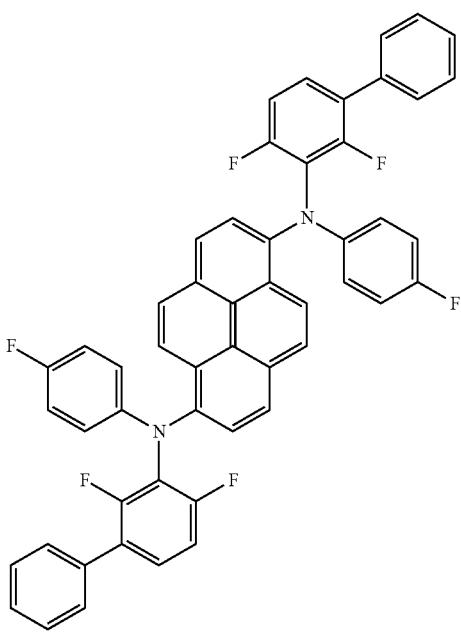

A-321
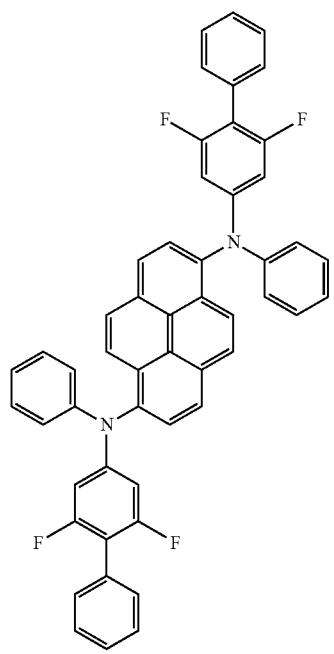
A-322
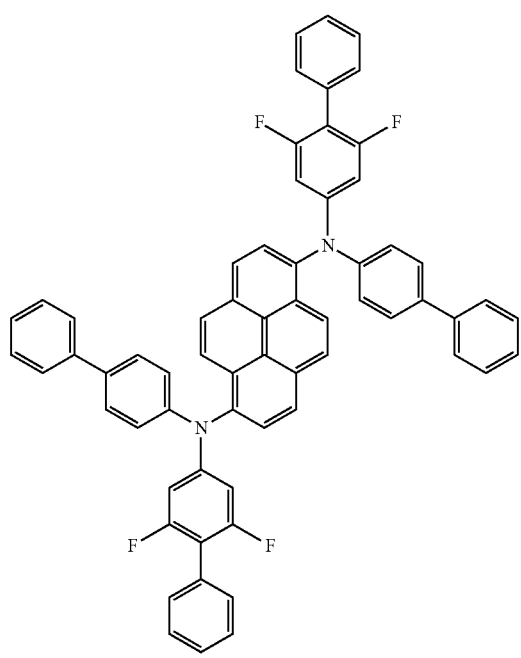
A-323
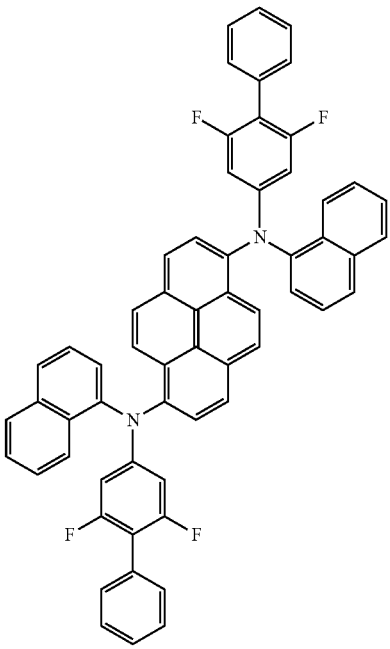
A-324
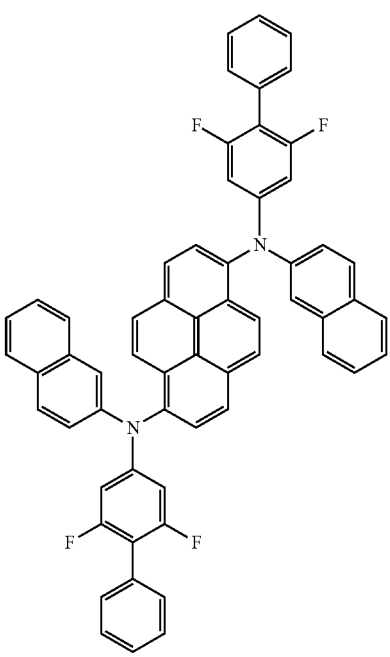

A-325
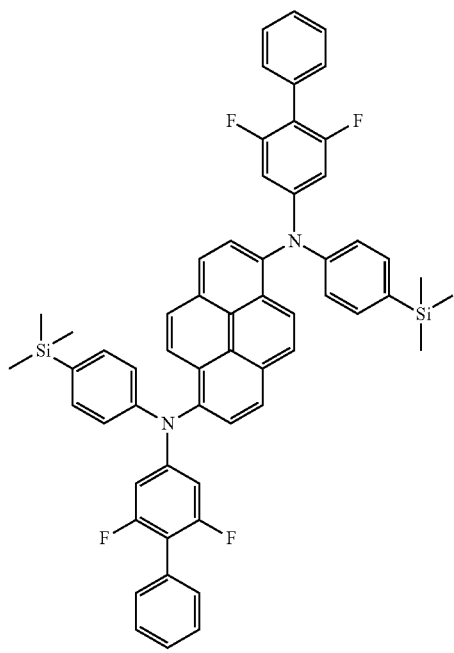
A-326
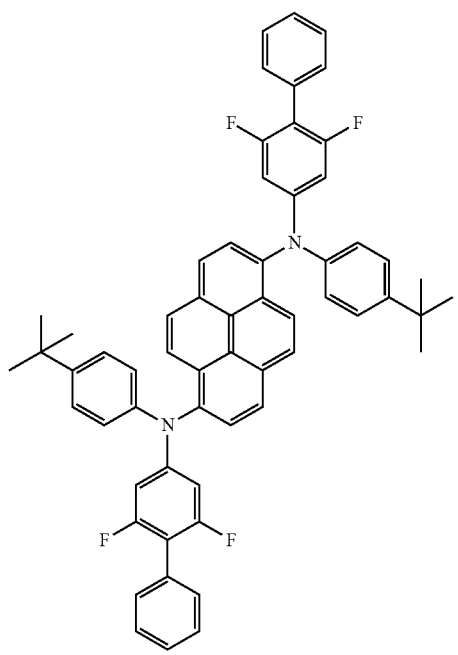
A-327
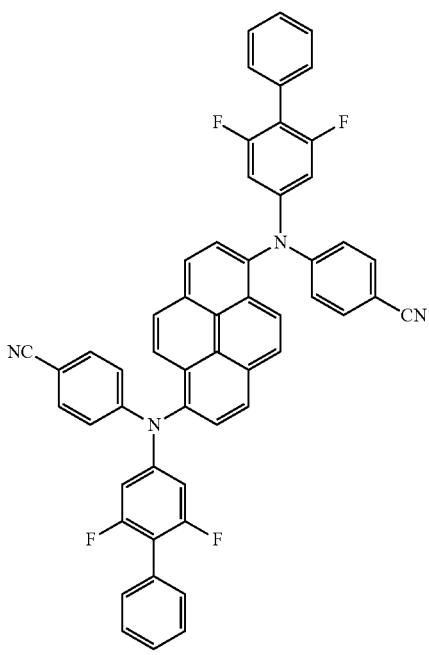
A-328
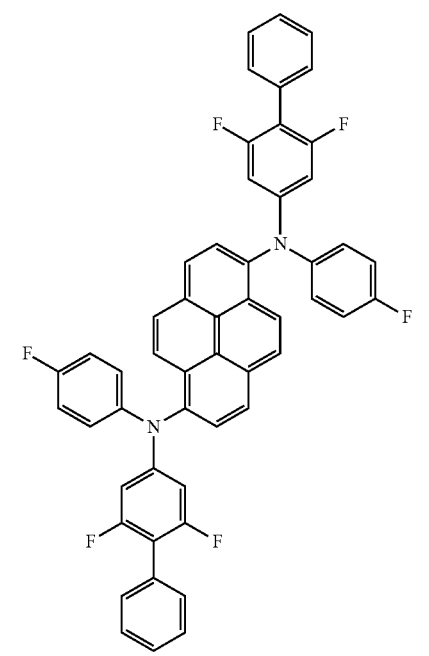

A-329
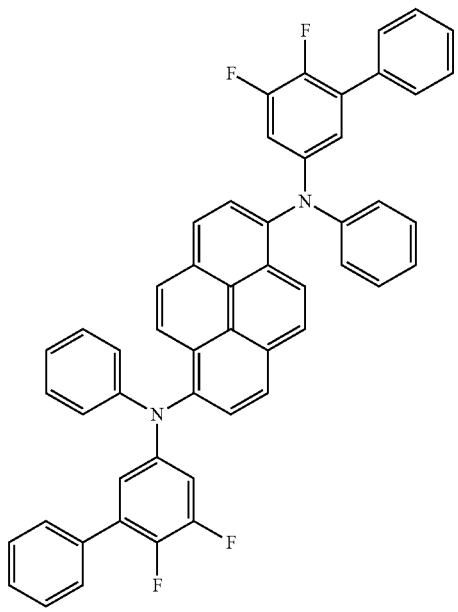
A-331
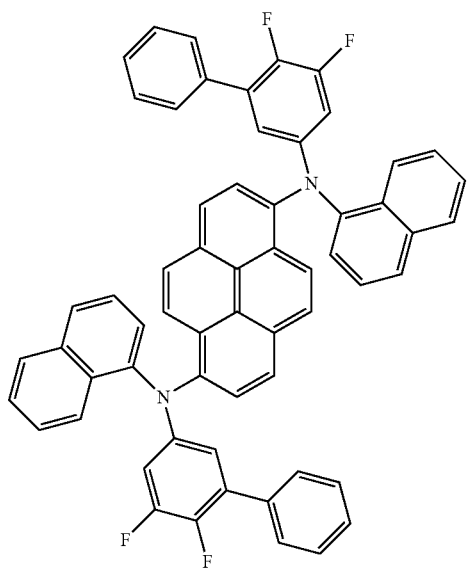
A-330
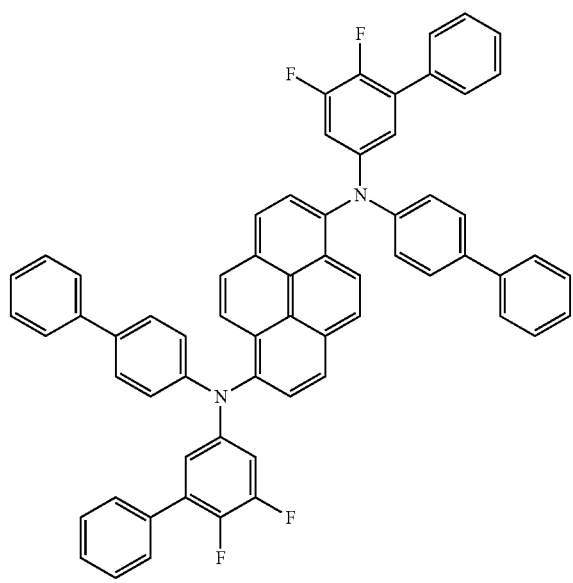
A-332
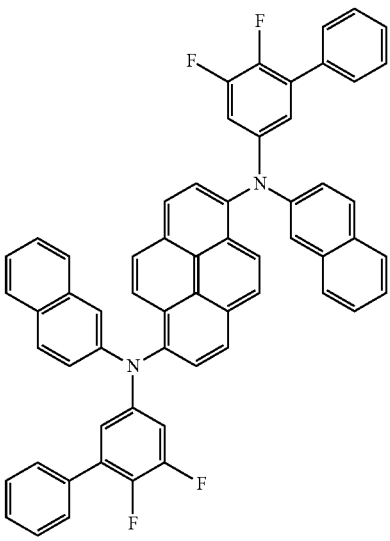

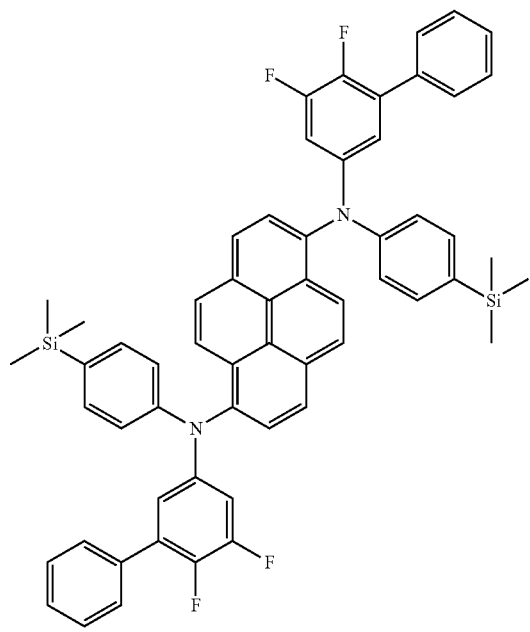
A-333
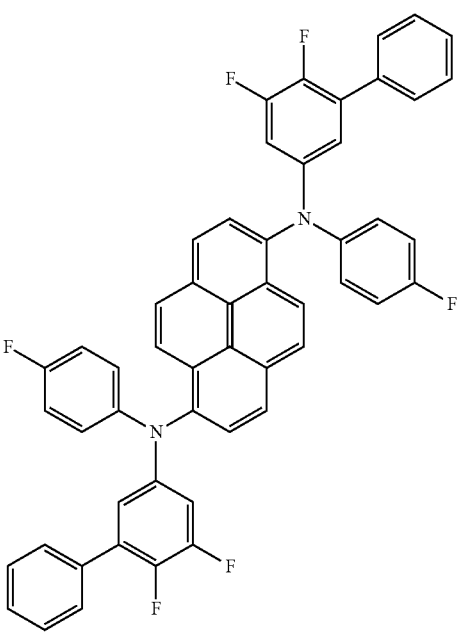
A-334
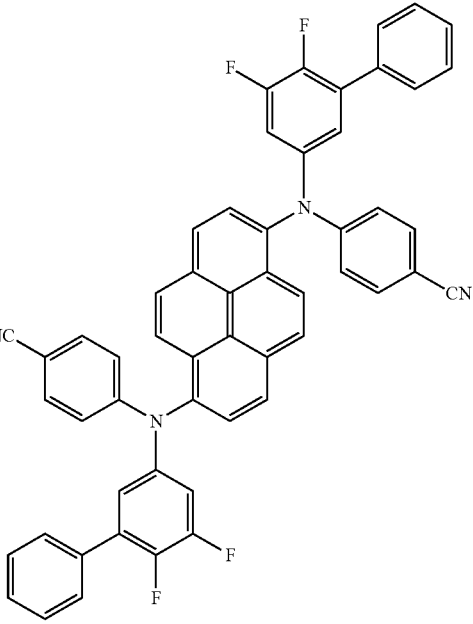
A-335
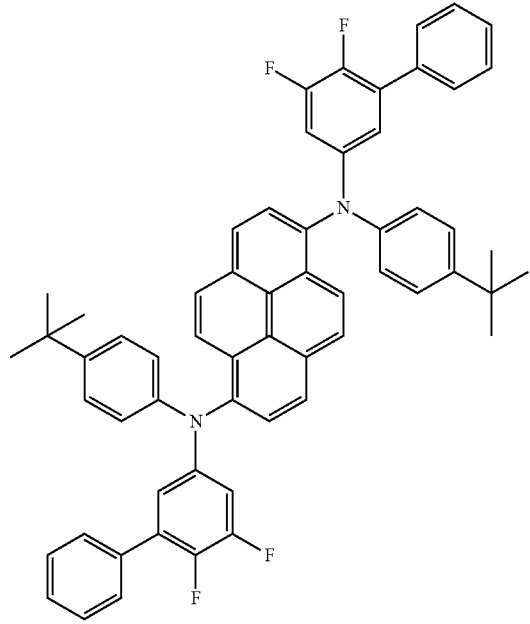
A-336
Synthesis
A synthesis example of the blue fluorescent compound marked by A-33 in the above Formula 4 is explained. The A-33 blue fluorescent compound is $N^1,N^6$-bis(4-phenyl-2,5-difluorophenyl)-$N^1,N^6$-di(4-trimethylsilylphenyl)pyrene-1,6-diamine.

1. Synthesis of 4-phenyl-2,5-difluoroaniline 4-phenyl-2,5-difluoroaniline is synthesized by following Reaction Formula 1.

[Reaction Formula 1]

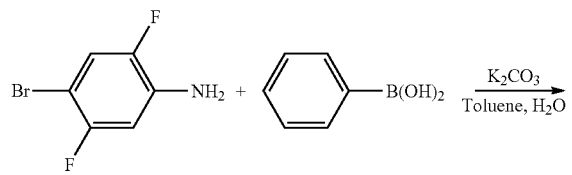

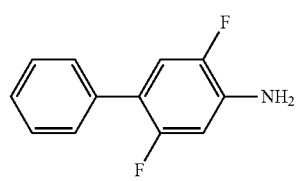

4-bromo-2,5-difluoroaniline (10 mmol), benzeneboronic acid (12 mmol), tetrakis(triphenylphosphine)palladium(0) (1 mmol) and potassium carbonate (12 g) are put in a two-neck round-bottom flask and dissolved in toluene (30 mL), H₂O (10 mL) and ethanol (5 mL). Subsequently, the resulting solution is stirred in a bath under a temperature of about 100° C. for 24 hours. After completion of the reaction, toluene is removed. The reaction mixture is extracted with dichloromethane and water, and then being distilled under reduced pressure. The resulting residence is filtered by silica gel column and distilled under reduced pressure again. Next, by re-crystallizing and filtering with dichloromethane and petroleum ether, 4-phenyl-2,5-difluoroaniline (2.2 g) is yielded.

2. Synthesis of 4-phenyl-2,5-difluoro-N-(4-trimethylsilylphenyl)benzenamine 4-phenyl-2,5-difluoro-N-(4-trimethylsilylphenyl)benzenamine is synthesized by following Reaction Formula 2.

[Reaction Formula 2]

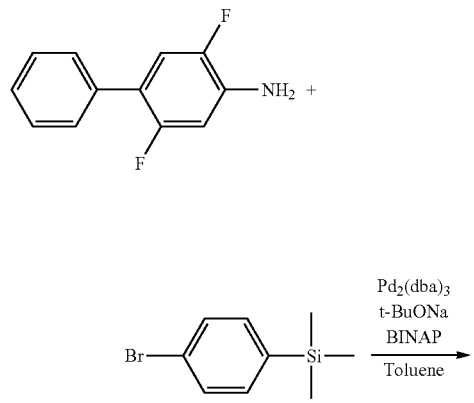

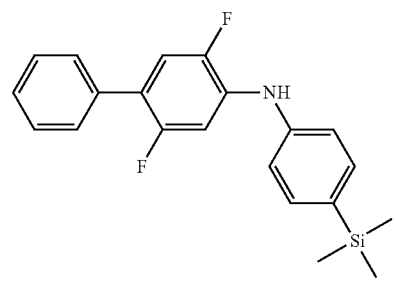

4-phenyl-2,5-difluoroaniline (12 mmol), 4-bromo-trimethylsilylbenzene (10 mmol), tris(dibenzylideneacetone)dipalladium(0) (0.15 mmol), (±)-2,2'-bis(diphenylphosphine)-1,1'-binaphthalene (0.3 mmol) and sodium tert-butoxie (14 mmol) are put in a two-neck round-bottom flask and dissolved in toluene (30 mL). Subsequently, the resulting solution is stirred in a bath under a temperature of about 100° C. for 24 hours. After completion of the reaction, toluene is removed. The reaction mixture is extracted with dichloromethane and water, and then being distilled under reduced pressure. The resulting residence is filtered by silica gel column and distilled under reduced pressure again. Next, by re-crystallizing and filtering with dichloromethane and petroleum ether, 4-phenyl-2,5-difluoro-N-(4-trimethylsilylphenyl)benzenamine (2.6 g) is yielded.

3. Synthesis of $N^1,N^6$-bis(4-phenyl-2,5-difluorophenyl)-$N^1,N^6$-di(4-trimethylsilylphenyl)pyrene-1,6-diamine $N^1,N^6$-bis(4-phenyl-2,5-difluorophenyl)-$N^1,N^6$-di(4-trimethylsilylphenyl)pyrene-1,6-diamine is synthesized by following Reaction Formula 3.

[Reaction Formula 3]

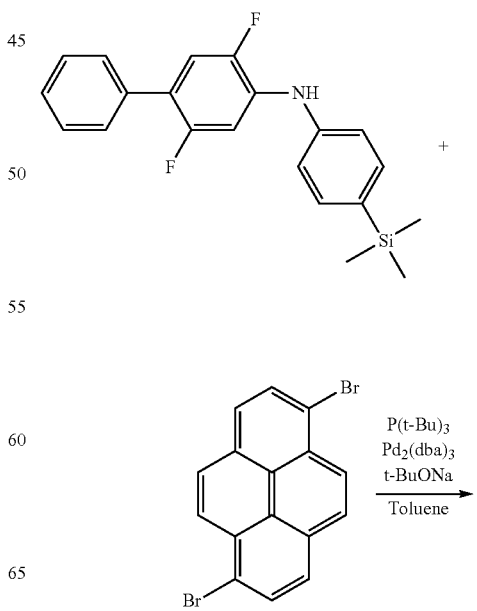

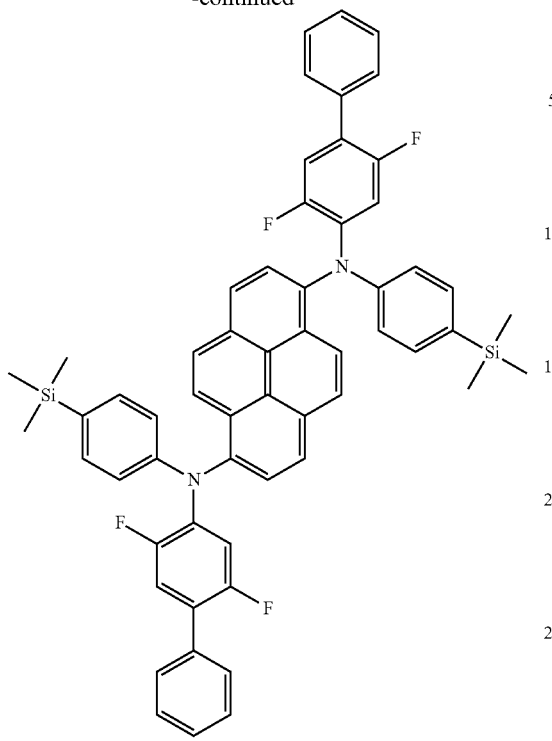

4-phenyl-2,5-difluoro-N-(4-trimethylsilylphenyl)benzenamine (6 mmol), 1,6-dibromopyrene (5 mmol), tris(dibenzylideneacetone)dipalladium(0) (0.075 mmol), tri-tert-butylphosphine (0.15 mmol) and sodium tert-butoxie (7 mmol) are are put in a two-neck round-bottom flask and dissolved in toluene (15 mL). Subsequently, the resulting solution is stirred in a bath under a temperature of about 100° C. for 24 hours. After completion of the reaction, toluene is removed. The reaction mixture is extracted with dichloromethane and water, and then being distilled under reduced pressure. The resulting residence is filtered by silica gel column and distilled under reduced pressure again. Next, after re-crystallizing and filtering with dichloromethane and acetone, and then being thermally refined to yield $N^1,N^6$-bis(4-phenyl-2,5-difluorophenyl)-$N^1,N^6$-di(4-trimethylsilylphenyl)pyrene-1,6-diamine is yielded.

Hereinafter, a detailed description will be made of preferred examples associated with the OELD according to the present invention. More specifically, the examples relate to an OELD including an emission material layer which uses the blue fluorescent compound of Formula 2 as a dopant.

EXAMPLES

Example 1

An indium-tin-oxide (ITO) layer is patterned on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), 4,4'-bis[N-(1-naphtyl)-N-phenylamino]-biphenyl (NPD) (about 400 angstroms), an emitting layer (about 200 angstroms) including DPVBi as a host and a compound represented by A-33 in the above Formula 4 as a dopant (about 4 weight %), Alq3 (about 350 angstroms), fluorolithium (LiF) (about 5 angstroms) and aluminum (Al) (about 1000 angstroms) are sequentially formed on the ITO layer such that an OELD is fabricated.

The OELD produces a brightness of 6427 cd/m² at an electric current of 10 mA and a voltage of 3.34 V. At this time, the X index and Y index of CIE color coordinates are 0.141 and 0.096, respectively.

Example 2

An indium-tin-oxide (ITO) layer is patterned on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), an emitting layer (about 200 angstroms) including DPVBi as a host and a compound represented by A-44 in the above Formula 4 as a dopant (about 5 weight %), Alq3 (about 350 angstroms), LiF (about 5 angstroms) and Al (about 1000 angstroms) are sequentially formed on the ITO layer such that an OELD is fabricated.

The OELD produces a brightness of 458 cd/m² at an electric current of 10 mA and a voltage of 3.49 V. At this time, the X index and Y index of CIE color coordinates are 0.143 and 0.095, respectively.

Example 3

An indium-tin-oxide (ITO) layer is patterned on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), an emitting layer (about 200 angstroms) including DPVBi as a host and a compound represented by A-47 in the above Formula 4 as a dopant (about 5 weight %), Alq3 (about 350 angstroms), LiF (about 5 angstroms) and Al (about 1000 angstroms) are sequentially formed on the ITO layer such that an OELD is fabricated.

The OELD produces a brightness of 492 cd/m² at an electric current of 10 mA and a voltage of 3.3 V. At this time, the X index and Y index of CIE color coordinates are 0.143 and 0.092, respectively.

Example 4

An indium-tin-oxide (ITO) layer is patterned on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), an emitting layer (about 200 angstroms) including DPVBi as a host and a compound represented by A-65 in the above Formula 4 as a dopant (about 5 weight %), Alq3 (about 350 angstroms), LiF (about 5 angstroms) and Al (about 1000 angstroms) are sequentially formed on the ITO layer such that an OELD is fabricated.

The OELD produces a brightness of 269 cd/m² at an electric current of 10 mA and a voltage of 3.55 V. At this time, the X index and Y index of CIE color coordinates are 0.150 and 0.087, respectively.

Comparative Example 1

An ITO layer is patterned on a substrate and washed such that an emission area of the ITO layer is 3 mm*3 mm. The substrate is loaded in a vacuum chamber, and the process pressure is adjusted to $1*10^{-6}$ torr. CuPC (about 200 angstroms), NPD (about 400 angstroms), an emitting layer (about 200 angstroms) including DPVBi as a host and BD-a represented by the above Formula 1-3 as a dopant (about 1 weight %), Alq3 (about 350 angstroms), LiF (about 5 angstroms) and Al (about 1000 angstroms) are sequentially formed on the ITO layer such that an OELD is fabricated.

The OELD produces a brightness of 526 cd/m² at an electric current of 10 mA and a voltage of 6.7 V. At this time, the X index and Y index of CIE color coordinates are 0.136 and 0.188, respectively.

Herein, CuPC and DPVBi are respectively represented by the above Formulas 1-1 and 1-2. NPD and Alq3 are represented by following Formulas 5-1 and 5-2, respectively.

[Formula 5-1]

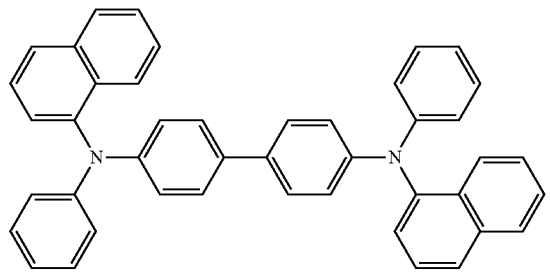

[Formula 5-2]

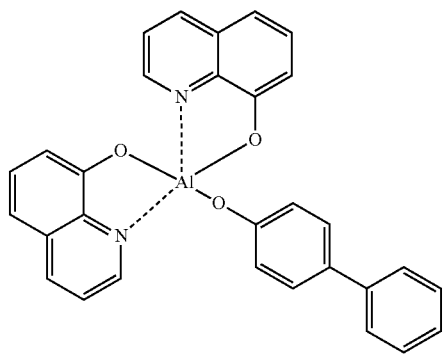

The OELD fabricated in Examples 1 to 45 and Comparative Example 1 is evaluated for efficiency, brightness, and so on. A voltage has a dimension of [V], an electric current has a dimension of [mA], and a brightness has a dimension of [cd/m²]. The evaluated results are shown in Table 1.

TABLE 1

|  | voltage | Electric current | Brightness | CIE(X) | CIE(Y) |
|---|---|---|---|---|---|
| Ex.1 | 3.34 | 10 | 427 | 0.141 | 0.096 |
| Ex.2 | 3.49 | 10 | 458 | 0.143 | 0.095 |
| Ex.3 | 3.3 | 10 | 492 | 0.143 | 0.092 |
| Ex.4 | 3.55 | 10 | 269 | 0.150 | 0.087 |
| Com. Ex.1 | 6.7 | 10 | 526 | 0.136 | 0.188 |

As shown in Table 1, the OELD in Examples 1 to 4 has high color purity and low driving voltage such that power consumption for the OELD is reduced. Compared with the OELD in Comparative Example 1, the OELD in Examples 1 to 4 can be driven by low voltage, i.e., about 3V, and has CIE(Y) value, which is smaller than that of Comparative Example 1 as much as about 0.9. Namely, the OELD device including the blue fluorescent compound according to the present invention has advantages in power consumption and color purity.

Figure 2:
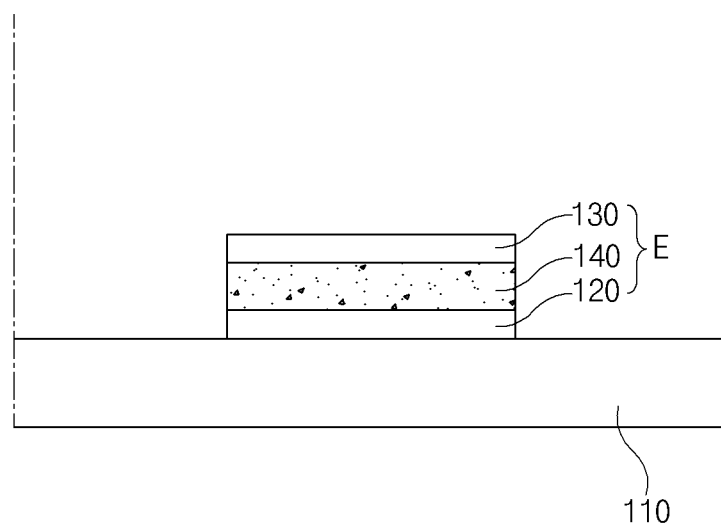
FIG. 2 is a schematic cross-sectional view of an OELD according to the present invention.

FIG. 2 is a schematic cross-sectional view of an OELD according to the present invention. In FIG. 2, an OELD includes a first substrate 110, a second substrate (not shown) facing the first substrate 1101, and an organic electroluminescent diode E on the first substrate 110. Namely, the organic electroluminescent diode E is positioned between the first substrate 110 and the second substrate.

The organic electroluminescent diode E includes a first electrode 120 as an anode, a second electrode 130 as a cathode, and an organic emitting layer 140 between the first and second electrodes 120 and 130. The first electrode 120 being closer to the first substrate 110 than the second electrode 130 is shown. Alternatively, the second electrode 130 may be closer to the first substrate 110 than the first electrode 120.

The first electrode 120 is formed of a material having a large work function. For example, the first electrode 120 may be formed of ITO. The second electrode 130 is formed of a material having a small work function. For example, the second electrode 130 may be formed of one of Al and Al alloy (AlNd).

The organic emitting layer 140 includes red, green and blue organic emitting patterns. In this case, the blue emission pattern of the EML includes a host material, which is capable of transporting an electron and a hole, and the blue fluorescent compound according to the present invention as a dopant. The blue fluorescent compound according to the present invention is represented by the above Formula 2. The blue fluorescent compound as a dopant is added with a range of about 0.1 weight % to about 20 weight % with respect to a total weight of a material in the blue emission pattern. For example, the host for the blue emitting pattern may be DPVBi represented by the above Formula 1-2.

Although not shown, to maximize luminescence efficiency, the organic emission layer 140 has a multiple-layered structure. For example, a hole injection layer (HIL), a hole transporting layer (HTL), an emitting material layer (EML), an electron transporting layer (ETL) and an electron injection layer (EIL) are stacked on the first electrode 120.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A blue fluorescent composition, comprising:
a host material being capable of transporting an electron or a hole; and
a dopant material represented by Formula 1:

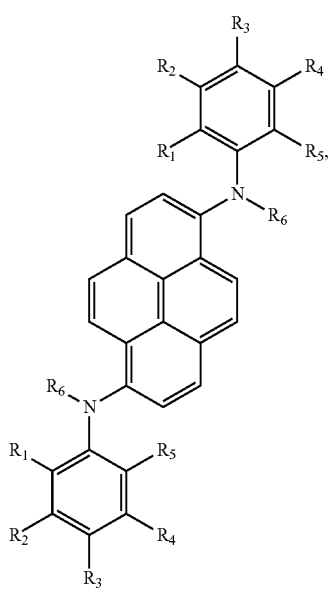

[Formula 1]

wherein one of the R1, the R2, the R3, the R4, and the R5 is selected from C6-C30 substituted or non-substituted aromatic group, two of the R1, the R2, the R3, the R4, and the R5 are hydrogen, and another two of the R1, the R2, the R3, the R4 and the R5 are fluorine, wherein the R6 is selected from C6-C30 substituted aromatic group, and the another two of the R1, the R2, the R3, the R4, and the R5, which are fluorine, are positioned at meta-positions or para-positions with respect to each other, and wherein a substituent of the R6 is selected from trimethylsilyl or cyano.

2. The composition according to claim 1, wherein the non-substituted aromatic group includes phenyl, biphenyl, naphthyl, phenanthrene, terphenyl or fluorenyl.

3. The composition according to claim 1, wherein a substituent for the substituted aromatic group for the one of the R1, the R2, the R3, the R4, and the R5, which is selected from C6-C30 substituted aromatic group, is selected from methyl, ethyl, n-propyl, i-propyl, n-butyl, i-butyl, t-butyl, deuterium, cyanyl, trimethylsilyl, fluorine, and trifluoromethyl.

4. The composition according to claim 1, wherein the dopant material has a weight % of about 0.1 to about 20 with respect to a total weight of the host material and the dopant material.

5. An organic electroluminescent device, comprising:
a first electrode;
a second electrode facing the first electrode; and
an organic electroluminescent diode positioned between the first and second electrodes and includes an emitting material layer, the emitting material layer includes:
a host material being capable of transporting an electron or a hole; and
a dopant material represented by Formula 1:

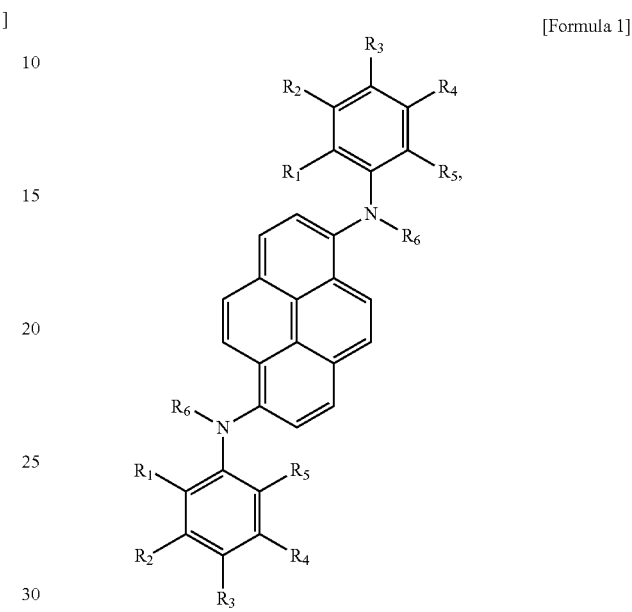

[Formula 1]

wherein one of the R1, the R2, the R3, the R4, and the R5 is selected from C6-C30 substituted or non-substituted aromatic group, two of the R1, the R2, the R3, the R4, and the R5 are hydrogen, and another two of the R1, the R2, the R3, the R4 and the R5 are fluorine, wherein the R6 is selected from C6-C30 substituted aromatic group, and the another two of the R1, the R2, the R3, the R4, and the R5, which are fluorine, are positioned at meta-positions or para-positions with respect to each other, and wherein a substituent of the R6 is selected from trimethylsilyl or cyano.

6. The organic electroluminescent device according to claim 5, wherein the non-substituted aromatic group includes phenyl, biphenyl, naphthyl, phenanthrene, terphenyl or fluorenyl.

7. The organic electroluminescent device according to claim 5, wherein a substituent for the substituted aromatic group for the one of the R1, the R2, the R3, the R4, and the R5, which is selected from C6-C30 substituted aromatic group, is selected from methyl, ethyl, n-propyl, i-propyl, n-butyl, i-butyl, t-butyl, deuterium, cyanyl, trimethylsilyl, fluorine, and trifluoromethyl.

8. The organic electroluminescent device according to claim 5, wherein the dopant material has a weight % of about 0.1 to about 20 with respect to a total weight of the host material and the dopant material.

* * * * *